United States Patent
Craven et al.

(10) Patent No.: US 6,891,482 B2
(45) Date of Patent: May 10, 2005

(54) LOSSLESS CODING METHOD FOR WAVEFORM DATA

(75) Inventors: Peter G Craven, Tewkesbury (GB); Michael A. Gerzon, deceased, late of Oxford (GB); Peter Herbert Gerzon, legal representative, Oxford (GB)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 0 days.

(21) Appl. No.: 10/930,661

(22) Filed: Aug. 30, 2004

(65) Prior Publication Data

US 2005/0030207 A1 Feb. 10, 2005

Related U.S. Application Data

(60) Continuation of application No. 10/694,712, filed on Oct. 27, 2003, now Pat. No. 6,784,812, which is a division of application No. 08/952,743, filed as application No. PCT/GB96/01164 on May 15, 1996, now Pat. No. 6,664,913.

(30) Foreign Application Priority Data

May 15, 1995 (GB) .............................................. 9509831

(51) Int. Cl.⁷ ............................................... H03M 7/00
(52) U.S. Cl. .......................................... 341/50; 341/51
(58) Field of Search .............................. 341/50, 51, 52, 341/77

(56) References Cited

U.S. PATENT DOCUMENTS

| | | | |
|---|---|---|---|
| 3,569,952 A | 3/1971 | Schindler | 341/141 |
| 3,613,067 A | 10/1971 | Haberle | 341/157 |

(Continued)

FOREIGN PATENT DOCUMENTS

| | | |
|---|---|---|
| EP | 0345608 | 12/1989 |
| EP | 0504627 A2 | 9/1992 |
| EP | 0504927 A2 | 9/1992 |
| EP | 0596663 A2 | 5/1994 |

OTHER PUBLICATIONS

Jae Jeong Hwang et al., Transmission Noise Eliminations in BDPCM Image. IEEE Transactions on Consumer Electronics, vol. 39, No. 3, Aug., 1993, pp. 151–158.

Rich Bastian, Subjective Improvements in DPCM–AQ Performance Based on Adaptive Noise Shaping, IEEE; Transmission on Accoustics, Speech & Signal Processing, vol. ASSP–29, No. 5, Oct. 1981, pp. 1067–1071.

Wilson, R.; "Filter Topologies," J. Audio Eng. Soc. vol. 41, No. 9, Sep. 1993, pp. 667–678.

Primary Examiner—Peguy JeanPierre
(74) Attorney, Agent, or Firm—David N. Lathrop, Esq.; Gallagher & Lathrop

(57) ABSTRACT

In a method of lossless processing of an integer value signal in a prediction filter which includes a quantiser, a numerator of the prediction filter is implemented prior to the quantiser and a denominator of the prediction filter is implemented recursively around the quantiser to reduce the peak data rate of an output signal. In the lossless processor, at each sample instant, an input to the quantiser is jointly responsive to a first sample value of a signal input to the prediction filter, a second sample value of a signal input to the prediction filter at a previous sample instant, and an output value of the quantiser at a previous sample incident. In a preferred embodiment, the prediction filter includes noise shaping for affecting the output of the quantiser.

23 Claims, 53 Drawing Sheets

U.S. PATENT DOCUMENTS

| | | |
|---|---|---|
| 3,676,600 A | 7/1972 | Kaneko et al. ............. 375/241 |
| 3,745,562 A | 7/1973 | Rosenbaum ................ 341/143 |
| 3,754,238 A | 8/1973 | Oswald ...................... 341/143 |
| 3,795,900 A | 3/1974 | Monford, Jr. ............... 375/280 |
| 3,909,721 A | 9/1975 | Bussgang et al. ............ 341/75 |
| 3,937,897 A | 2/1976 | Song .......................... 341/81 |
| 4,361,893 A * | 11/1982 | Bonnerot .................... 375/245 |
| 4,379,286 A | 4/1983 | Yokota et al. .............. 375/245 |
| 4,520,491 A | 5/1985 | Raulin et al. ............... 341/144 |
| 4,546,342 A | 10/1985 | Weaver et al. ................ 341/51 |
| 4,614,934 A | 9/1986 | Kobayashi et al. .... 375/240.16 |
| 4,797,653 A * | 1/1989 | Takayama .................... 341/51 |
| 4,821,119 A | 4/1989 | Gharavi et al. ............. 375/245 |
| 4,853,780 A * | 8/1989 | Kojima et al. ......... 375/240.14 |
| 5,070,515 A | 12/1991 | Iwahashi et al. ............ 370/366 |
| 5,818,834 A | 10/1998 | Skierszkan et al. ......... 370/366 |
| 6,480,550 B1 | 11/2002 | Zimmermann ............. 375/247 |

\* cited by examiner

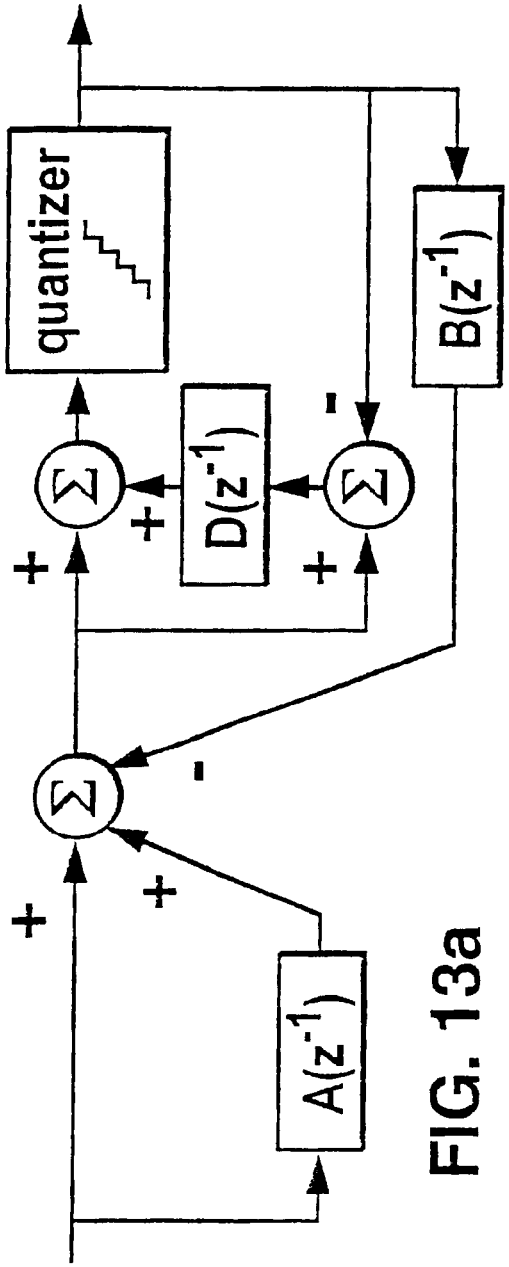
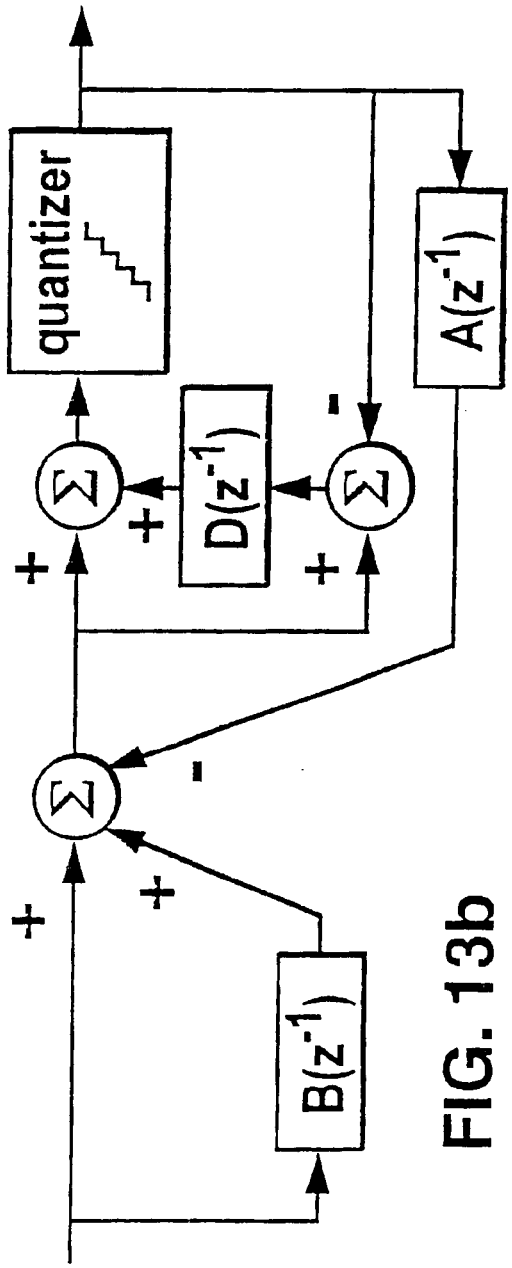
FIG. 13a
FIG. 13b

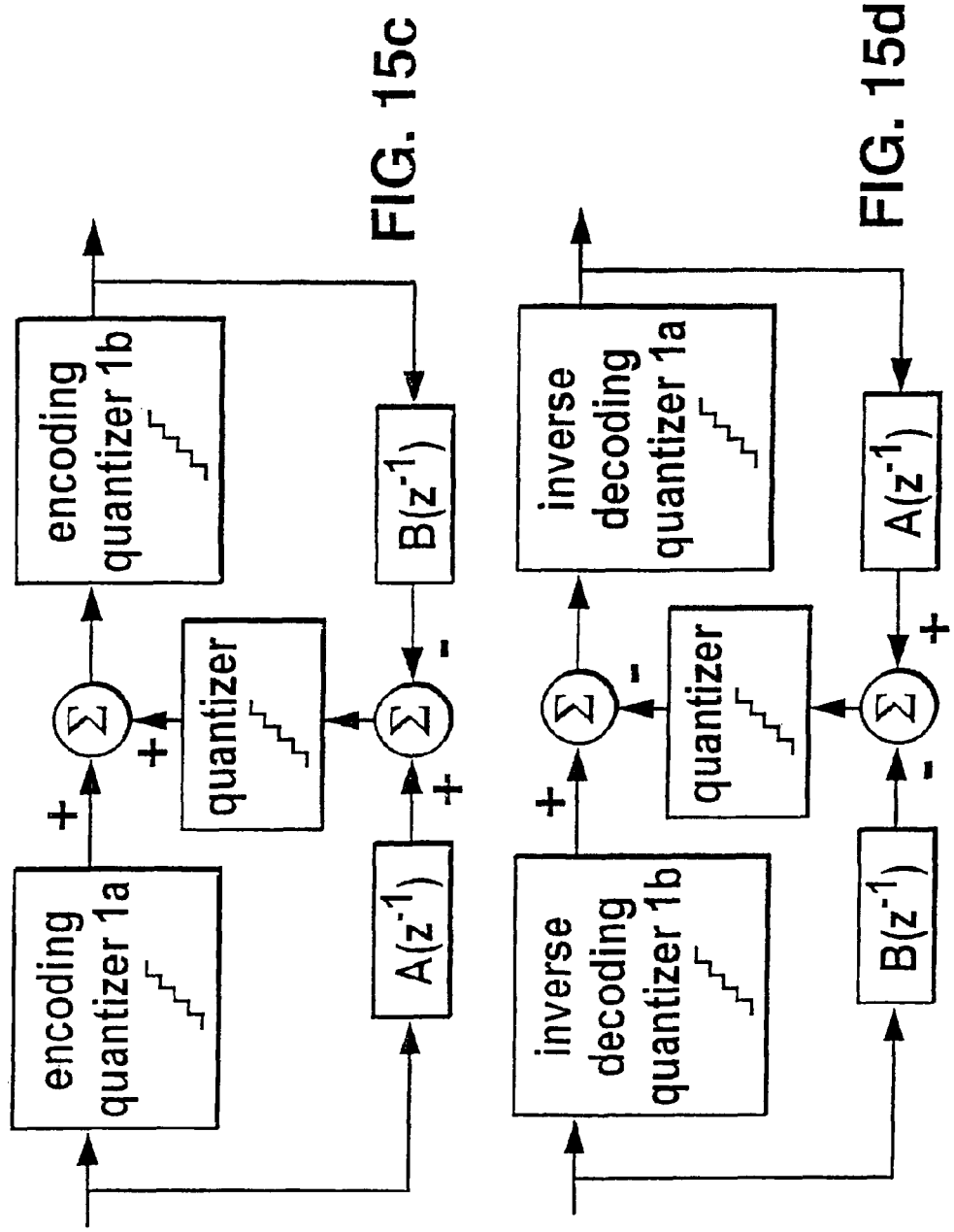

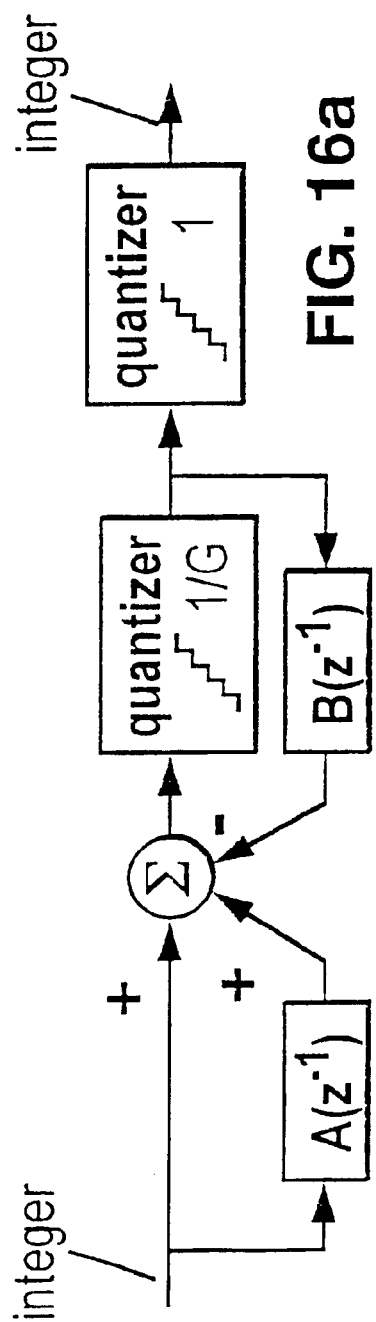
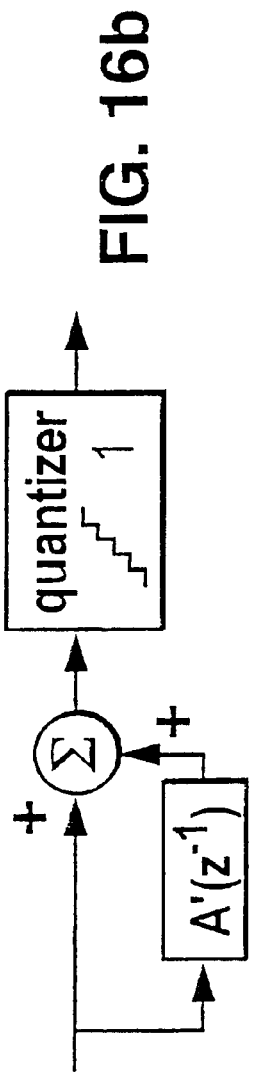
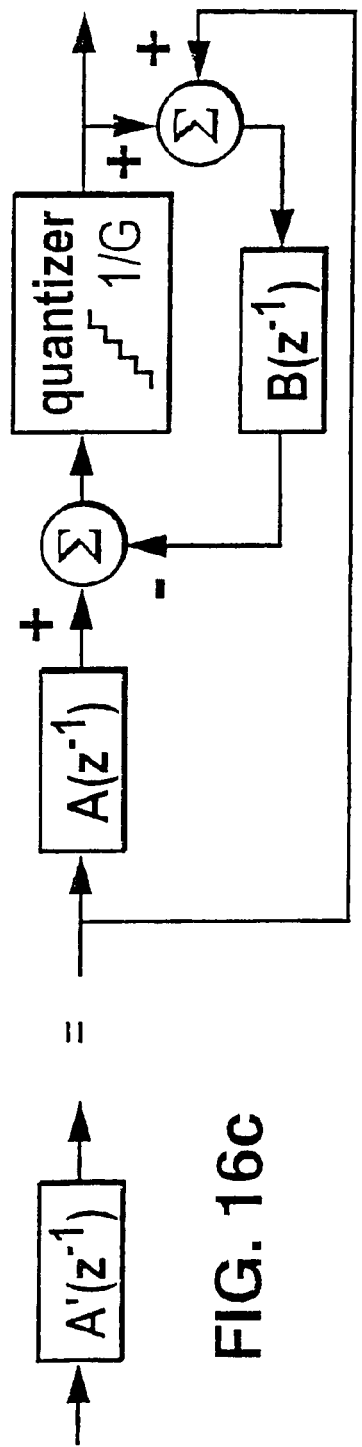
FIG. 16a
FIG. 16b
FIG. 16c

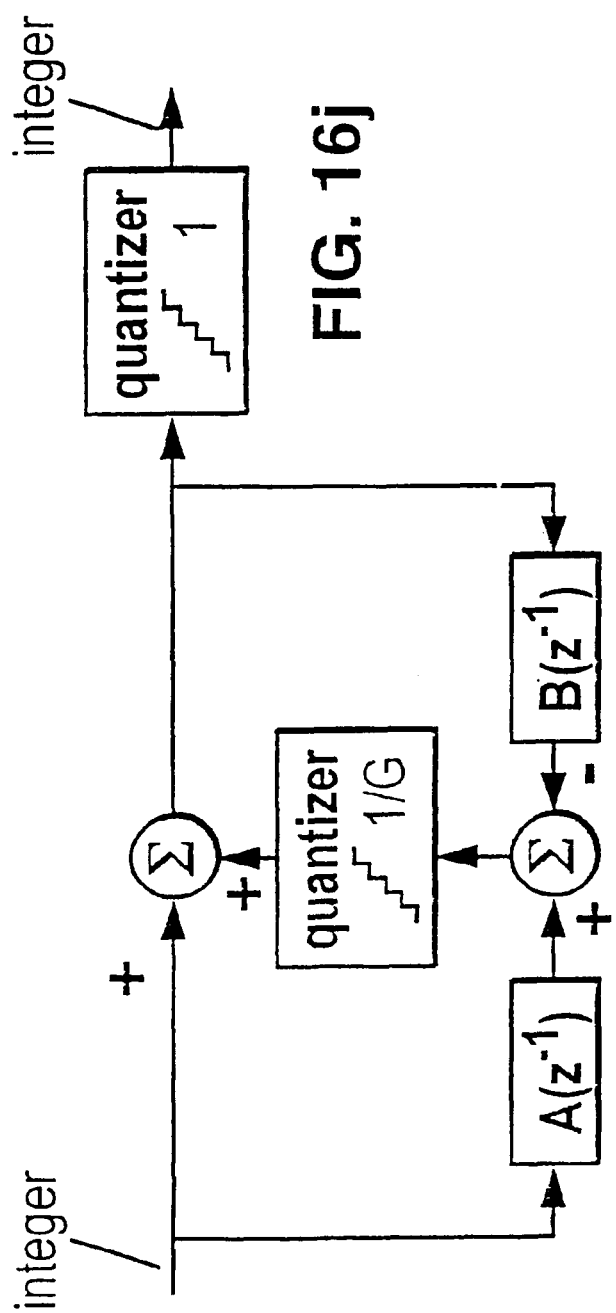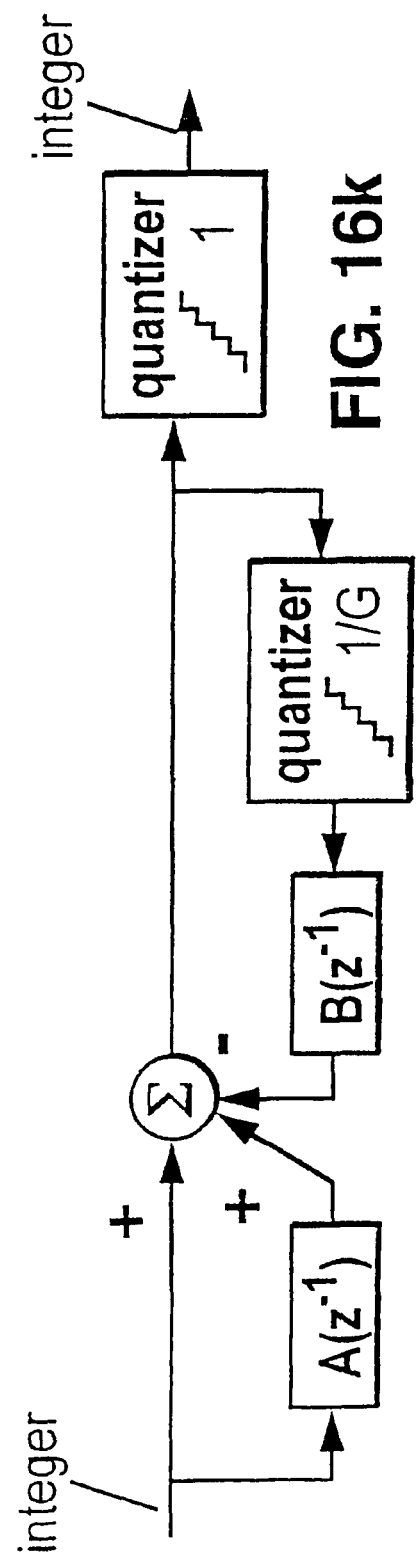

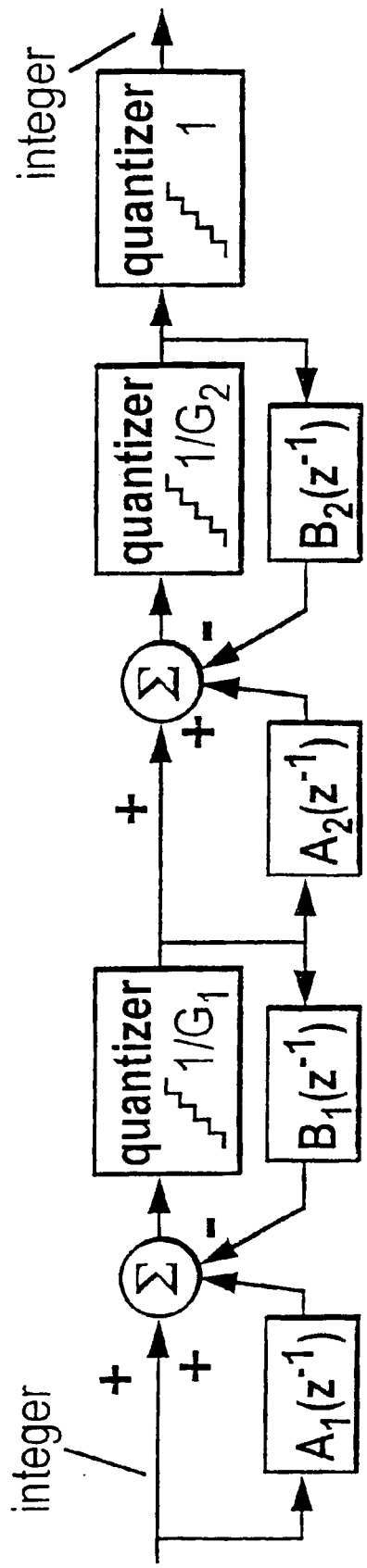
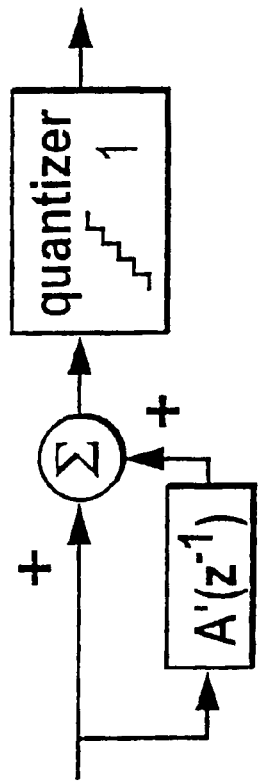
FIG. 17a
FIG. 17b

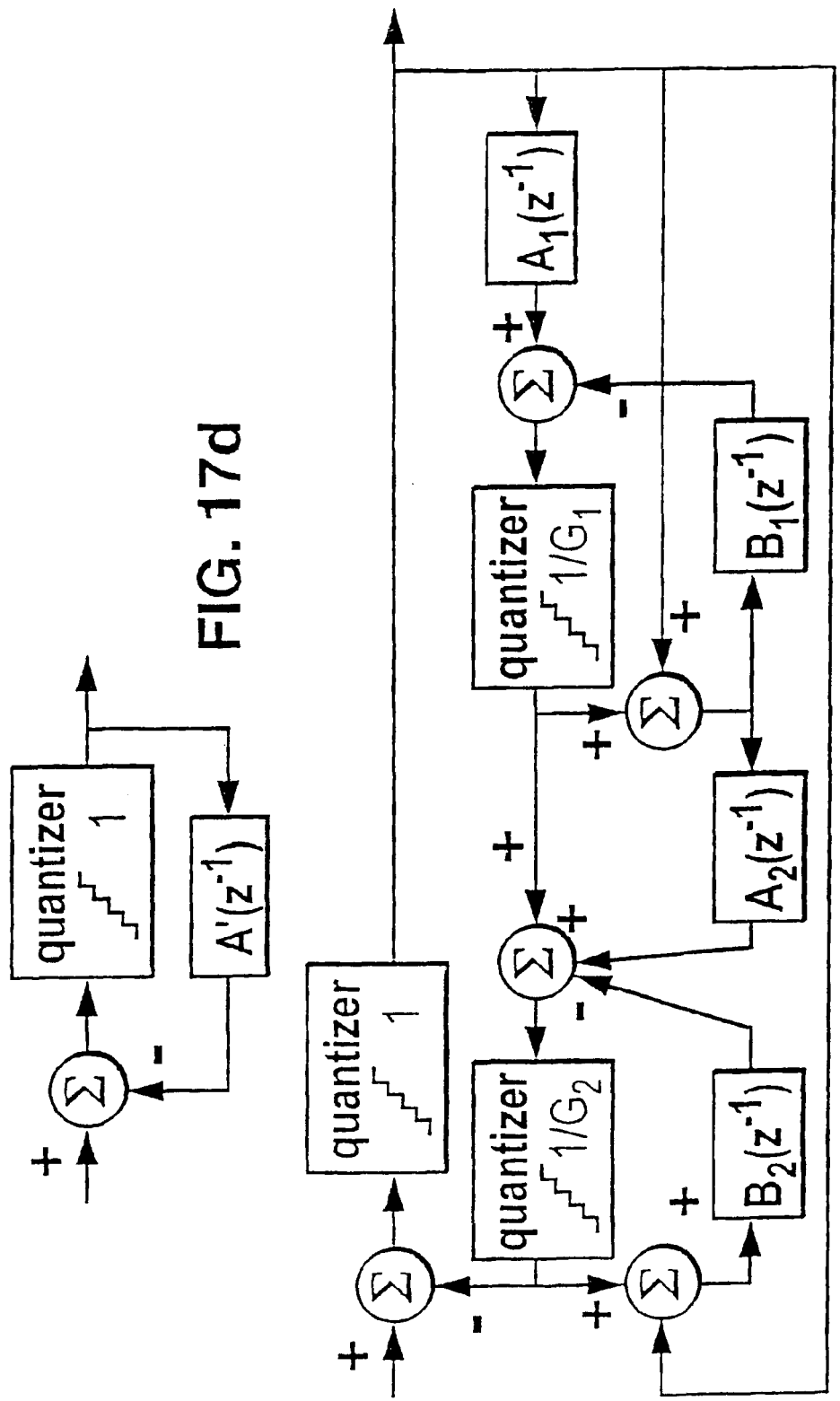

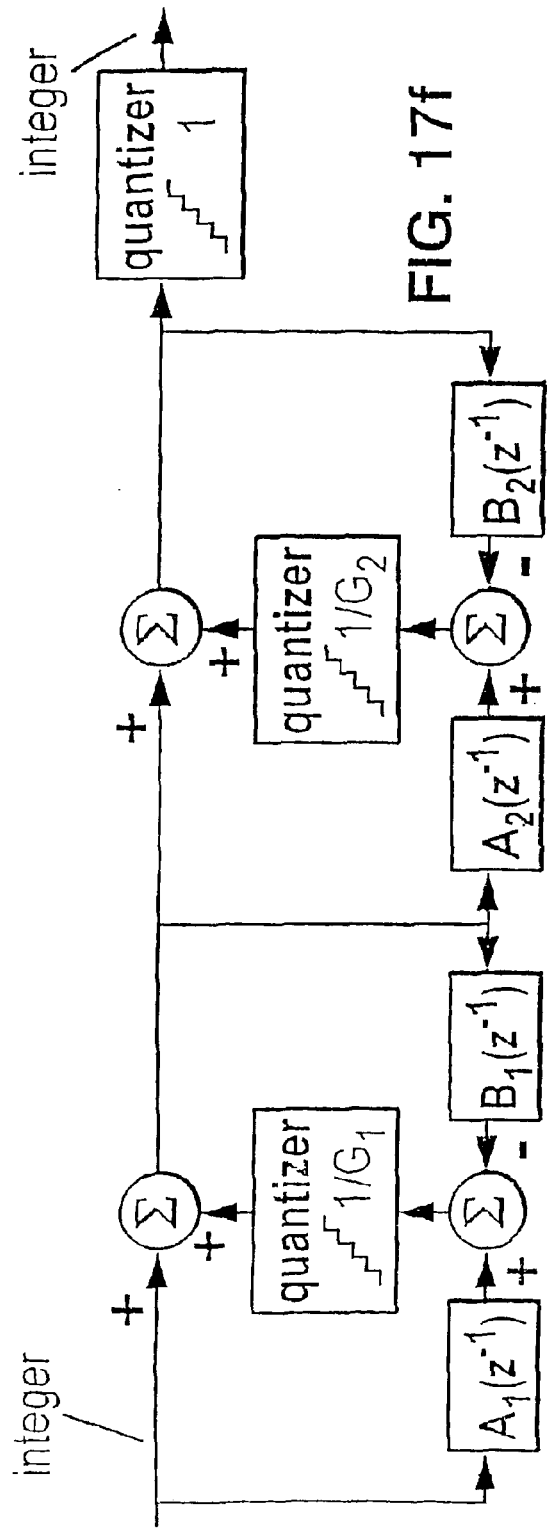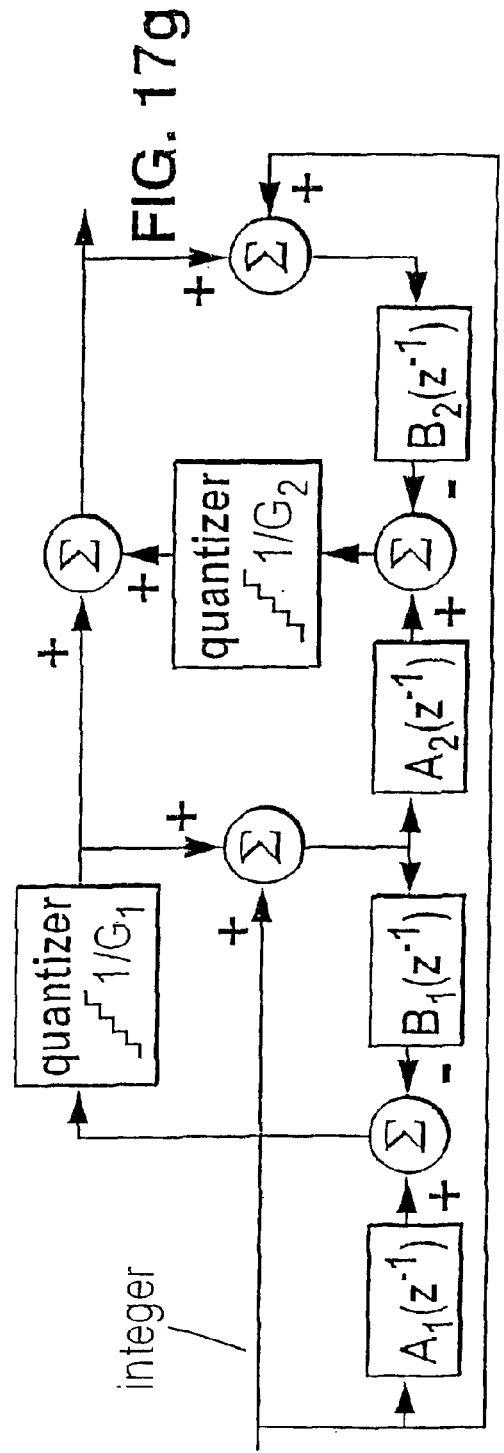
FIG. 17f
FIG. 17g

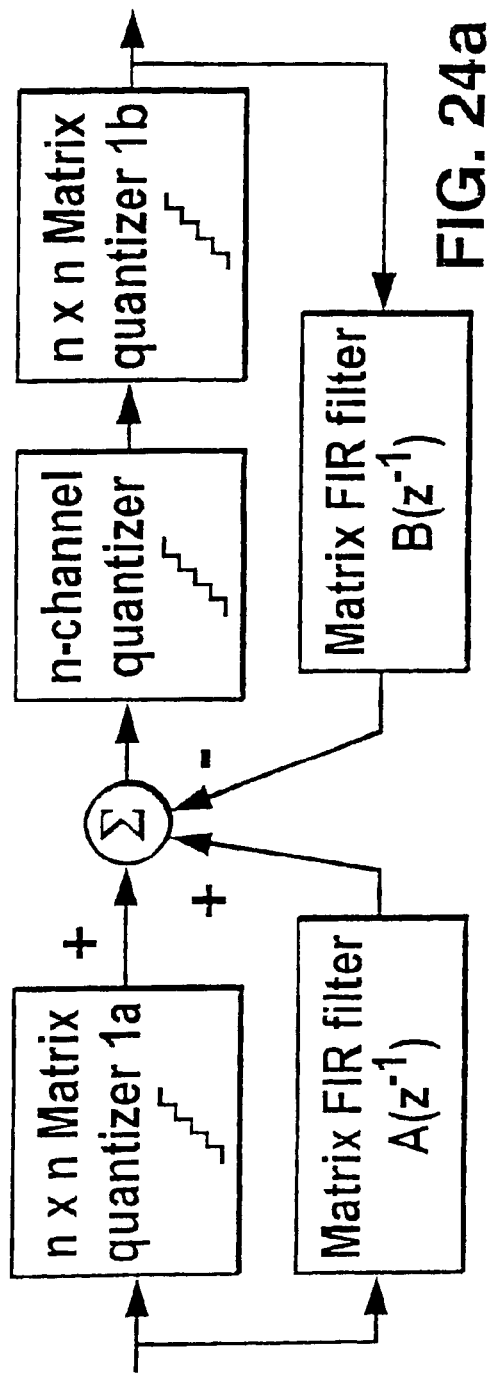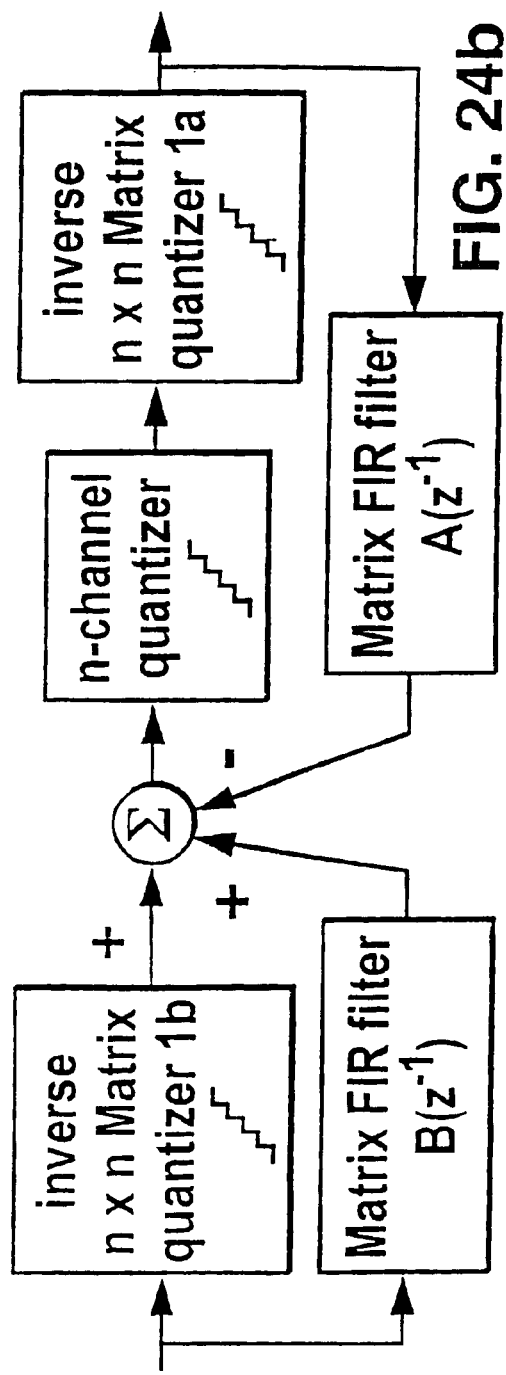
FIG. 24a
FIG. 24b

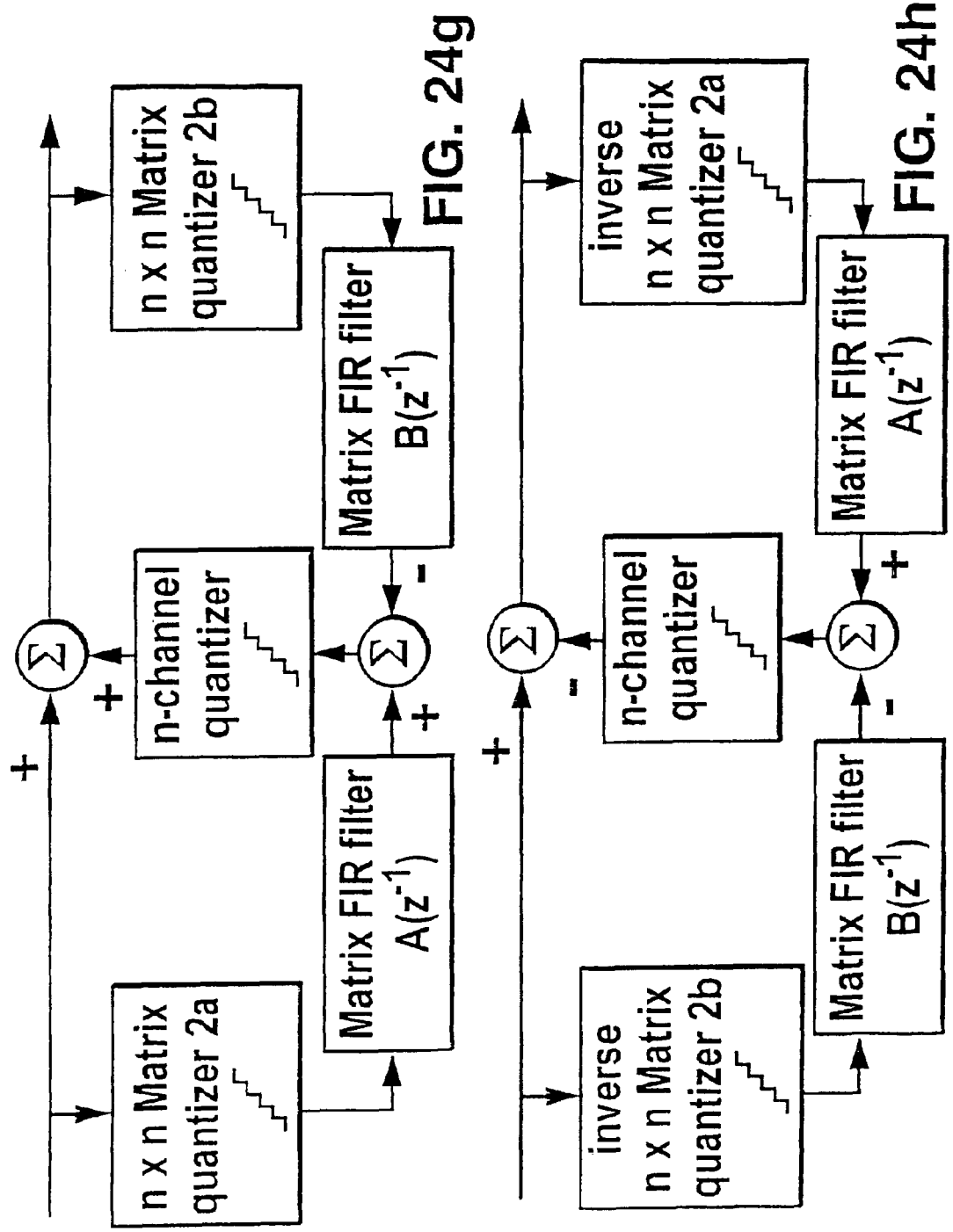

LOSSLESS CODING METHOD FOR WAVEFORM DATA

This application is a continuation of application Ser. No. 10/694,712 filed Oct. 27, 2003, now U.S. Pat. No. 6,784,812.

TECHNICAL FIELD

This invention relates to the lossless coding and decoding of waveform data so as to reduce the required data rate without any alteration of the decoded waveform data, particularly the use of lossless prediction and matrixing methods with particular regard to those using finite precision non-integer arithmetic unaffected by rounding errors and to applications in audio and image waveform coding and decoding.

BACKGROUND ART

The data rate occupied by audio or other waveform data in digital-PCM (pulse code modulation) form is often too high for the transmission or storage medium used to convey waveforms. Methods of reducing waveform data rate are known in the prior art and may be classified into two types, lossy and lossless coding. Lossy coding discards or alters the waveform data in a way which is small in relation to the requirement of how the data is used, whereas lossless coding reduces the data rate by eliminating signal redundancies in coded form, but in a way that allows the exact original data to be recovered by a decoding process.

Such lossless coding methods based on the use of predictors are known in the prior art and are described for example in C. Cellier, P. Chenes & M. Rossi, "Lossless Audio Bit Rate Reduction", Audio Engineering Society UK "Managing The Bit Budget" Conference proceedings, 16–17 May 1994, pp.107–122, in R. C. Gonzales & R. E. Woods, "Digital Image Processing", Addison Wesley, Reading Mass., 1992 Chapter 6, esp. section 6.4.3 pp.358–362 and in M. Rabbani & P. W. Jones, "Digital Image compression Techniques", SPIE Press, Bellingham, Wash. 1991.

PCM signals may be considered as integer valued time series signals, where the integer is a multiple of the value of the least significant digit. The basic concept in prior art systems is to encode the integer PCM signal via a prediction filter where the quantizer comprises a rounding operation to the nearest integer, transmitting the quantized difference (termed here the prediction-encoded signal) between the actual signal and predicted signal derived from the output of the quantizer, and then to transmit this encoded data efficiently by means of Huffman coding or by transmitting the number of zero MSBs (most significant bits) once only for a block of words or similar techniques of reducing the wordlengths of the individual samples of the encoded waveform. In such prior art systems, lossless decoding is done by using Huffman or other appropriate decoding to restore the wordlength of the encoded signal, and then to pass the encoded data into an identical predictor filter to that used in encoding, to add the result to the encoded signal, and then to restore the original integer valued signal by means of a second rounding quantization operation. The rounding operations may be omitted if the prediction filters have only integer coefficients.

However, in many applications, prior art methods of lossless encoding and decoding of waveform data have considerable practical problems. This is particularly the case with high quality PCM audio data, especially when transmitted through media with limitations on the peak data rate at which data can be transferred, such as compact disc players or digital tape recorders.

By high quality audio we mean signals which in PCM form will typically require 16 or more bits, perhaps as many as 20 or 24 bits, for accurate representation of the digital words, and sampling rates of 44.1 kHz or higher. Lossless compression of audio data is especially useful when in addition the sampling rate is a high figure such as kHz. Such high sampling rates are coming into use for the case where an extended audio bandwidth is required for premium quality of reproduction. When it is desired in addition to convey multichannel stereo or surround sound, one may need to convey to the user perhaps 5 or 6 channels of audio at a 96 kHz sampling rate with around 20 bit resolution, and the resulting data rates of around 11.5 Mbit/second are difficult to convey with adequate playing time via existing storage media such as high-density compact disc or optical storage media.

In any case, lossless coding and decoding of such high quality audio data allows the effective capacity of storage media such-as hard disc in computer-based audio processing systems to be increased, as well as increasing the effective storage capacity of storage media such as compact disc, digital tape media and the like. In such applications, it is desirable that especially the decoding algorithms should be relatively simple to implement, because the number of players may well outnumber the number of recorders by a large factor, especially for compact disc type releases of audio music programme material. There is also a requirement that the encoding and decoding algorithms be transportable to many different digital signal processing platforms without too much difficulty of engineering implementation, since encoded recordings produced by any one of many record companies or other organisations would be expected to playback on players of many different users made by many different manufacturers.

In the prior art, the simplest and in audio most widely used form of lossless waveform coding used is an integer prediction technique. This comprises transmitting not the PCM audio signal itself, but the difference between successive samples plus an initial sample, from which the original signal can be reconstructed by recovering each sample by adding the difference sample to the previously recovered sample. For typical audio signals, the difference signal will have lower energy than the original signal. A known and widely used prior-art extension of this integer prediction technique may instead transmit second or third differences of the signal along with two or three initial samples of the PCM signal. Using the symbol $z^{-1}$ to indicate a delay by one sample, this method transmits the result of passing the signal through an encoding filter of the form $(1-z^{-1})^n$ for n=0, 1, 2 or 3. The original signal can be recovered from the data by an inverse summation process. The value of n may be chosen adaptively, block by block of audio waveform samples, so as to minimise the energy of the transmitted signal at each moment, since low-energy waveform data can be transmitted at a lower data rate than higher-energy waveform data.

Integer-coefficient predictors are found to reduce the average data rate and content of most audio signals, but can actually increase the peak data rate required for transmission. This makes such predictors unsuitable for coping with media having peak data read or write rate limitations. Also, the optimal prediction filter for minimising data rate is well known, see J. I. Makhoul, "Linear Prediction: A Tutorial Review", Proc. IEEE, vol. 63, pp. 561–580 (1975 April), to be one such that the frequency response of the difference between actual and predicted signal is approximately inverse to the spectrum of the waveform signal to be encoded, and for many signals, integer-coefficient prediction filters only very poorly approximate this requirement. Thus integer filters give a suboptimum average data rate as well. For encoding audio signals, these inefficiencies of integer predictors particularly affect such signals as speech sibilants, popular music with high treble energy, cymbal waveforms and suchlike.

Predictors involving non-integer coefficients can encode waveforms with much better reductions of both peak and average data rates, but unfortunately, these have the problem that an ideal implementation requires the use of infinite-precision arithmetic, which is not possible. In practice, one uses prediction filters incorporating rounding errors in their arithmetic, and in such a case, it is essential for lossless coding that the rounding errors in the predictors be absolutely identical in the encoder and the decoder. This requirement of identical rounding errors makes it very difficult to transport a decoding or encoding algorithm between different signal processing hardware, where slight differences in rounding errors are encountered. In applications where a wide variety of equipment designs may be used to encode or decode signals, it is practically necessary to use algorithms that are transportable between different DSP (Digital signal processing) platforms which may not have identical rounding errors. Also, the need to control arithmetic rounding errors in predictors to be absolutely identical makes it very difficult to design alternative prediction filter architectures for particular applications when it is known that different encoders and decoders must work with each other.

In addition, existing non-integer lossless prediction algorithms add a quantization noise to the encoded signal that has a spectrum that is inverse to the frequency response of the difference between actual and predicted signal. For low-level waveform signals, the amplitude of this added quantization noise can dominate in the encoded signal, increasing its average amplitude and hence the encoded data rate unnecessarily.

Existing lossless prediction methods in addition only encode and decode single channels of waveform data separately from each other. In many applications, including stereo and multichannel audio, one wishes to encode two or more related waveform signals which quite often have a high degree of correlation. One wishes to have lossless coding which can take advantage of the redundancy due to such correlations to reduce the data rate further.

DISCLOSURE OF INVENTION

This invention describes modified methods of prediction and matrixing based on non-integer finite precision prediction filter coefficients, and on the additional optional use of integer-coefficient or finite-precision non-integer-coefficient noise shaping filtering around the integer rounding operation quantizer.

According to the invention in a first aspect, an encoding filter predictor arrangement for integer-valued waveform signal data comprises an integer-valued input waveform signal, a summing node followed by a rounding-operation quantizer giving as output a prediction-encoded signal, said summing node being fed from the input waveform signal by a direct path from the input signal and by a filter A having a delay of at least one sample, and fed also recursively from the output of said quantizer via a second filter B having a delay of at least one sample. The inverse decoder comprises an identical arrangement save that the input signal is now the prediction encoded signal, the output of the quantizer rounding operation is the recovered original input integer-valued signal to the encoder, and the filters A and B are interchanged, and that the quantizer in the decoder has performance equivalent to the encoder quantizer both preceded and followed by a polarity inversion.

In preferred implementations of the invention in its first aspect, the filters A and B are FIR (finite impulse response) filters.

In further preferred implementations of the invention in its first aspect, said FIR filters A and B and have finite precision non-integer coefficients.

It is further preferred that said filters are implemented either without rounding error or only with rounding errors that do not affect the value of the output of said quantizer.

By finite precision non-integer coefficients, we mean that all coefficients can be impressed as rational numbers with an integer common denominator d such that the filter arithmetic can be performed without ambiguous rounding errors.

And by non-integer we mean that at least one such coefficient is not an integer.

In all aspects of this invention, moving summing nodes handling signals divisible by G quantized to a step size G from before to after an quantizer with step size G or vice-versa does not change the nature of the invention, but is merely an obvious variant of implementation. Thus in the invention in its first aspect, any summation before the quantizer involving an integer signal input, such as the direct path from the input to the summing node, may instead be added at a summing node after the quantizer but before the output. In addition, identical noise shaping may be employed around the encoding and decoding quantizers. It is preferred that either the noise shapers have finite precision arithmetic FIR filtering using the outer-form noise shaping architecture whereby the difference between the input and the output of the noise-shaped quantizer system is fed via a FIR (finite impulse response) filter D with finite precision non-integer coefficients and having a delay of at least one sample to the input of the quantizer, or that the noise shaping filters have integer arithmetic filtering.

A survey of noise shaping methods and architectures may be found in section I of: M. A. Gerzon, P. G. Craven, J. R. Stuart & R. J. Wilson, "Psychoacoustic Noise Shaped Improvements in CD and Other Linear Digital Media", Preprint 3501 of the 94th Audio Engineering Society convention, Berlin, (1993 March 16–19). As well as describing many different forms of noise shaping topology having equivalent performance, this reference describes methods of rearranging filters with integer and non-integer coefficients around quantizers that may advantageously be applied to implementing the present invention.

Such encoding and decoding filter predictor arrangements, either with or without noise shaping, may be implemented using finite-precision fixed point arithmetic, and so may be implemented without any effect from rounding errors in the filtering operations. As a result, they are capable of being transported between different fixed point DSP implementations and platforms. The only rounding operation that needs to be implemented is the one in the quantizer rounding operation. Although as a matter of practical convenience, the finite precision coefficients will often be fractions having only a restricted number of fractional binary digits, it will be understood that by finite precision non-integer coefficients, we mean coefficients that have fractional parts defined as rational ratios of two integers, since finite precision can be defined in integer arithmetic to any base, not just to base 2.

In the invention according to the first aspect, the encoding filter predictor arrangement reducing average wordlength differs from the prior art in arranging that not all the prediction filtering is done recursively around the rounding quantizer, but ensuring that the numerator of the encoding filter is implemented prior to the quantizer, and only its denominator is implemented recursively around the quantizer. The prediction decoding arrangement restoring the increased original wordlength also differs from the prior art in arranging that not all the rounding quantization is done subsequent to the filtering, but is done in a recursive loop for the denominator of the decoding filter, and is preceded only by the numerator of the decoding filter.

Also differing from the prior art in lossless encoding and decoding is the use of noise shaping around the encoder and the decoder quantizer. The use of such noise shaping allows improved control of either the data rate of encoded signals during low-level waveform passages or the recovery properties in decoding from data errors in transmission.

In many practical implementations of the invention, the encoding filter predictor arrangement may be applied to blocks of waveform samples, the length L of such a block often being of order of magnitude 576 samples. When encoding such a block of samples, one typically will choose a predictor filter arrangement that approximately minimises the average or peak encoded signal energy within the block, and transmit the filter coefficients used for encoding as additional data. The decoder will load the same filter coefficients into the inverse decoding filter arrangement. In order that the decoding filter arrangement reconstruct the waveform accurately, it is usually necessary that the initial filter state variables at the start of the block be identical in the decoding and encoding filter, and it is also usually necessary to transmit such state variables to "initialise" the state variables in the decoding filter at the start of a block or at the start of a sequence of blocks at which the filter coefficients have been changed. In practice, suitable state variables for a filter with n'th order denominator and numerator are the first n input samples and the first n output samples of the encoding filter at the start of the block. These are used respectively as the first n output samples and the first n input samples of the decoding filter in the block.

Where noise shaping filters are used, the state variables of the noise shaping filter in decoding also usually must be correctly initialised, and transmitted for use by the decoder.

It is also clear that a succession of cascaded encoding filter predictor arrangements at least one of which is according to the invention may be used for lossless encoding, and that the inverse lossless decoding arrangement is a cascade in reverse order of inverse decoding filter predictor arrangements at least one of which is according to the invention.

The invention is applicable to PCM signals in their most general sense, i.e. signals represented by integer numbers representing the value of a waveform on a relatively large number of sampling instants or points. Although practical implementation will normally use binary digital representations of the numbers, representations to any other numerical base may be used. Any references to least or most significant bits may be generalised in such non-binary representations to least or most significant digits.

According to the invention in a second aspect, invertible transformation means for converting input integer-valued PCM waveform data to output integer-valued PCM waveform data are provided, comprising:

an input for said input integer-valued PCM waveform data, an output for said output integer-valued PCM waveform data, a summing node, a quantizer rounding operation rounding to near or nearest integer values, a first filter means A each term of which incorporates delay, and a second filter means B each term of which incorporates delay, wherein the input feeds said summing node directly, the input feeds said summing node via the filter A, the summing node feeds the quantizer, the quantizer feeds the output, and the output feeds the summing node via the filter B.

According to the invention in a third aspect, invertible transformation means for converting input integer-valued PCM waveform data to output integer-valued PCM waveform data are provided, comprising:

an input for said input integer-valued PCM waveform data, an output for said output integer-valued PCM waveform data, a summing node, a differencing node, a quantizer rounding operation rounding to near or nearest integer values, a first filter means A each term of which incorporates delay, a second filter means B each term of which incorporates delay, and a first and a second invertible integer waveform transformation arrangement having no input/output delay; wherein the input feeds said summing node via said first invertible integer waveform transformation arrangement, the input feeds said differencing node via the filter A, the output feeds said differencing node via the filter B, the differencing node feeds the quantizer, the quantizer feeds the summing node, and the summing node feeds said output via the second invertible integer waveform transformation arrangement.

By an invertible integer waveform transformation arrangement we mean any method of transforming one integer-valued signal to another such that there exists an inverse transformation arrangement taking integer-valued signals to integer-valued signal that restores the original integer-value signal from the transformed integer-valued signal. By saying it has no input/output delay, we mean that it has a causal implementation and the inverse has a causal implementation such that the two cascaded have no overall delay. The lossless encoding and decoding filter arrangements of the present invention are themselves examples of an invertible integer waveform transformation arrangement having no input/output delay, and several other examples of such arrangements are given in this description. Such arrangements may be "trivial", i.e. have output equal to for example the input or minus the input.

The inverse transformation means of the invention according to its second or third aspects is described is the body of the description with reference to FIG. 6b or 15d below. It is another arrangement of a similar kind, but with filters A and B interchanged and first and second invertible integer waveform transformation arrangements both inverted and interchanged. If one example of the invention in its second or third aspects are used for encoding waveform data, the inverse arrangement is used for decoding waveform data, or vice-versa.

In a fourth aspect of the invention, the quantization process within the encoding and decoding filter has a smaller fractional step size than the output quantization in order to reduce the overall quantization noise added to the prediction-encoded signal. A number n of reduced step-size filter stages may be cascaded to produce complicated encoding and decoding filters without undue build up of transmitted quantization noise that may degrade the data rate of the prediction-encoded signal.

According to the invention in a fourth aspect, invertible transformation means for converting input integer-valued PCM waveform data to output integer-valued PCM waveform data are provided, comprising:

an input for said input integer-valued PCM waveform data, an output for said output integer-valued PCM waveform data, a first to an n'th quantizing filter stages, an integer quantizer rounding operation rounding to near or nearest integer values, wherein the input feeds said first quantizing filter stage, the i'th quantizing filter stage feeds the i+1'th quantizing filter stage for all i=1 to n−1, the n'th quantizing filter stage feeds the integer quantizer rounding operation, the integer quantizer rounding operation feeds the output, wherein each quantizer filter stage i incorporates a fractional-step quantizer rounding operation with step size $1/G_1$ an integer divisor $G_1$ of unity such that the output of that stage is quantized to that step size each quantizer filter stage i incorporates a feedforward filter $A_i$ having a delay of at least one sample prior to said fractional-step quantizer fed by the input to the quantizer filter stage and the filter output being summed with said input at a summing node, and each quantizer filter stage i incorporates a feedback filter $B_i$ having a delay of at least one sample prior to said fractional-step quantizer fed by the output of the quantizer filter stage and the filter output being differenced with the output of said feedforward filter $A_1$ at a summing node.

In preferred implementations of the invention in its second, third or fourth aspect, the filters A and B or $A_i$ and $B_i$ are FIR (finite impulse response) filters each term of which incorporates delay.

In preferred implementations of the invention in its second, third or fourth aspect, said FIR filters A and B or $A_i$ and $B_i$ have coefficients all of which have finite fractional precision.

It is further preferred that said filters are implemented either without rounding error or only with rounding errors that do not affect the value of the output of said quantizer.

In the invention according to its second, third or fourth aspect, the quantizers may optionally incorporate noise shaping. It is preferred that either the coefficients of the noise shaping filter are integer or the noise shaper is outer-form with FIR filter having coefficients of finite precision.

In implementations of the invention according to its second third or fourth aspect, wherever a summing node before a quantizer is fed with a signal whose quantization step size is a equal to or an integer multiple of the quantizer step size, the invention may equivalently be implemented with the signal being added at a summing node immediately after the quantizer, or vice-versa.

In the invention according to its fourth aspect, the arrangement of cascaded quantizing filter stages followed by an integer quantizer may be used either for lossless encoding or for lossless decoding. Also according to the invention, an inverse arrangement using as a feedback sidechain around the integer quantizer the cascaded filters with all undelayed signal paths omitted and with direct feeds from the input being via all the delay filters $A_i$ and $B_i$, described herein with reference to FIGS. 16 and 17 below, is used for decoding or encoding respectively and is also according to an aspect of the invention.

Preferably, according to the invention in the above aspects, the filter arrangements used for encoding and the inverse filter arrangements used for decoding will be causal and stable, so that the filter outputs do not increase in magnitude unduly.

It is necessary for stability of encoding and decoding that the encoding and decoding filters be of minimum phase form, i.e. that they and their inverses (ignoring quantization) be stable according to well known stability criteria, such as the filter poles and zeros all being within or on the unit complex circle. See any standard textbook on the theory of digital filtering, for example A. Antoniou, "Digital Filters Analysis, Design and Applications", 2nd. edition, McGraw-Hill Inc., New York, 1993.

However, although highly preferable, it is not essential that the decoding filter be stable, since the lossless inverse nature of the decoding will ensure exact recovery of the input. However, if an encoding filter arrangement is used that is not minimum phase, in general the wordlength will not be reduced by as much by the encoding arrangement as by suitable encoding filter arrangements that are minimum phase. Also, the use of a non-minimum phase encoding filter arrangement will result in a decoding arrangement that is poor at recovering from data errors in transmission.

The invention may also be applied to lossless encoding and lossless decoding of related multichannel waveform signals in PCM form, wherein the cascaded stages of encoding may include lossless matrix encoding stages and the cascaded stages of decoding may include lossless matrix decoding stages.

Such lossless matrix encoding stages again, according to the invention, may use non-integer coefficients of finite precision and comprise individual stages of processing wherein only one channel is modified in each stage, said channel having as output a quantization or rounding to the nearest integer of a linear combination of the input channels to that stage, with the coefficient of the altered channel being unity. The inverse lossless matrix decoding stage in the inverse lossless decoder comprises a similar arrangement except that the signs of the coefficients of all the unaltered channels are reversed, and where the quantizer in the decoder has the same effect as the quantizer in the original encoder. The lossless encoding and decoding stages may also incorporate an overall polarity inversion applied to any subset of the n channels.

A cascade of lossless matrix encoding stages applied to n channels is here termed an n×n matrix quantizer, and the inverse cascade of lossless matrix decoding stages that reverses the effect of such an n×n matrix quantizer applied to n channels is here termed the inverse n×n matrix quantizer. Typically, such n×n matrix quantizers are used in encoding n-channel PCM waveform data to reduce the data rate by altering input channels so that the output channel signal are linear combinations of channels having lower energy and total encoded data rate.

The invention according to a fifth aspect may be applied to related multichannel waveform signals.

According to the invention in a fifth aspect, invertible transformation means for converting an input integer-valued PCM n-channel waveform data to output integer-valued PCM n-channel waveform data are provided, comprising:

an n-channel input for said input integer-valued PCM n-channel waveform data, an n-channel output for said output integer-valued PCM n-channel waveform data, an n-channel summing node, an n-channel differencing node, an n-channel quantizer rounding operation rounding to near or nearest integer values, a first n×n matrix filter means A each term of which incorporates delay, a second n×n matrix filter means B each term of which incorporates delay, and a first and a second n×n matrix quantizer as defined herein, wherein the n-channel input feeds said summing node via said first n×n matrix quantizer, the n-channel input feeds said differencing node via the n×n matrix filter A, the n-channel output feeds said differencing node via the n×n matrix filter B, the n-channel differencing node feeds the n-channel quantizer, the n-channel quantizer feeds the n-channel summing node, and the n-channel summing node feeds said n-channel output via the second n×n matrix quantizer.

In preferred implementations of the invention in its fifth aspect, said n×n matrix filter means A and B are matrix FIR filters.

In preferred implementations of the invention in its fifth aspect, said n×n matrix FIR filter means A and B have coefficients all of which have finite fractional precision.

It is further preferred that said filter means are implemented either without rounding error or only with rounding errors that do not affect the value of the output of said quantizer.

The inverse transformation means of the invention according to its fifth aspects is described is the body of the description with reference to FIG. 24d below. It is another arrangement of a similar kind, but with the matrix filters A and B interchanged and first and second n×n matrix quantizers both inverted and interchanged. If one example of the invention in its second or third aspects are used for encoding waveform data, the inverse arrangement is used for decoding waveform data, or vice-versa.

The invention according to any of the five above aspects may be applied to related multichannel waveform signals, wherein the FIR filters A and B or $A_i$ and $B_i$ in the encoding and inverse decoding filters are matrix filters wherein each channel input feeds each channel output by an FIR filter with finite precision coefficients, and the noise shaping filter may also be a matrix filter. In the matrix case, the stability criterion is that all the poles and zeros of the filter defined by the determinant of the matrices lie within or on the unit circle.

As will be described in more detail below, in the case where the FIR filter A or $A_i$ in the encoder is "leaky", i.e. is strictly stable and has no zeros on the unit circle, then it may not be necessary to transmit initialisation state variables from the encoder to the decoder, since in that case, the state variables will, after a sufficient elapse of time with actual input signals, eventually attain the same values in the decoder as in the encoder, and from that point onwards the decoding will become lossless.

The invention according to any aspect may also be applied to waveform signals defined on discrete arrays having more than one dimension, such as two-dimensional image waveforms. In this case the filters A and B or $A_i$ and B, and the noise shaper are two- or more-dimensional FIR filters, each term of which has at least one sample delay in at least one of the array axis directions. The criteria ensuring stability of filters on arrays in more than one dimension is more complex than the one-dimensional theory, but suitable methods of determining stability of such filters may be found for example in R. R. Read, J. L. Shanks & S. Treitel, "Two Dimensional. Recursive Filtering", in ed. T. S. Huang, "Picture Processing and Digital Filtering, 2nd Edition", Topics in Applied Physics, vol. 6, Springer Verlag, Berlin, 1979 pp. 131–176.

All above aspects of the invention may be used and preferably are used with an associated entropy or Huffman or similar encoding or decoding arrangement. The use of such entropy or Huffman or similar encoding at the output of a PCM waveform data encoding arrangement according to the above aspects of the invention provides a lower data rate for the encoded signal, and it is also necessary for the associated decoder to precede the decoding filter arrangement according to any of the above aspects of the invention by an inverse entropy or Huffman or similar decoding. The invention may also be applied to input signals having any uniform quantization step size G by regarding the step size as being the unit integer for the purposes of implementing the invention. In particular, the input signal to an encoder may be pre-processed to remove DC components and to normalise the gain so that the step size becomes or may be regarded as unity, and the decoder can be followed by an inverse process of multiplying by the original step size G and re-inserting the DC component.

In transmitting PCM signals, it may be desired to handle PCM waveform signals of different wordlengths or precision in a common manner. This may be done in the PCM representation by adding to shorter word length additional least significant digits having a constant unvarying form to shorter word length to bring them up to a common longer word length. Data rate savings in transmitting such signals may be obtained not only by reducing the transmitted integer signal energy, but by in addition detecting in longer wordlength PCM signal whether such constant least significant digits are present for extended sequences of samples, and if so to transmit the digital words in encoded form without the least significant digits, transmitting these least significant digits just once separately during a sequence, and by adding these least significant digits back in the decoder. By this means a single common format may be used to transmit a wide variety of word lengths while allowing data rates automatically to adjust according to the word length.

In particular, an encoder and a decoder may be used in which the wordlength and word precision is adaptive moment by moment for successive blocks of waveform samples, using a possibly different wordlength in each block.

While this allows lossless encoding and decoding of signals of any fixed wordlength, it also permits the encoders and decoders of the present invention to be used with a lossy encoding system as well.

This is done, according to the invention in a sixth aspect, by preceding a lossless encoder adaptive to wordlength and word precision by an adaptive rounding algorithm which block by block of waveform samples rounds or quantizes the waveform data to a reduced precision and incorporates adaptive noise shaping around the quantizer, such that the energy and spectral form of the noise shaped quantization error thus introduced lies below acceptable perceptual thresholds in the presence of the PCM waveform signal at that part of the waveform data. A subsequent associated lossless transmission system adaptive to wordlength and word precision then transmits the modified waveform data without any further loss.

This allows lossless decoding systems adaptive to wordlength and word precision to be used also for lossy transmission of signals according to perceptual criteria where a reduced data rate is required, without requiring any special features in the decoder not already present for lossless decoding purposes. Because the initial perceptual lossy adaptive noise shaped quantization of the waveform signal precedes the encoder, the system is still handling the resulting signal in a lossless form in an efficient manner to reduce data rate as much as possible.

In the invention in its sixth aspect, advantages are obtained over the known prior lossy coding art. In particular, advantages include the following:

A single encoding and decoding strategy and system may be used to handle lossless and lossy encoding, requiring only a single common decoding algorithm for both.

Additionally, for low signal levels, the lossy coding will revert to being lossless since the encoded data rate in quiet passages will be sufficiently low as to require no further discarding of data. Unlike other lossy systems, this will preserve the integrity of quiet passages.

In addition, when lossy encoders according to the invention in its sixth aspect are cascaded, the degree of degradation of the original waveform will not continue to degrade to an indefinite degree (as is the case with conventional perceptual encoders), but rather the degree of degradation will be strictly limited to that caused by the discrete and finite number of degrees of loss of numerical precision that may be achieved. As a result, very large numbers of lossy encode/decode systems according to the invention in its sixth aspect may be cascaded indefinitely without results becoming unacceptable.

Moreover, once lossy coding has been used once according to the invention in its sixth aspect, all subsequent lossless coding systems adaptive to wordlength and word precision according to the invention will continue automatically to transmit signals at the reduced data rate, whereas with conventional perceptual lossy encoding, the decoded signal does not compress efficiently in data rate during any subsequent lossless encoding and decoding operations.

It is obvious that cascading lossless encoding algorithms for integer-valued waveforms will result in more complex composite lossless encoding algorithms whose effect may be undone by an reversed order cascade of inverse lossless decoding algorithms. Therefore the invention includes cascaded or composite encoders or decoders incorporating component encoders or decoders according to the invention in any of its aspects.

Additionally, implementation of the invention may be made rearranging, combining or splitting component subalgorithms in ways evident to those skilled in the art and also on the basis of methods described and referred to herein. In particular, signals divisible by G having a quantization step size G may equivalently be added before or after a quantizer with step size G with equivalent results, and cascaded subalgorithms may be replaced by single subalgorithms known to be of identical performance, or vice-versa. Polarity inversions may be added or removed in ways evident to one skilled in the art, for example changing summing to differencing nodes, provided that the overall functionality remains unchanged. Other re-arrangements of the kind described in section 1 of the above-cited Gerzon, Craven, Stuart, Wilson reference may also be applied to the present invention.

BRIEF DESCRIPTION OF DRAWINGS

Embodiments of the invention will now be described by way of example with reference to the accompanying drawings in which: —

FIGS. 13a and 13b show a lossless predictor encoding and decoding system incorporating outer-form noise shaping around the quantizer according to the invention;

FIGS. 15a to 15d show more general lossless encoding and inverse decoding systems according to the invention;

FIGS. 24a, 24c, 24e, 24g, 24i and 24k show an n-channel matrix lossless predictor encoding system according to the invention, and FIGS. 24b, 24d, 24f, 24h, 24j and 24l show the respective inverse n-channel matrix lossless predictor decoding system according to the invention;

BEST MODES FOR CARRYING OUT THE INVENTION

The invention may be implemented by feeding waveform data in digital PCM form into digital signal processing chips, typical current examples of which are the Motorola DSP 56000 or DSP 96000 family or the Texas Instruments TMS 320 family, and the encoding and decoding algorithms may be implemented in the form of code designed to run on the chip and stored in program memory on or associated with the chip. Alternatively, in computer based applications, the waveform signal in PCM and encoded forms may be handled as digital data in the computer and its associated memory, and the encoding and decoding algorithms implemented in the form of program code for the computer in ways well known to those skilled in the art. In applications requiring the production of large numbers of cheap encoders and decoders, the signal processing chips used may be optimised for the algorithms used to produce dedicated chips for this specific application.

Waveform signals will usually originate either from an original analog waveform signal (such as an audio or image or video signal) which is then converted into PCM or similar form by an analog-to-digital converter, and such waveform signals will eventually be used by an end user by being passed to a digital-to-analog converter to produce a reproduced analog waveform. However, in some cases, the waveform may be produced entirely in the digital domain, for example by a digital synthesizer for audio music signals, or by a drawing program for image waveforms. The waveform may also have been extensively modified in the digital domain for example by mixing audio signals together in a digital audio workstation or by the use of effects and filters.

Figure 1:
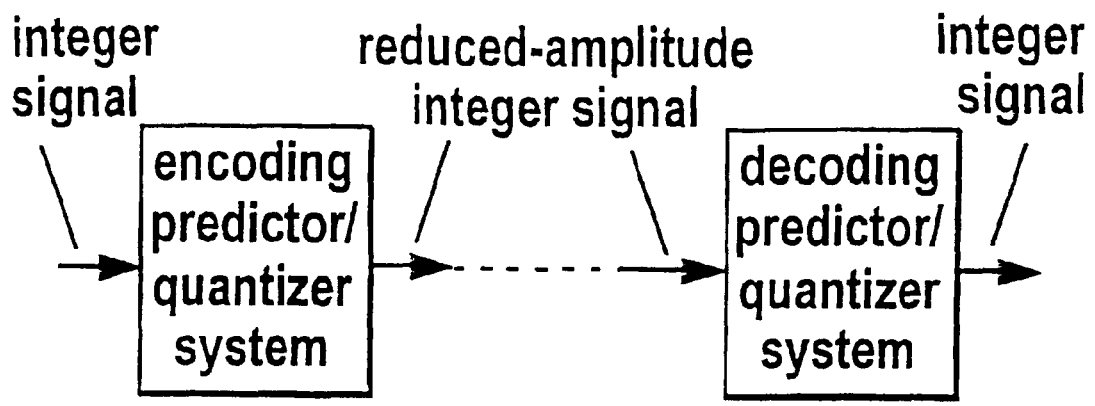
FIG. 1 shows a schematic of predictor-based systems of losslessly encoding and decoding integer signals at reduced wordlength.

The invention, like known prior-art lossless coding methods, is based on using an invertible quantizing filtering arrangement for encoding integer-valued waveforms to produce integer valued waveform signals having smaller wordlengths, and on decoding the reduced wordlength integer-valued waveform by an inverse quantizing filtering arrangement for decoding to recover exactly the original integer-valued waveform, as shown in FIG. 1.

Figure 2A:
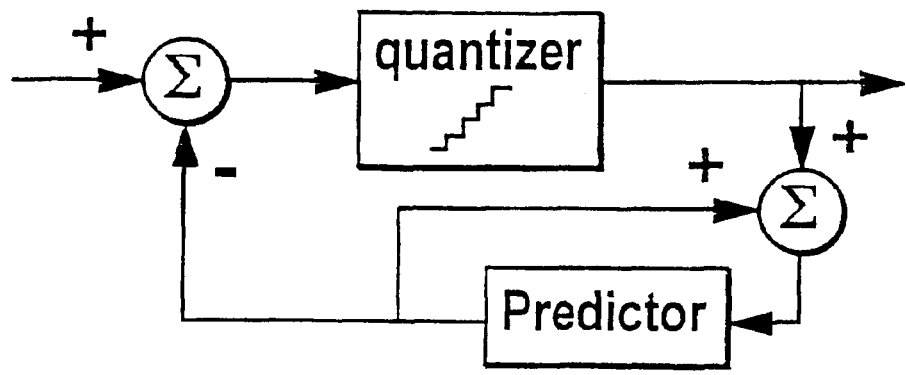
FIG. 2 shows a prior art lossless predictor encoding and decoding system.
Figure 2B:
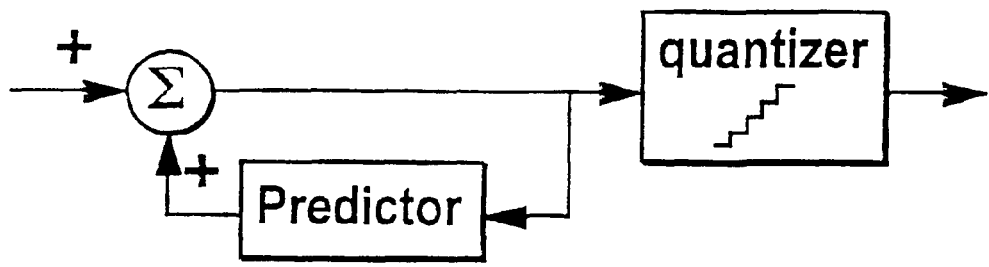

The known prior art quantizing filter arrangement used for lossless encoding is shown in FIG. 2a, and the known prior art quantizing filter arrangement used for lossless decoding is in shown FIG. 2b. FIG. 2a shows a conventional predictor system around an integer quantizer rounding operation, of the type familiar in the prediction literature such as the above Makhoul reference. The predictor filter $P(z^{-1})$, where $z^{-1}$ represents a one-sample delay and $P(z^{-1})$ is the response of the predictor, is fed from the output of via a summing note quantizer, which may round to the nearest integer, to which is also fed the output of the predictor, and the quantizer is fed via a second summing node by the input signal and in inverted phase the output of the predictor. The inverse lossless decoder shown in FIG. 2b feeds the coded signal via a summing node into the quantizer, and the predictor, identical to that used in the encoder, is fed by the input to the quantizer and its output feeds the summing node.

As is known in the prior art, and can be checked by calculation of the mathematical relationships between signals present in each path in the networks of FIGS. 2a and 2b, the decoding network precisely reconstructs the original input signal provided only that at any one previous time the state variables in the prediction filters are identical.

Figure 3:
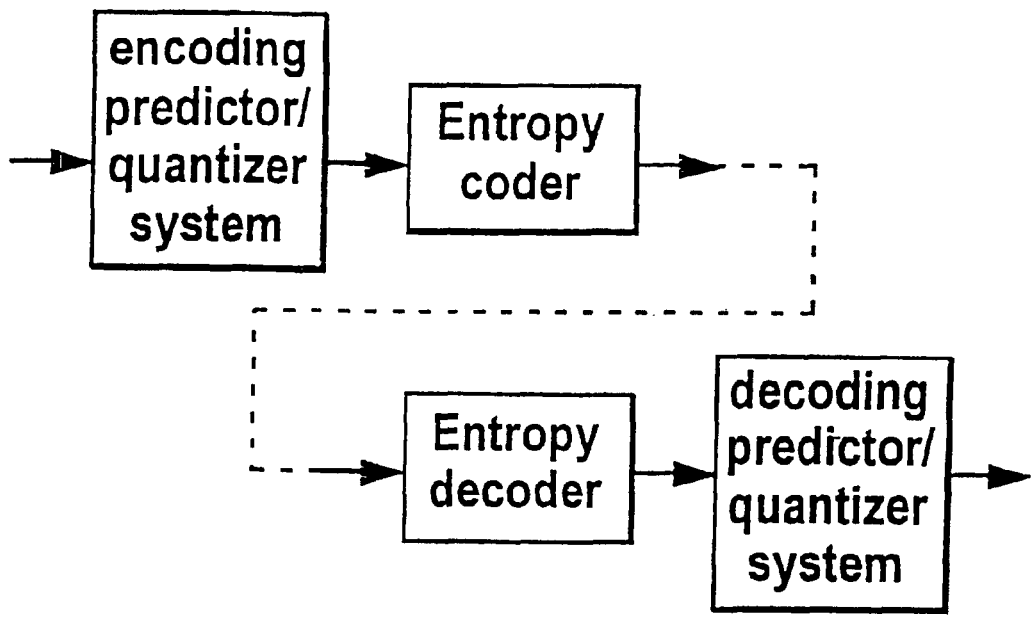
FIGS. 3 and 4 shows a schematic of a lossless coding and decoding system using entropy coding of data.
Figure 4A:
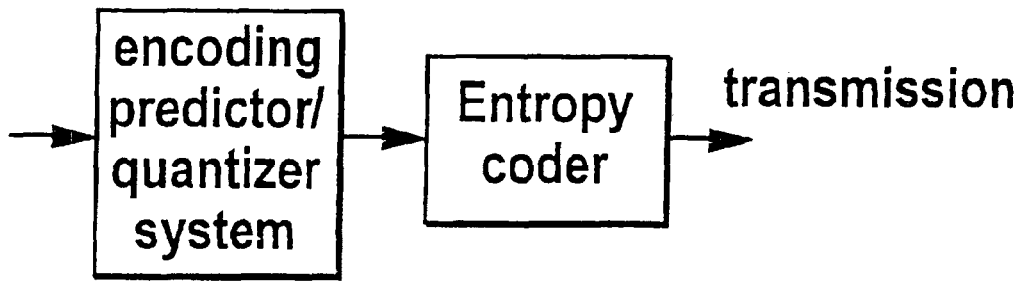
Figure 4B:
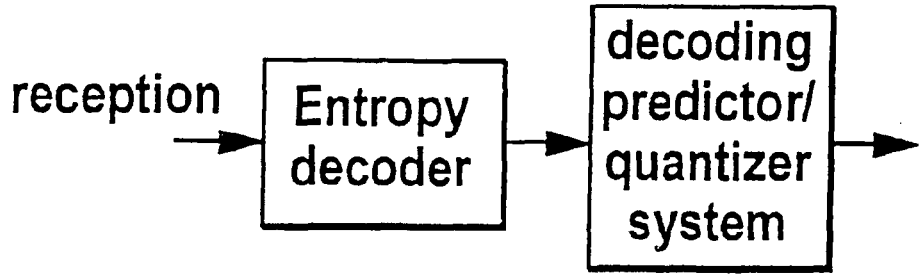

Although with suitable choice of predictors, the prior art encoder of FIG. 2a reduces the typical and average magnitude of encoded signals, this is converted to a reduced data rate by a second step shown in FIGS. 3 and 4 that we shall generically term here "entropy coding", whereby the lengths of common words are shortened for transmission. In order to decode the original signal, a further step, as shown in FIGS. 3 and 4, here given the generic term "entropy decoding" is used to recover the original word length of the encoded signal, and then the encoded signal is decoded back to the original input words.

This "entropy coding" shortening of wordlength may be accomplished in numerous fashions known in the prior art, and we describe by way of example briefly two typical methods that have found common use. One simple method divides the signal into blocks of length L samples, and for each block examines how many $B_2$ of the most significant bits are unvarying throughout the block, and discards these $B_2$ most significant bits, leaving words of length $B_2$ bits shorter. The number $B_2$ is transmitted separately with the block word data. The entropy decoder re-inserts these $B_2$ unvarying most significant bits to recover the wordlength.

A more sophisticated method that offers increased data rate reduction uses the method of Huffman coding using Huffman coding look-up tables. This method is described for example in the Cellier et al reference above. Huffman coding techniques are described in numerous references, for example see J. Weiss & D. Schremp, "Putting data on a diet", IEEE Spectrum, vol. 30, no. 8, pp. 36–39 (1993 Aug.) or the above Cellier et al reference or chapter 6 of the above Gonzales & Woods reference or the above Rabbani & Jones reference. The Huffman table method replaces each digital word with another word of variable length chosen from a look-up table, chosen so that more common digital words have a short length and less common ones a longer length.

The Huffman table is derived from a Huffman tree as described in the cited references, and has the property that the Huffman table words can be unambiguously recovered from the data stream without needing any "separator" information between words, and used via an inverse table to recover the original digital words.

The Huffman table used may be adaptive to signal statistics, and the encoder and decoder may have a number of Huffman tables for encoding and decoding, the table used in each block of data being chosen to minimise data rate in that block and the choice of table being transmitted with the encoded data so that the decoder knows which table to use in decoding that block.

This prior art is well known and described for example in the cited references and elsewhere in the literature. A particular example of Huffman coding and decoding used in connection with the present invention is described by way of example later in this description.

Figure 5A:
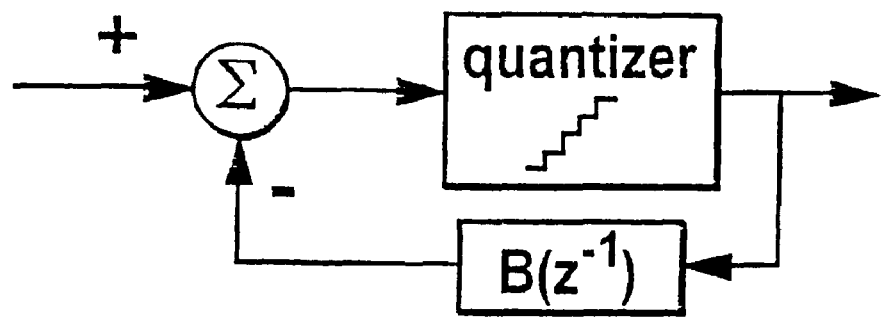
FIG. 5 shows a form equivalent to FIG. 2 of lossless predictor encoding and decoding system.
Figure 5B:
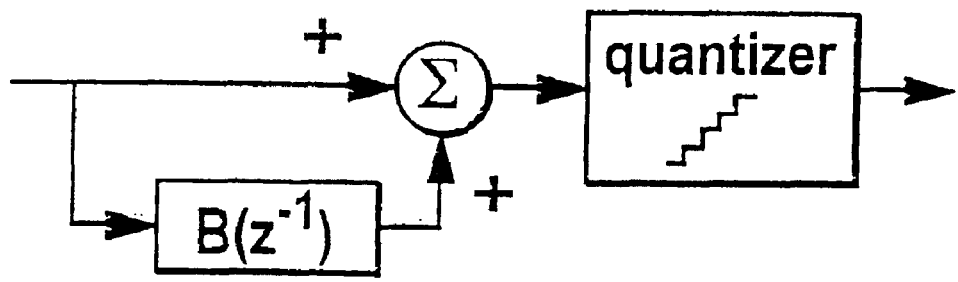

FIGS. 5a and 5b show a simplified schematic of the respective encoder and decoder of the predictive systems shown in FIGS. 2a and 2b, where $B(z^{-1})$ represents a filter having response $$B(z^{-1}) = \frac{P(z^{-1})}{1 - P(z^{-1})}$$

Where $z^{-1}$ represents a one-sample delay and $P(z^{-1})$ is the response of the predictor.

In prior art implementations, $B(z^{-1})$ has been a recursive filter, and it has not been recognised that implementations with $B(z^{-1})$ an FIR filter coefficients with finite precision fractional parts are particularly advantageous.

Figure 6A:
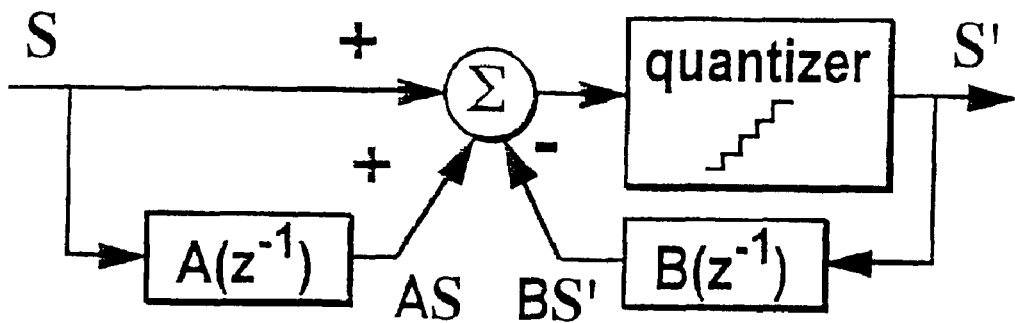
FIG. 6 shows forms of lossless predictor encoding and decoding system according to the invention.
Figure 6B:
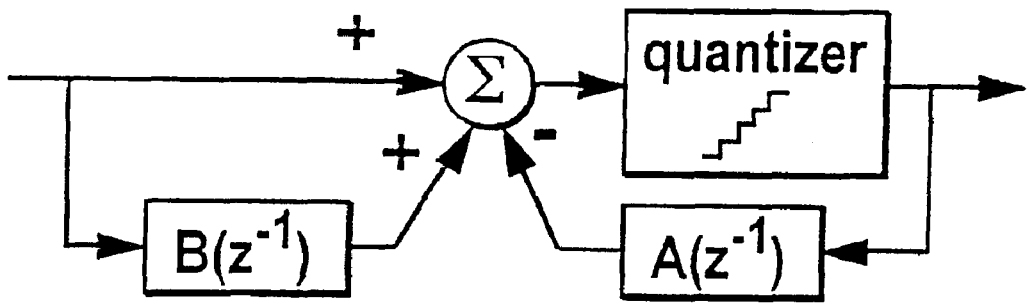

The invention comprises in one aspect generalising the schematic of FIG. 5 to that of FIGS. 6a and 6b and implementing the filters $A(z^{-1})$ and $B(z^{-1})$ by finite impulse response (FIR) filters whose coefficients are rational numbers whose lowest common denominator is an integer d. Such filters can be implemented by finite precision arithmetic and the overall systems shown in FIG. 6 can be implemented without any overall rounding errors by means of an implementation such as shown in FIGS. 6e and 6f.

In some implementations of the invention where the filters $A(z^{-1})$ and $B(z^{-1})$ are finite impulse response (FIR) filters whose coefficients are rational numbers whose lowest common denominator is an integer d, one or other of the filters $A(z^{-1})$ and $B(z^{-1})$ may be absent, or equivalently have all coefficients equal to zero.

In FIG. 6a, a predictive encoding system according to the invention comprises the integer input feeding a summing node both directly and via an FIR filter $A(z^{-1})$ having at least one sample delay and having finite precision rational coefficients, e.g. coefficients with only n binary fractional digits, so that $d=2^{-n}$. The summing node feeds an integer quantizer or rounding operation with unity step size, so that its output is also integer-valued, and the output of the quantizer is also fed back to and subtracted from the summing node via another FIR filter $B(z^{-1})$ having at least one sample delay and having finite precision rational coefficients, e.g. coefficients with only n binary fractional digits, so that $d=2^{-n}$. The signals fed to the summing node are either integer-valued or multiples of 1/d, so may be represented unambiguously at the quantizer, so that the quantization operation, typically rounding to the nearest integer, can be implemented unambiguously without error.

A particular feature of the system shown in FIG. 6a is that the process of encoding the input integer-valued signal into an output integer-valued signal is invertible, i.e. a second system can recover the input integer-valued signal from the output integer-valued signal, i.e. the encoding process is lossless and reversible.

FIG. 6b is a schematic of this inverse or lossless decoding process. Functionally this is identical to the encoder of FIG. 6a with just two exceptions: firstly, the FIR filters $A(z^{-1})$ and $B(z^{-1})$ are interchanged, and secondly, the quantizer used in the decoder is equivalent to the encoding quantizer both preceded and followed by a gain of 1. For a rounding quantizer, this is equivalent to using a rounding operation that rounds down values halfway between quantization levels if the quantizer used in the encoder rounds up, or vice-versa.

At any moment of time, the filters $A(z^{-1})$ and $B(z^{-1})$ in the encoder of FIG. 6a are storing past values of the history of the input to the filters in the memory implementing time delays in the filter. These stored values are known as the state variables of the system of FIG. 6a.

In order that the decoder of FIG. 6b invert the process of FIG. 6a, it is necessary that the state variables at any time in the filters $A(z^{-1})$ and $B(z^{-1})$ in the encoder and decoder be identical. It is sufficient, to ensure this at subsequent moments of time, that the state variables at one given moment of time be identical. Thus, in order to reconstruct the input signal to the encoder at the output of the decoder it is necessary not only to transmit the output of the encoder to the input of the decoder, but also to transmit initial values of the state variables in the filters $A(z^{-1})$ and $B(z^{-1})$ from the encoder to the decoder. This process is termed "initialisation" of the decoder.

To see that FIG. 6b indeed implements the inverse decoding for the encoding of FIG. 6a, note that the output S' of FIG. 6a is given in terms of the input S by $$S' = S + \text{quantize}\,(AS\ BS')$$

where quantize is the integer rounding operation and where the operators A and B represent the respective filters $A(z^{-1})$ and $B(z^{-1})$ incorporating delays. The inverse equation is $$S = S' \text{quantize}(AS\ BS')$$
$$= S' + \text{quantize}'(BS'\ AS)$$

where quantize' is the original quantize process preceded and followed by a polarity inversion. This inverse process is implemented by FIG. 6b.

The encoder of FIG. 6a will work for arbitrary finite precision FIR filters $A(z^{-1})$ and $B(z^{-1})$, and the inverse decoder of FIG. 6b will always reconstruct the input signal to the encoder from the output of the decoder provided that it is initialised correctly. However, if the digital filter implemented by FIG. 6a is unstable, then its output will increase rapidly and unboundedly in level, and will not be suitable for transmission. It is therefore necessary to choose the denominator $1+B(z^{-1})$ of the encoding filter to be stable, i.e. to have zeros within or on the unit circle. Also, to minimise the data rate, it is also desirable, although not essential, that the inverse decoder also be stable, i.e. that the denominator $1+A(z^{-1})$ of the decoding filter be stable, i.e. has zeros of the complex variable z within or on the unit circle. The theory of stability of recursive digital filters, and means of ensuring stability, is well known and is to be found in most standard textbooks on the design of digital filters such as the above cited reference of Antoniou.

Figure 6C:
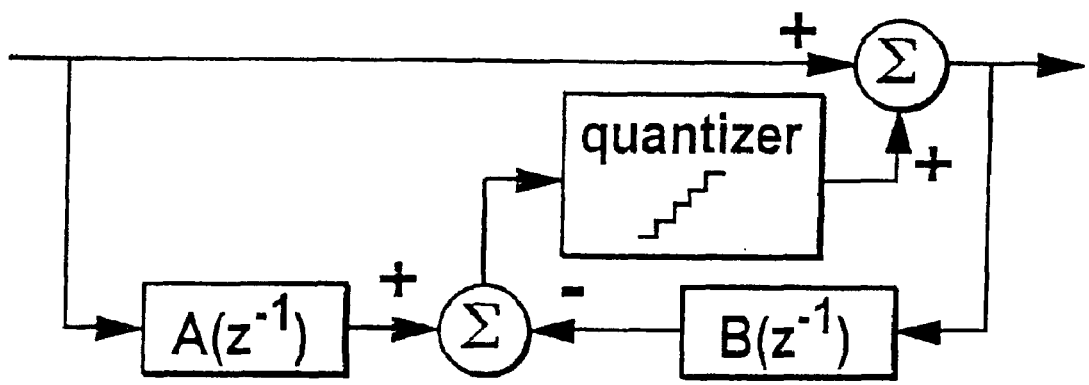
Figure 6D:
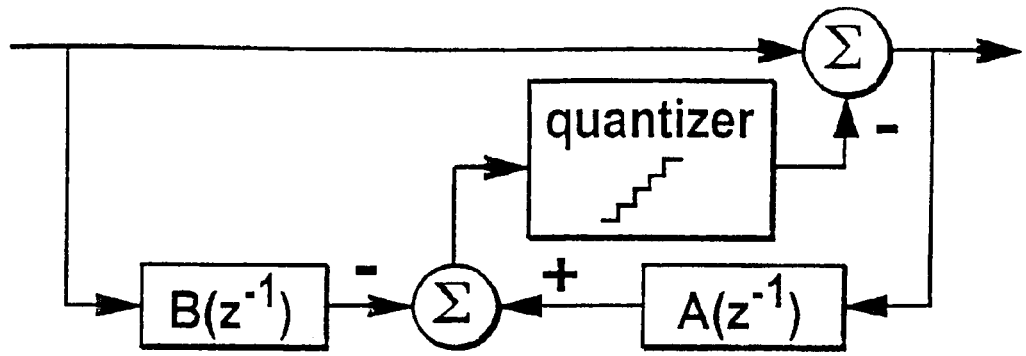
Figure 6E:
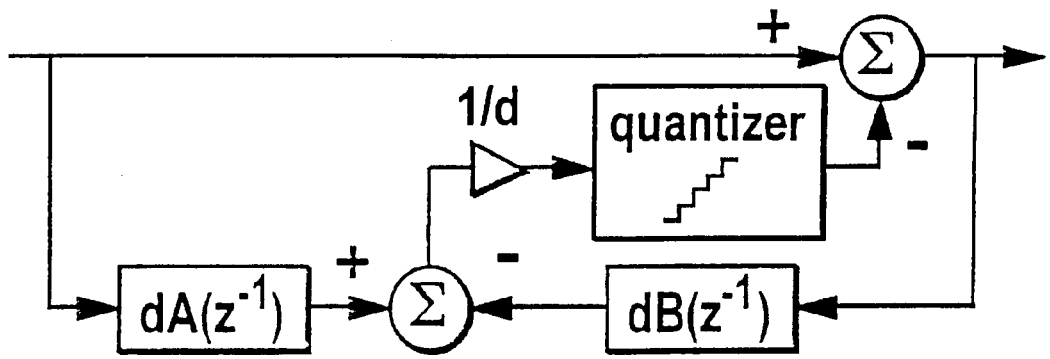
Figure 6F:
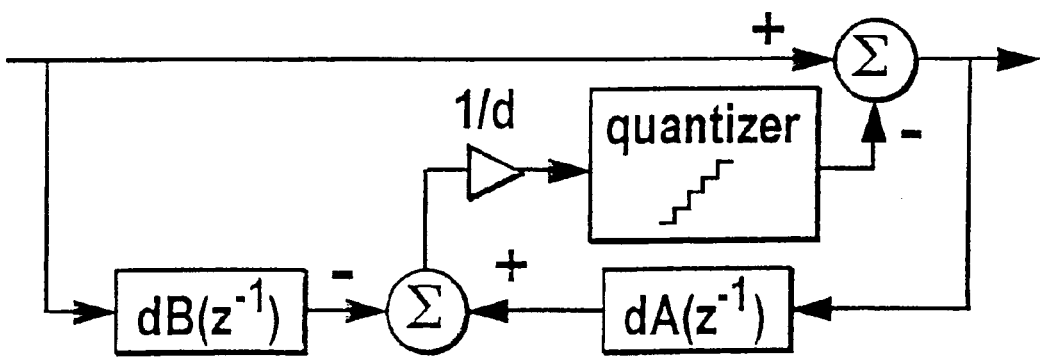

An alternative but functionally equivalent implementation of the lossless encoding and decoding systems of FIGS. 6a and 6b is shown respectively in FIGS. 6c and 6d. The input signal may be added after the quantizer rather than before to form the output, as shown in FIGS. 6c and 6d since addition of an integer signal before an integer quantizer has the same result as addition afterwards. Note that for functional equivalence, the quantizer used in FIG. 6b is equivalent to the quantizer used in FIG. 6d both preceded and followed by a gain of −1.

The same process may be used in the decoder as shown in FIG. 6d as in the encoder of FIG. 6c differing only in that the FIR filters $A(z^{-1})$ and $B(z^{-1})$ are interchanged. The quantizers used in the encoder and decoder are functionally identical in this case.

A practical implementation using integer arithmetic of the lossless encoding and decoding systems of FIG. 6a or 6c and 6b or 6d is shown respectively in FIGS. 6e and 6f. Rather than implement the filters $A(z^{-1})$ and $B(z^{-1})$ with fractional coefficients, one implements $A(z^{-1})$ and $dB(z^{-1})$ which have all-integer coefficient, subtracts the results and then divides by d after this and quantizes. The division by d and quantization may be implemented in a single step by quantizing in steps of d rather than in steps of 1, or may be implemented by a multiplication by an approximation to 1/d accurate to a sufficient but finite precision to represent the fractional part of the output correctly to the nearest integer followed by an integer rounding operation.

The same integer-arithmetic process may be used in the decoder as shown in FIG. 6f, differing from the encoder of FIG. 6e only in that the FIR filters $dA(z^{-1})$ and $dB(z^{-1})$ are interchanged. The quantizer used in the encoder and the inverse decoder are functionally identical in this case.

Figure 7A:
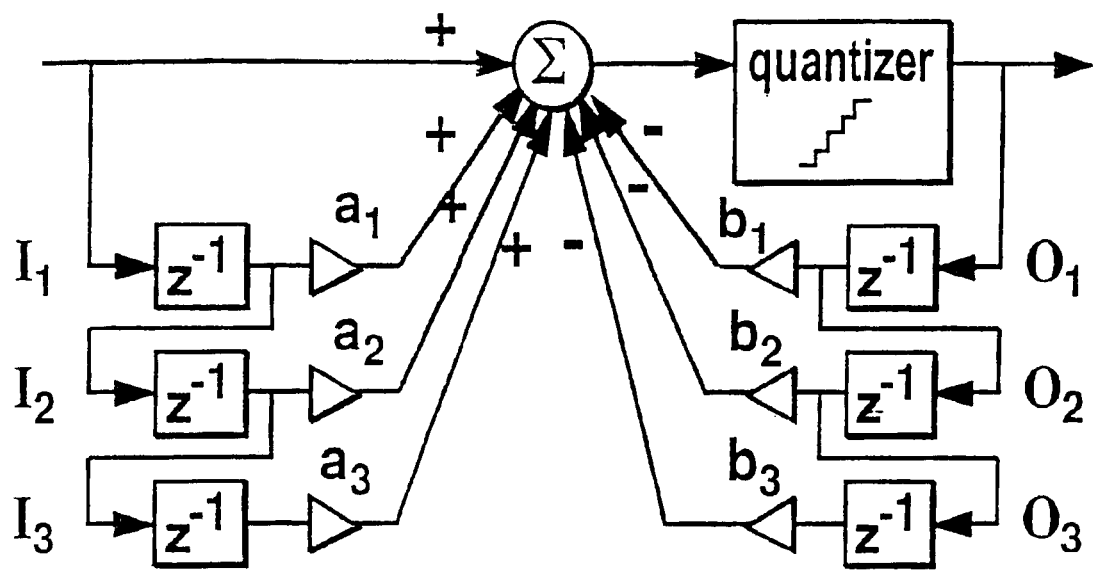
FIGS. 7a and 7b show a third order lossless predictor encoding and decoding system according to the invention.

FIGS. 7a and b show by way of example a respective encoder and decoder for the case of the filters $A(z^1)$ and $B(z^{-1})$ being third order FIR filters, with $$A(z^{-1}) = a_1 z^{-1} + a_2 z^{-2} + a_3 z^{-3}$$

$$B(z^{-1}) = b_1 z^{-1} + b_2 z^{-2} + b_3 z^{-3}$$

where $a_1, a_2, a_3, b_1, b_2, b_3$, are all coefficients of the form m/d where d is a lowest common denominator integer and m is an integer numerator which may be different for each filter coefficient.

Figure 7B:
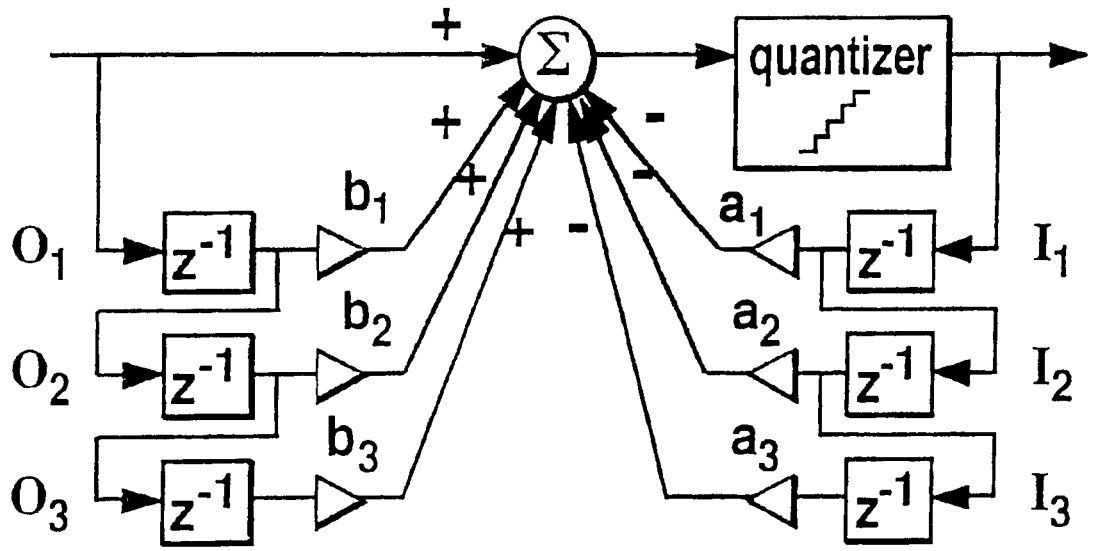

Also shown in FIG. 7 are the state variables, which comprise three successive input values $I_1, I_2, I_3$, and three successive output values $O_1, O_2, O_3$ of the encoder, and the corresponding state variables in the decoder.

In a typical application of the invention, the encoder filtering will be chosen adaptively so as to minimise the output signal energy from moment to moment. This may typically be done by encoding blocks of L successive samples of waveform data, where in high quality audio applications, L may lie typically be between 256 and 1536 samples. Each block may be encoded with different filter coefficients adapted to minimising the output signal level for that block of data. For illustrative purposes, we consider the case L=576 samples. In such typical applications, a possibly new encoding filter $A(z^{-1})$ and $B(z^{-1})$ will be selected for each block, and the six coefficients $a_1, a_2, a_3, b_1, b_2, b_3$ transmitted to the decoder for that block of samples, and in addition, the first three input samples $I_1, I_2, I_3$, and all L output samples of the encoder are also transmitted to the decoder. The first three input samples to the encoder are used both to initialise the decoder for that block and to provide the first three output samples. The first three output samples from the encoder are also used to initialise the decoder, so that from the fourth output sample to the L'th output sample of the decoder, the decoder reconstructs the input to the encoder losslessly.

The choice of filters $A(z^{-1})$ and $B(z^{-1})$ to minimise the encoded data rate may be done in a variety of ways. One method is simply to have a small set of possible choices and to encode the input waveform with each of them and to select that choice that gives the smallest average output signal level or the smallest peak level in a block. The coefficients used in that predictor are then transmitted to the decoder and loaded into the filters in the decoder.

One will generally aim to produce filters such that the filter $$\frac{1}{1+B(z^{-1})}(1+A(z^{-1}))$$

has a frequency response whose general trend is roughly inverse to the spectral content of the signal to be encoded, so that the output encoded signal has a spectrum much closer to being white. If, for example, an audio PCM signal to be encoded has a relatively high bass energy, as is commonly the case, then one would arrange the filter to produce a large bass cut, for example by making the numerator $1+A(z^{-1})$ incorporate a factor or factors approximating $1\ kz^{-1}$ for k near 1 or by placing a zero of the numerator near the unit circle at or near zero frequency. For audio material with a high energy in the middle frequency range around 7 kHz, such as speech sibilants, cymbals and some pop music, one would use a filter for encoding attenuating these frequencies to a large degree. For audio material with very little energy at very high frequencies, such as is typical on many classical music waveforms, one would use filters giving a high boost at these frequencies, for example by placing a pole of the denominator $I+B(z^{-1})$ near the Nyquist frequency.

In general, it is useful to note when designing a filtering arrangement for a particular signal spectrum that the decibel or logarithmic frequency response of a minimum phase filter of the form $$\frac{1}{1+B(z^{-1})}(1+A(z^{-1}))$$

has average value, averaged between zero frequency and Nyquist, of 0 dB.

It is proved that this is a necessary and sufficient condition for a filter being minimum phase in the reference M. A. Gerzon & P. G. Craven, "Optimal Noise Shaping and Dither of Digital Signals", Preprint 2822 of the 87th Audio Engineering Society Convention, New York (1989 Oct. 18–21). Because of this, a boost over one part of the frequency range will give a compensating average cut over the rest of the frequency range.

By way of example of a set of possible encoder filter choices in an audio waveform encoding application at a sampling rate of 44.1 kHz, one might choose the encoding filters with $a_3=0$, $b_3=0$, and values of $a_1, a_2, b_1, b_2$, shown in one of the cases displayed in table 1.

TABLE 1

| case | $a_1 =$ | $a_2 =$ | $b_1 =$ | $b_2 =$ |
|---|---|---|---|---|
| 0 | 0 | 0 | 0 | 0 |
| 1 | −6/4 | 3/4 | 3/4 | 2/4 |
| 2 | −6/4 | 2/4 | 3/4 | 2/4 |
| 3 | −6/4 | 2/4 | −1/4 | 1/4 |

TABLE 1-continued

| case | $a_1 =$ | $a_2 =$ | $b_1 =$ | $b_2 =$ |
|---|---|---|---|---|
| 4 | $-7/4$ | $3/4$ | 0 | $-2/4$ |
| 5 | $-1/4$ | $1/4$ | $5/4$ | $2/4$ |
| 6 | $-3/4$ | $3/4$ | $5/4$ | $2/4$ |
| 7 | $5/4$ | $2/4$ | $-1/4$ | $1/4$ |

Figure 7C:
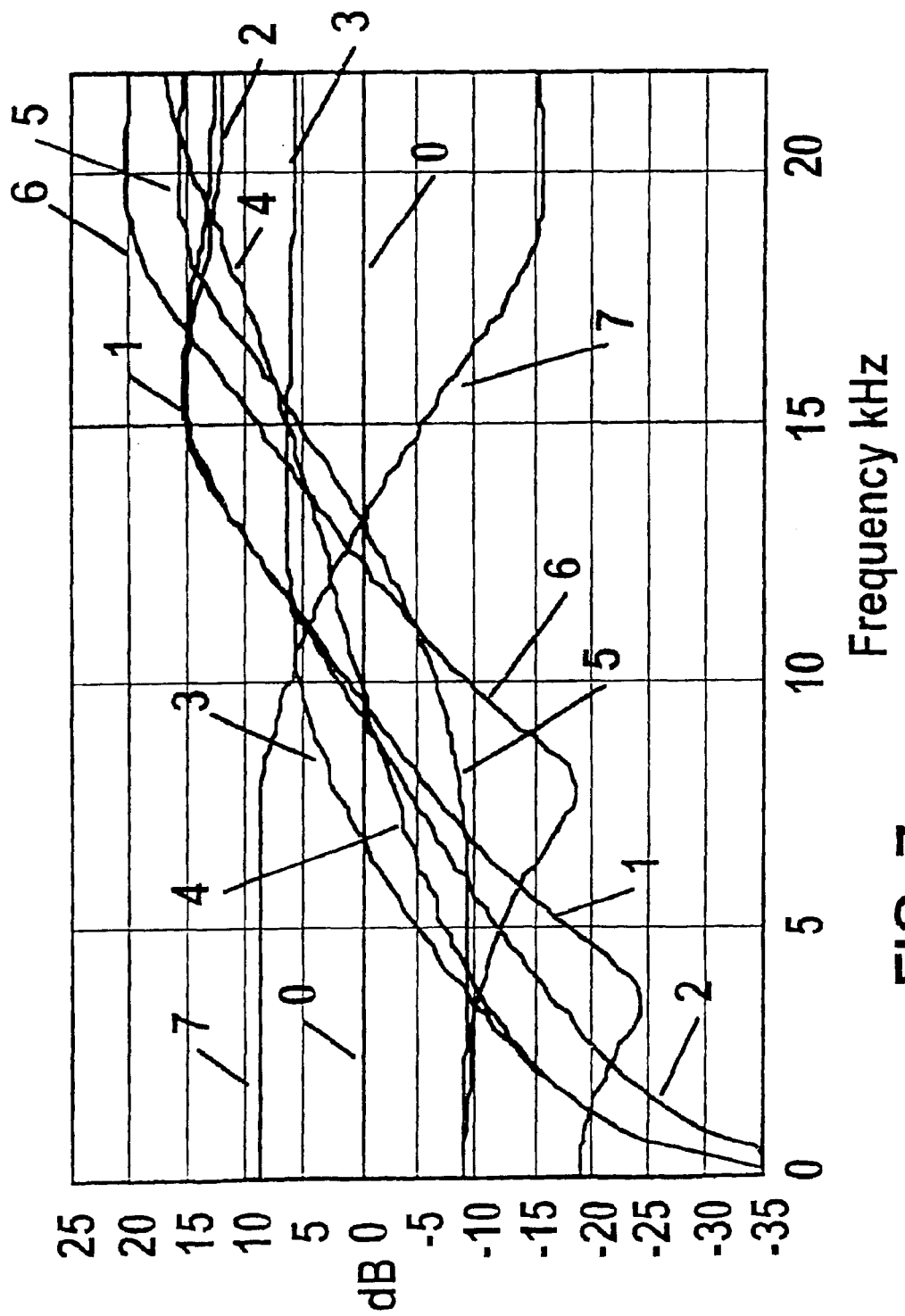
FIG. 7c shows the frequency responses associated with various values of encoding filter coefficients.

The frequency responses of these 8 cases in table 1 of second order encoding filters are plotted in dB against frequency in kHz in FIG. 7c for a 44.1 kHz sampling rate. It will be seen that these filters vary considerably in the degree of cut or boost at bass, middle and treble frequencies, matching a wide variety of signal spectra. The variety of possible frequency responses is increased further if $a_3$ and $b_3$ are also allowed to be non-zero, and if the denominator of the coefficients is allowed to be 8, 16 or higher. In particular, as the denominator is increased, the curves can have more extreme dynamic ranges between the boosts and the cuts, and the higher order permits a sharper transition between the frequency regions that are cut and those that are boosted, as well as more complicated shapes of frequency response. These refinements allow a more accurate signal prediction giving a lower prediction-encoded signal amplitude.

Where there are a very large number of possible choices of filters for the encoder, it will not be possible computationally to try out every possible filter to find out which gives the minimum average or peak encoded signal energy. However, one can select from a small selection (maybe just four or five) of widely differing filters matched to typically expected waveform spectra as a first step, encode the waveform in a block with each of these specially selected filters, and select that one which gives the smallest average or peak output level. Once the best of those is found, then for improved encoding as a second step one can try out a second small selection of filters all much more similar to the filter selected at the first step in order to find out if a better filter exists. This process may even be repeated again, each time using a more similar set of filters than at the previous stage. By this means, filters fairly close to giving optimum reduction of the average or peak output level may be found for each block.

It is also often preferred to implement the encoder to try out in a block of samples the filter already found to be optimal in the last block of samples, because for signals with relatively stationary statistics, this is often found to be a good filter for the current block of samples as well. If this predictor is found to be better than others tried at a first stage of determining which of several filters minimises output levels, then a further search for filters close to that used in the last block can be done, or one can simply retain the filter used in the previous block if new filters give little improvement in reducing output level.

More sophisticated methods of optimising the choice of filters $A(z^{-1})$ and $B(z^{-1})$ can be devised. For example, an estimate can be made for the spectrum of the input signal over the duration of the block can be made by using FFT (fast Fourier transform) methods over a windowed block of samples longer than the block being encoded, the windowing being used to improve the spectrum estimate. A third order minimum phase filter can then be designed using curve fitting techniques to have a spectral response matching the inverse of the resulting spectrum by minimising the average decibel difference between the signal spectrum and the dB frequency response of the filter $$\frac{1}{1+A(z^{-1})}(1+B(z^{-1}))$$

Incorporating Noise Shaping

The ideal encoding system is, as has been explained a filter $$\frac{1}{1+B(z^{-1})}(1+A(z^{-1}))$$

incorporating a rounding quantizer, whose effect is to "whiten" the spectrum of the incoming signal.

However, the quantizer itself also contributes to the encoder output, and where the incoming signal level is low, may even dominate the output energy of the encoder. In this case, it may also be desirable to minimise the energy contributed by the quantizer to the encoder output. The quantization noise spectrum itself approximates to being white, and the effect of the associated filtering is to filter the quantizer noise through the filter $$\frac{1}{1+B(z^{-1})}$$

which has the effect of increasing the level of quantization noise in the output.

Figure 8A:
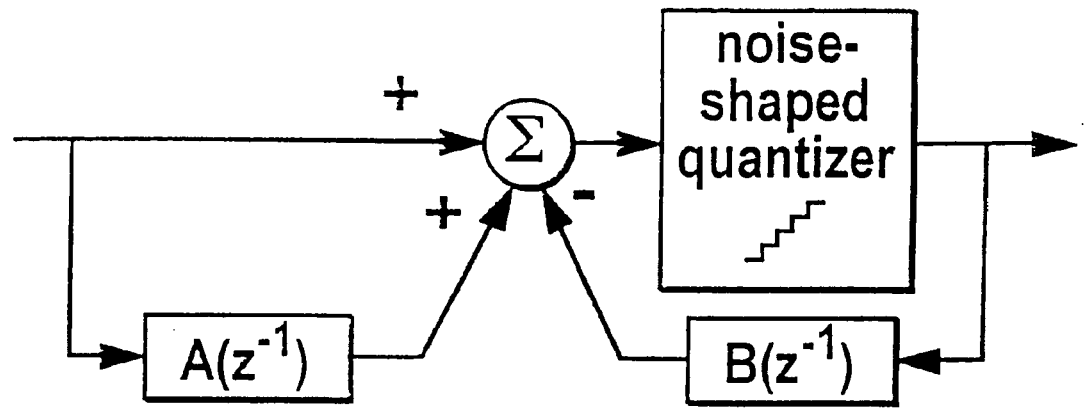
FIG. 8 shows a lossless predictor encoding and decoding system incorporating noise shaping around the quantizer according to the invention.
Figure 8B:
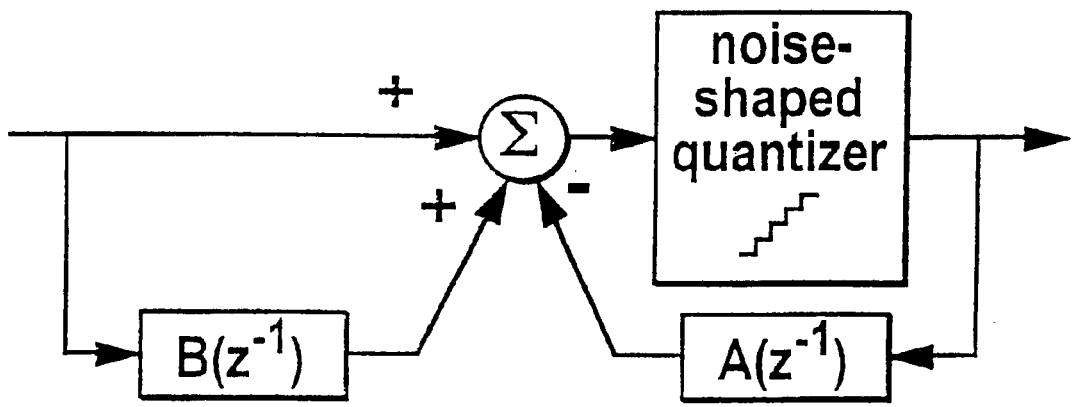

A more general lossless coding system can be created by incorporating noise shaping around the quantizer, as indicated schematically in FIGS. 8a and 8b for the encoder and decoder respectively. This uses the same arrangement for the encoder and decoder as previously except that now both the encoding quantizer and the decoding quantizer incorporate noise shaping of a type that needs only finite precision arithmetic. The noise shaping used in the encoder and the decoder should be identical, and initialisation of the state variables of the noise shaping filter needs to be transmitted from the encoder to the decoder.

Noise shaping is reviewed in the above cited Gerzon, Craven, Stuart, Wilson reference. There are two broad noise shaping architectures that may be used, known as inner and outer forms.

Figure 9:
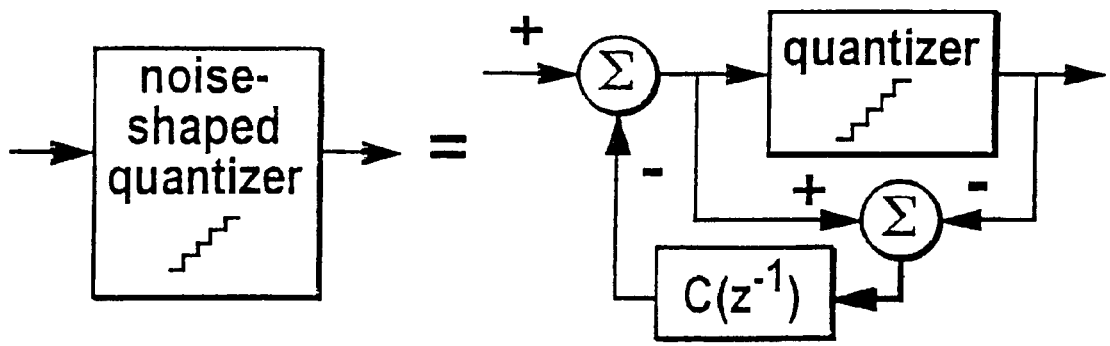
FIG. 9 shows an inner-form noise shaper around a quantizer.

FIG. 9 shows the inner-form of noise shaping around a quantizer. In such an inner-form noise shaper, the difference between the input and the output of the quantizer is fed back to the input via an FIR filter $C(z^{-1})$, preferably such that $1+C(z^{-1})$ is minimum phase in order to minimise added noise energy.

In the present invention, the FIR filter $C(z^{-1})$ preferably has integer-valued coefficients so that only finite-precision arithmetic is needed to implement the encoder exactly without any rounding errors. Such inner-form noise shapers have the effect of producing a quantization noise spectrum that is $$1+C(z^{-1})$$

times the approximately white spectrum of the basic quantizer.

Figure 10A:
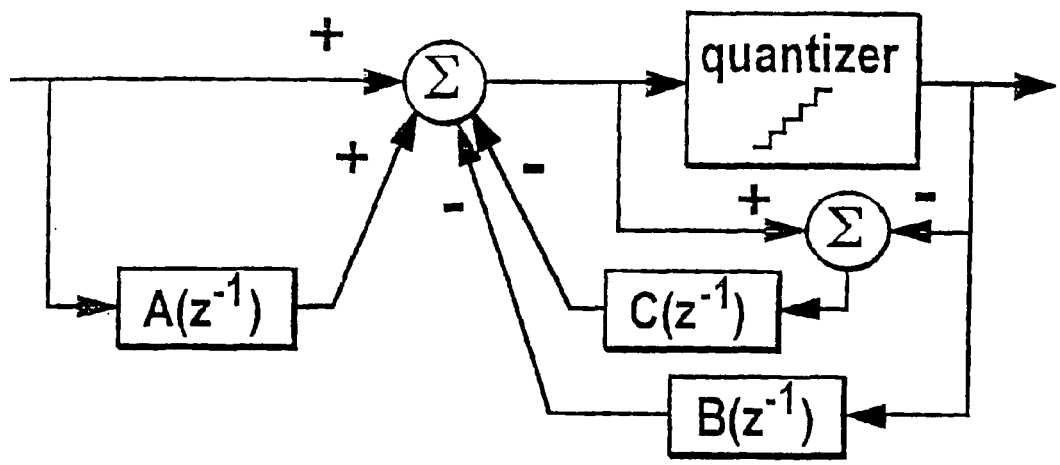
FIG. 10 shows a lossless predictor encoding and decoding system incorporating inner-form noise shaping around the quantizer according to the invention.

When used in the encoding system of FIG. 8a, giving the encoding system shown in FIG. 10a, the resulting output noise spectrum of the encoder due to the quantizer is $$\frac{1}{1+B(z^{-1})}(1+C(z^{-1}))$$

times that of a white spectrum. Thus if it is wished to minimise encoder output-quantization noise energy, $C(z^{-1})$ is best chosen to be the closest integer-valued approximation to $B(z^{-1})$ such that $1+C(z^{-1})$ is minimum phase.

Figure 10B:
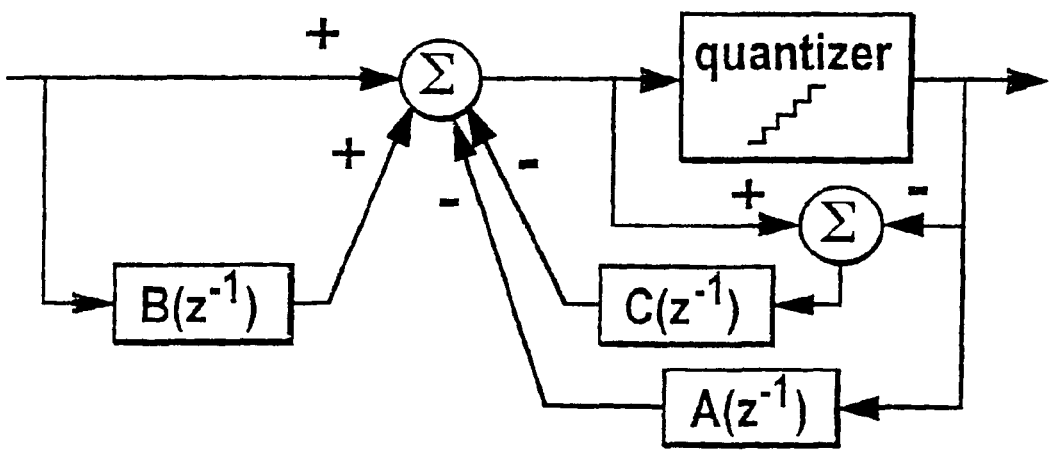

The inverse decoding system to the inner-form noise-shaped system of FIG. 10a is shown in FIG. 10b, and uses an identical noise shaper around the quantizer, but interchanges the filters $A(z^{-1})$ and $B(z^{-1})$, and uses a quantizer in the decoder equivalent to the encoding quantizer both preceded and followed by a gain of 1.

Figure 11A:
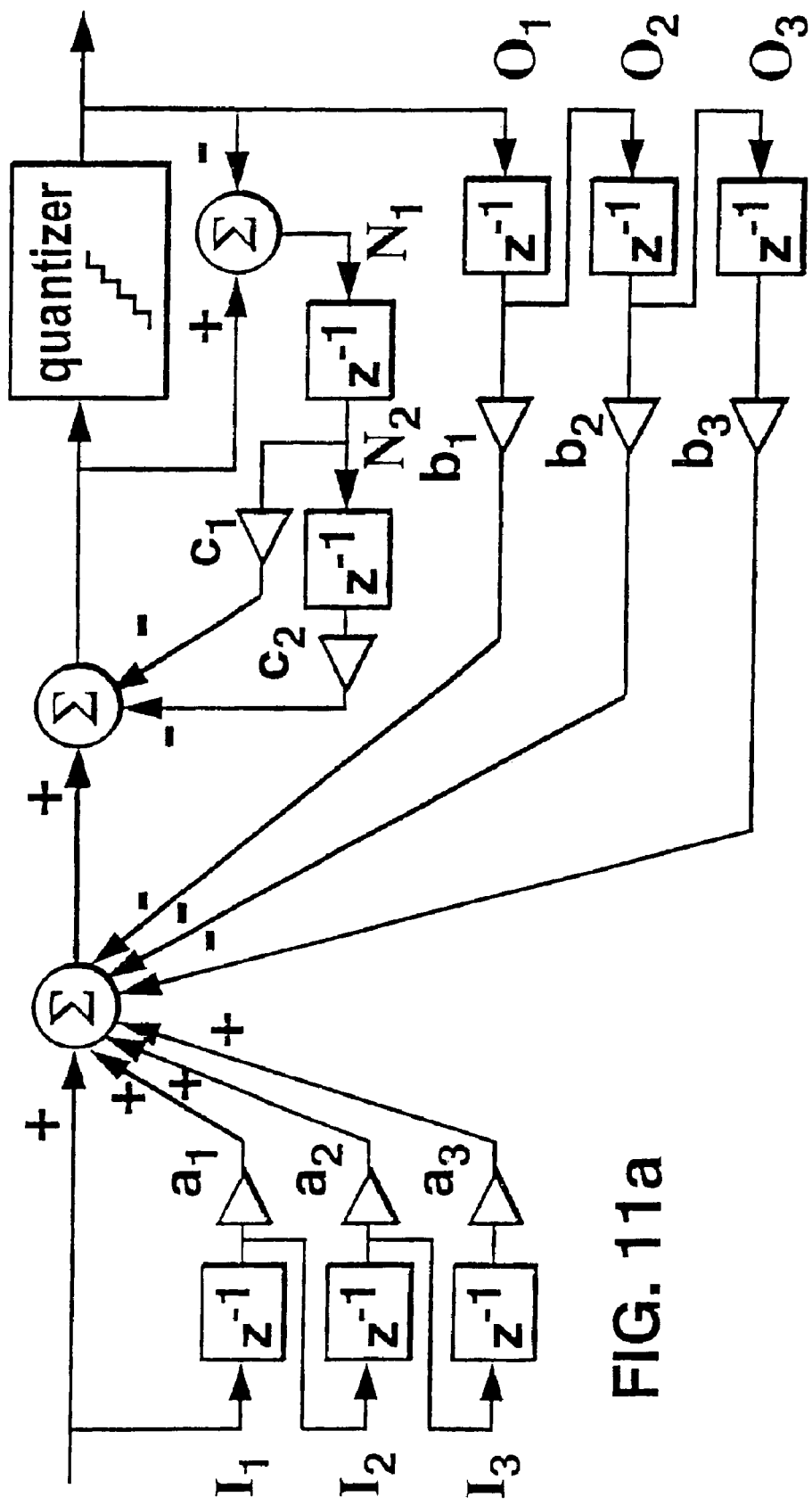
FIG. 11 shows a third order lossless predictor encoding and decoding system incorporating inner-form noise shaping around the quantizer according to the invention.
Figure 11B:
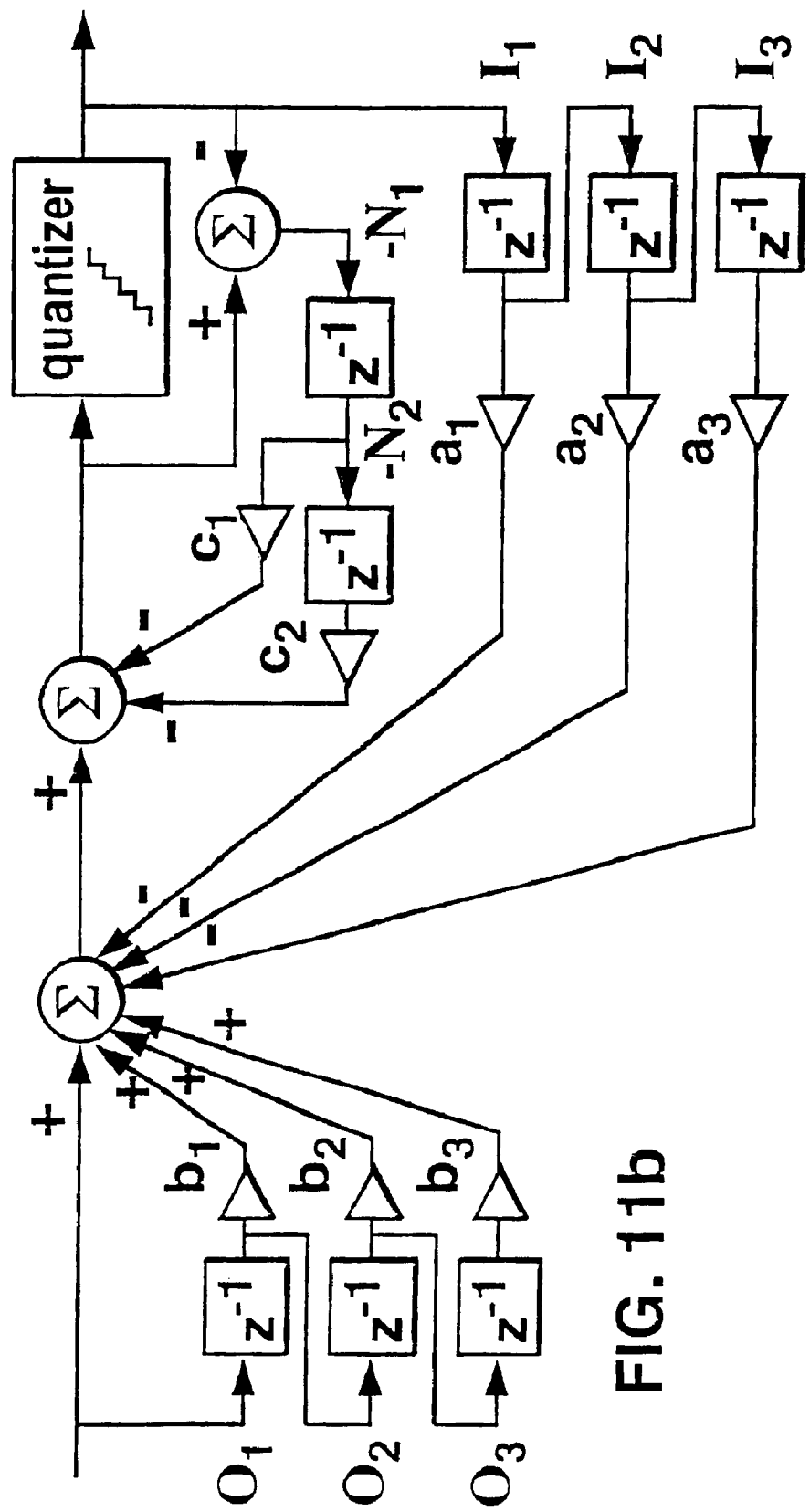

FIGS. 11a and 11b show by way of example a respective encoder and decoder for the case of the FIR filters $A(z^{-1})$ and $B(z^{-1})$ being third order and the FIR filter $C(z^{-1})$ being second order, with $$A(z^{-1})=a_1z^{-1}+a_2z^{-2}+a_3z^{-3}$$

$$B(z^{-1})=b_1z^{-1}+b_2z^{-2}+b_3z^{-3}$$

$$C(z^{-1})=c_1z^{-1}+c_2z^{-2}$$

where $a_1$, $a_2$, $a_3$, $b_1$, $b_2$, $b_3$, are all coefficients of the form m/d where d is a lowest common denominator integer and m is an integer numerator which may be different for each filter coefficient, and where $c_1$, $c_2$ are integers.

Figure 12:
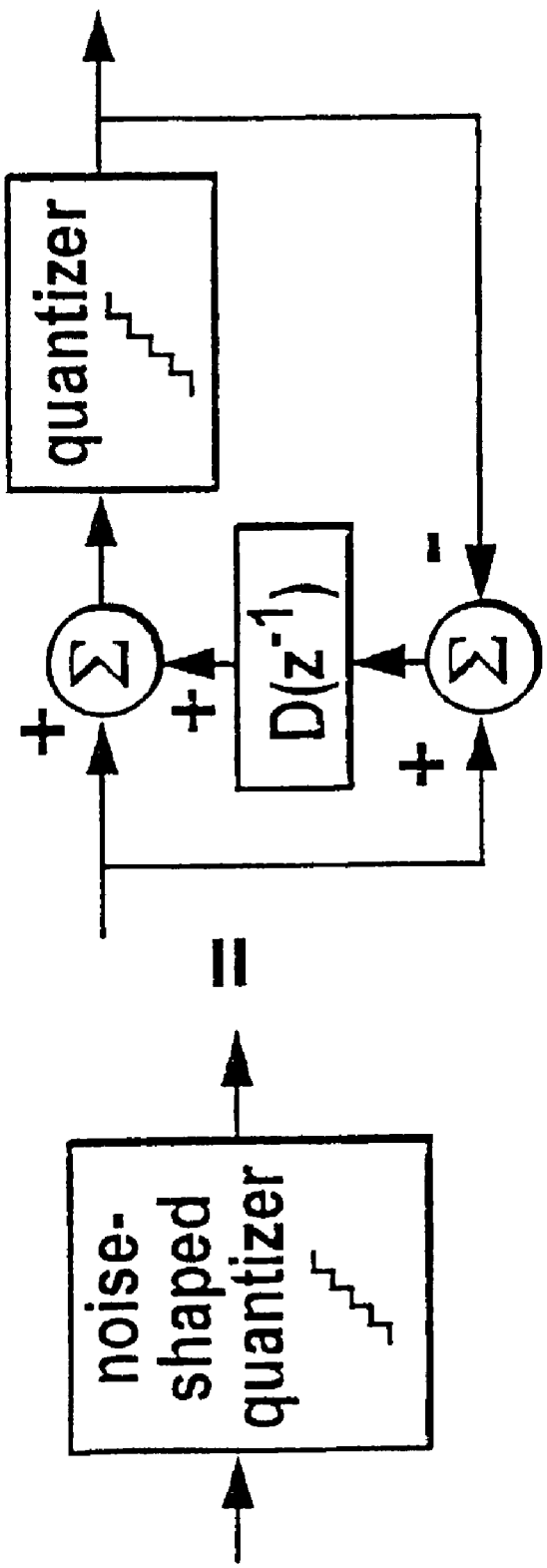
FIG. 12 shows an outer-form noise shaper around a quantizer.

Also shown in FIG. 12 are the state variables, which comprise three successive input values $I_1$, $I_2$, $I_3$, three successive output values $O_1$, $O_2$, $O_3$, of the encoder, and two state variables $N_1$, $N_2$ of the noise shaper, and the corresponding state variables in the decoder. Note the reversed sign of the noise shaper state variables in the decoder. For the fourth sample of the output of the decoder onwards, it is necessary to initialise the values of the state variables from which the fourth output sample is computed.

FIG. 12 shows the outer form of noise shaping around a quantizer. In such an outer-form noise shaper, the difference between the input and the output of the whole system around the quantizer is fed back to the input of the quantizer via an FIR filter $D(z^{-1})$, preferably such that $1+D(z^{-1})$ is minimum phase in order to minimise added noise energy.

In the present invention, the FIR filter $D(z^{-1})$ preferably has finite-precision rational coefficients with denominator d so that only finite-precision arithmetic is needed to implement the encoder and decoder exactly without any rounding errors. Such inner-form noise shapers have the effect of producing a quantization noise spectrum that is $$\frac{1}{1+D(z^{-1})}$$

times the approximately white spectrum of the basic quantizer.

When used in the encoding system of FIG. 8a, giving the encoding system shown in FIG. 13a, the resulting output noise spectrum of the encoder due to the quantizer is $$\frac{1}{(1+D(z^{-1}))(1+B(z^{-1}))}$$

times that of a white spectrum. Thus if it is wished to minimise encoder output quantization noise energy, $D(z^{-1})$ is best chosen to be such that $1+D(z^{-1})$ is minimum phase and such that $1+D(z^{-1})$ approximates the inverse of $1+B(z^{-1})$.

The inverse decoding system to the outer-form noise-shaped system of FIG. 13a is shown in FIG. 13b, and uses an identical noise shaper around the quantizer, but interchanges the filters $A(z^{-1})$ and $B(z^{-1})$, and uses a quantizer in the decoder equivalent to the encoding quantizer both preceded and followed by a gain of −1.

Figures 13C, 13D:
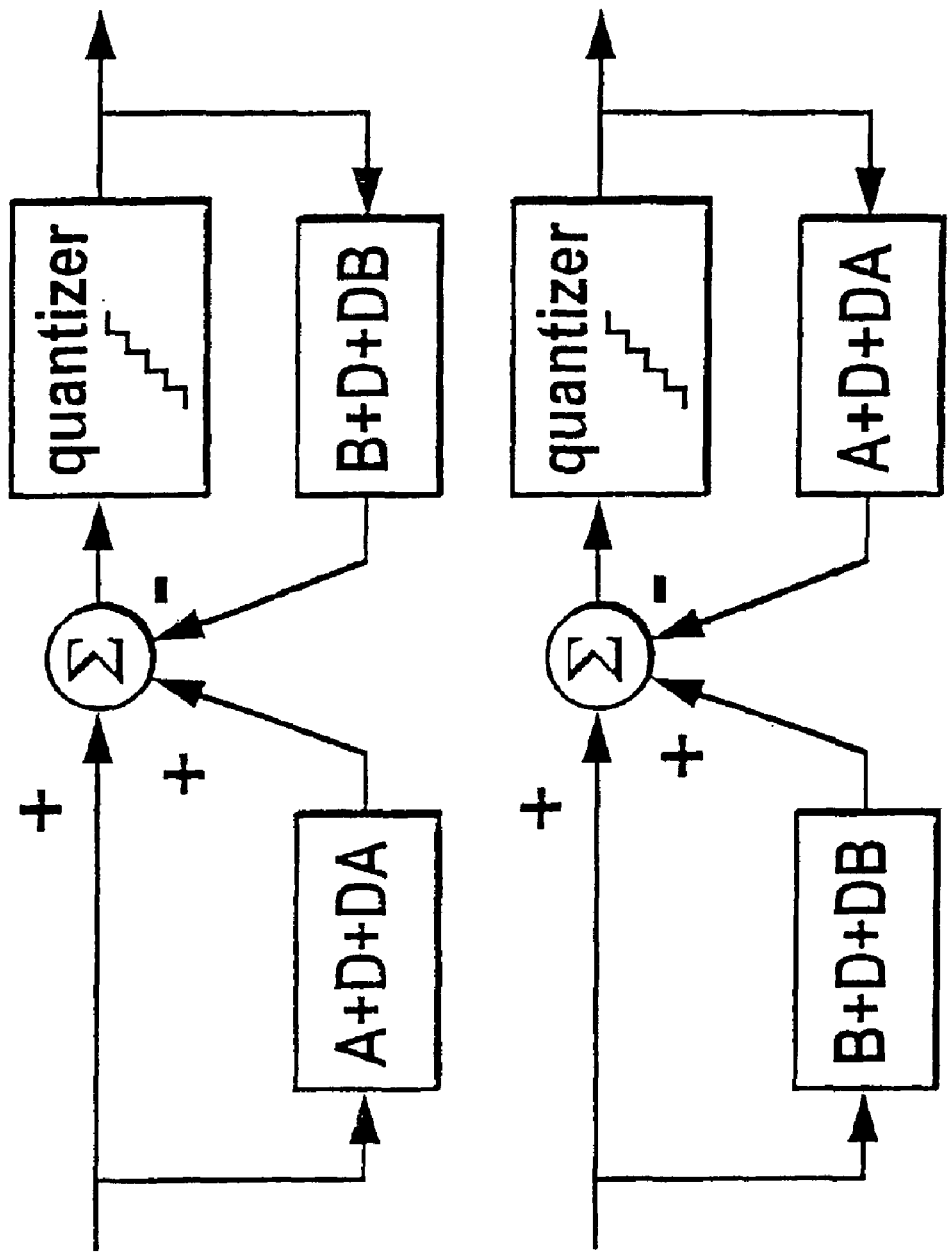
FIGS. 13c and 13d show a lossless predictor encoding and decoding system according to the invention equivalent to FIGS. 13a and 13b.

It can be shown that the encoding and decoding systems produced by using an outer-form noise shaping around the quantizer are functionally equivalent to the use of an encoding and decoding system without noise shaping provided that the filter $A(z^{-1})$ is replaced by $$A(z^{-1})+D(z^{-1})+D(z^{-1})A(z^{-1})$$

and that the filter $B(z^{-1})$ is replaced by $$B(z^{-1})+D(z^{-1})+D(z^{-1})B(z^{-1}),$$

as shown for the encoder and decoder in respective FIGS. 13c and 13d. However, the outer-form noise shaped implementations are generally simpler, since there is no duplication of the filter $D(z^{-1})$ within two separate filters.

Figure 14A:
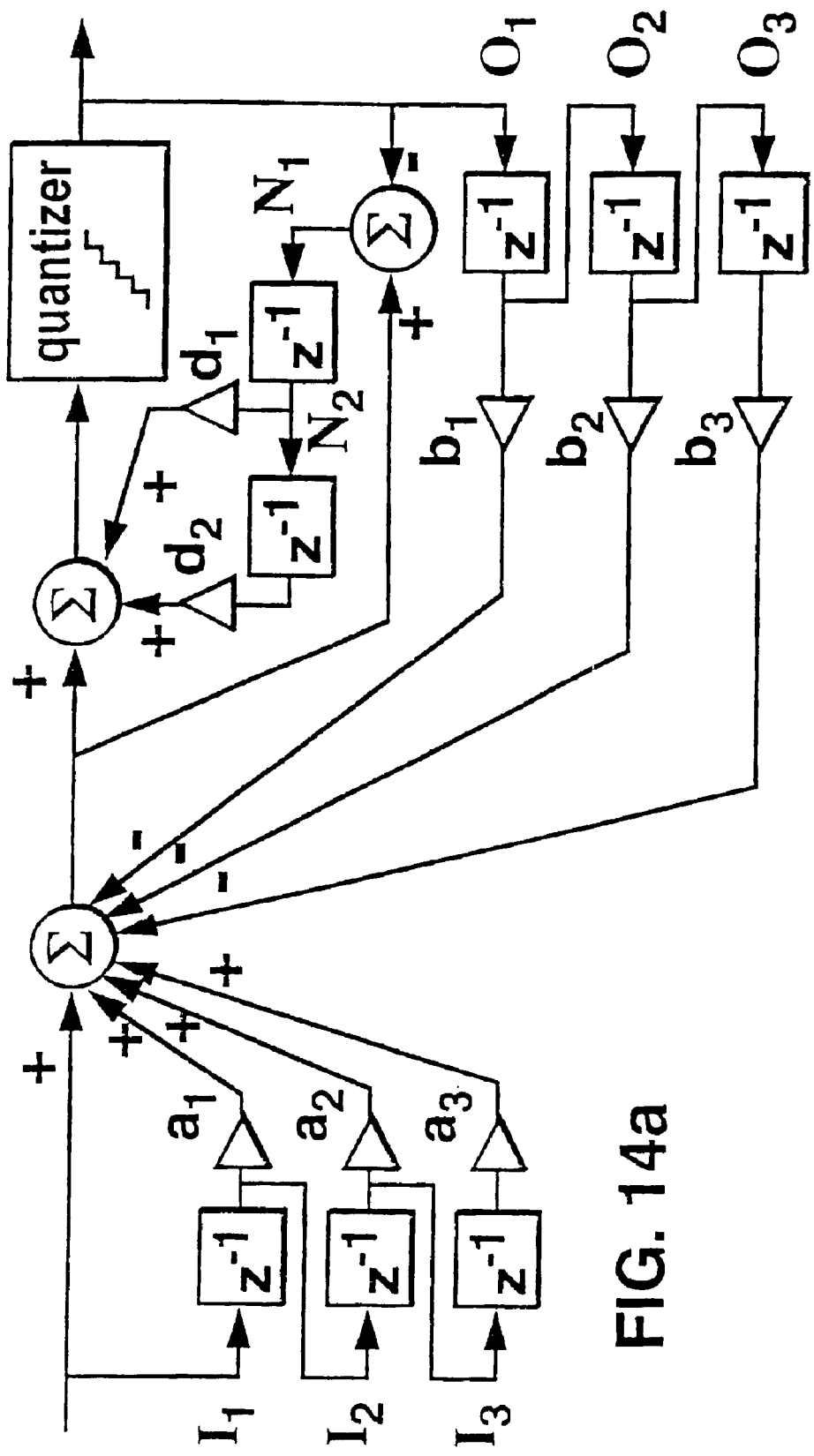
FIG. 14 shows a third order lossless predictor encoding and decoding system incorporating outer-form noise shaping around the quantizer according to the invention.
Figure 14B:
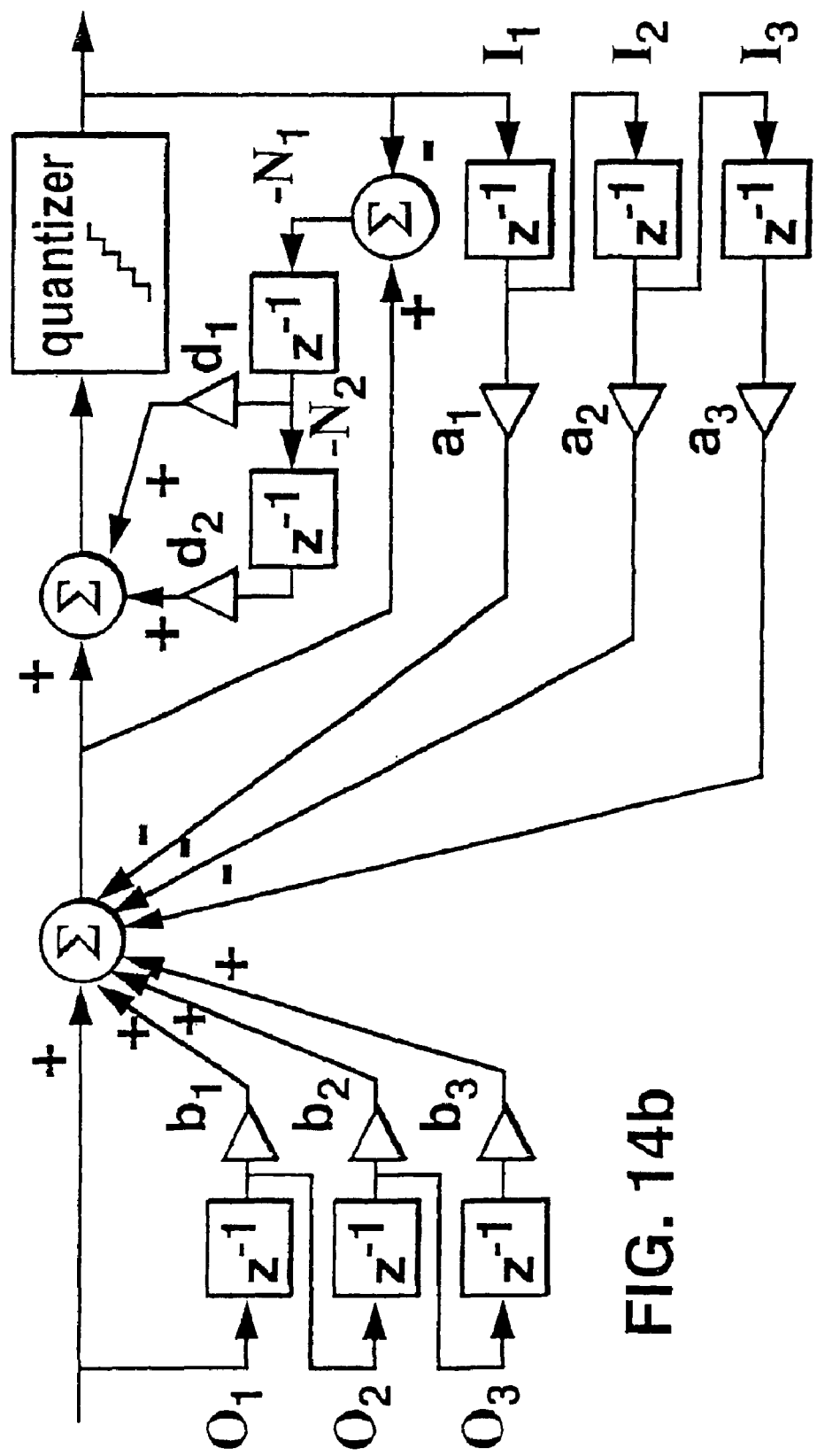

FIGS. 14a and 14b show by way of example a respective encoder and decoder using outer-form noise shaping for the case of the FIR filters $A(z^{-1})$ and $B(z^{-1})$ being third order and the FIR filter $D(z^{-1})$ being second order, with $$A(z^{-1})=a_1z^{-1}+a_2z^{-2}+a_3z^{-3}$$

$$B(z^{-1})=b_1z^{-1}+b_2z^{-2}+b_3z^{-3}$$

$$D(z^{-1})=d_1z^{-1}+d_2z^{-2}$$

where $a_1$, $a_2$, $a_3$, $b_1$, $b_2$, $b_3$, $d_1$, $d_2$, are all coefficients of the form m/d where d is a highest common denominator integer and m is an integer numerator which may be different for each filter coefficient.

Also shown in FIG. 14 are the state variables, which comprise three successive input values $I_1$, $I_2$, $I_3$, three successive output values $O_1$, $O_2$, $O_3$, of the encoder, and two state variables $N_1$, $N_2$ of the noise shaper, and the corresponding state variables in the decoder. Note the reversed sign of the noise shaper state variables in the decoder. For the fourth sample of the output of the decoder onwards, it is necessary to initialise the values of the state variables from which the fourth output sample is computed.

It is also possible to combine the use of an inner-form noise shaper with integer coefficients and an outer-form noise shaper with finite precision coefficients around a quantizer in the encoding and in the decoding system. This would have the effect of shaping the noise spectrum of the quantizer by $$\frac{1+C(z^{-1})}{1+D(z^{-1})}$$

This may be done by nesting inner-form and outer-form noise shapers around the quantizer. A description of nested noise shapers is to be found in section 1 of the above cited Gerzon, Craven, Stuart, Wilson reference.

More General Filtering

While it is preferred that the filters $A(z^{-1})$ and $B(z^{-1})$ be FIR with finite precision coefficients that are either exactly implemented or such that any rounding errors do not affect the output of the quantizer, such as for example described in connection with FIGS. 6e and 6f, the invention may conveniently be implemented in the case that the filters incorporate controlled rounding errors.

In particular, the filters $A(z^{-1})$ and/or $B(z^{-1})$ in the implementations shown in FIGS. 6, 8, 10 or 13 may for example be cascades of filtering subalgorithms, each of which may incorporate quantization of output levels with either an unity step size or a rational step size smaller than unity. This can be done by making each of the cascaded subalgorithms an FIR filter with finite precision coefficients followed by a quantizer, or even by making any or each of the cascaded subalgorithms individually have the form of a quantizing filter of the form shown in FIG. 6a with the two filters therein being FIR filters with finite precision coefficients. All such architectures for the filters $A(z^{-1})$ and $B(z^{-1})$ can be implemented with exact arithmetic that is transportable between different fixed-point DSP architectures.

In general, such architectures using cascades of quantized output filter subalgorithms for $A(z^{-1})$ and/or $B(z^{-1})$ have the disadvantage of increasing the total amount of quantization noise at the output of the encoder. They have the advantage, however, of allowing more complex filters $A(z^{-1})$ and $B(z^{-1})$ to be implemented by factorisation or use of recursive quantizing topologies without the precision of the arithmetic needing to be very high.

Figure 15A:
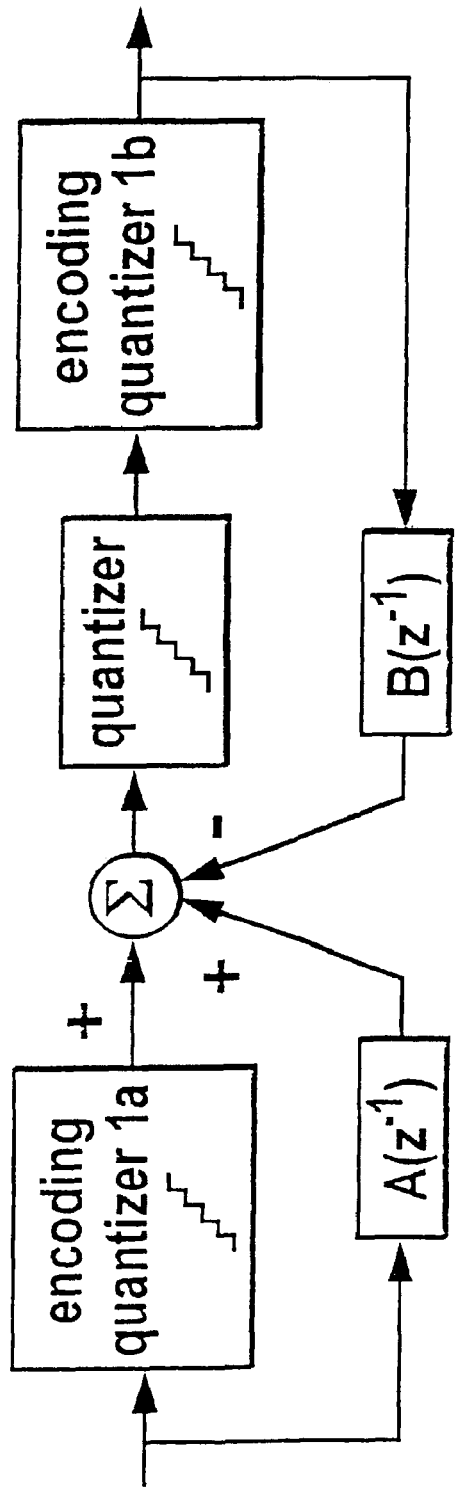
Figure 15B:
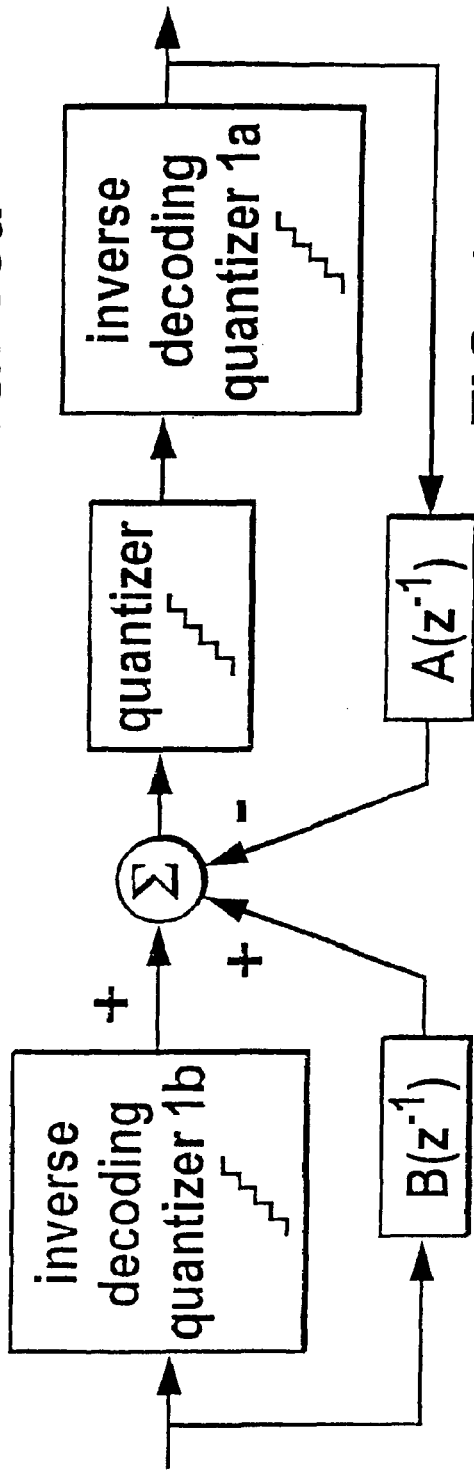

A more general topology still according to the invention is shown in FIG. 15a or 15c for the encoder and 15b or 15d for the inverse decoder. In this aspect of the invention, as shown in FIG. 15a or 15c, the encoder quantizer is followed by an encoding quantizer 1b which itself may be any lossless integer-valued encoding system having no input/output time delay, said encoding quantizer preceding the output, and the integer input feeds the summing node not directly but by an encoding quantizer 1a having no input/output time delay which itself may be any lossless integer-valued encoding system. The summing nodes are also fed with filters $A(z^{-1})$ and $B(z^{-1})$ as before. One or other of the encoding quantizers 1a or 1b, and their inverses, may be trivial in the sense of having no effect on the signal. In this aspect of the invention, as shown in FIG. 15b or 15d, the inverse decoder quantizer is followed by an inverse decoding quantizer 1a inverse to the encoding quantizer 1a used in the encoder, said inverse decoding quantizer preceding the output, and the integer input feeds the summing node not directly but by an inverse decoding quantizer 1b inverse to the encoding quantizer 1b. The summing nodes are also fed with filters A(z) and $B(z^{-1})$ as before. The quantizers used in the general implementations of FIGS. 15a to 15d may also incorporate noise shaping provided that identical noise shaping is used in the encoding and the inverse decoding.

Encoding and decoding filters with fractional quantizers

A problem with the encoding and decoding filters described above is that the quantizer noise produced by the filters can be very high if the desired filters are of high order and have relatively high Q. In extreme cases, this can cause the transmitted quantizer noise to be of such extreme amplitudes that it swamps the desired coded signal amplitude, giving very high data rates. In normal digital filter design, one reduces quantization noise effects by two strategies: using a smaller quantization step size. i.e. effectively working at increased precision, and by implementing a high order filter as cascaded "biquad" (second order) sections. We here describe with reference to FIGS. 16 and 17 an extension of the above-described encoder/decoder filter strategies that permits a similar aim to be achieved in lossless encoding and decoding in order to prevent excessive quantizer noise in the prediction-encoded waveform signal.

In FIGS. 16 and 17, the quantizers all have uniform quantization step size, with the step size being indicated in the lower right corner of the quantizer blocks.

FIG. 16a shows an invertible filter transformation from integer-valued to integer-valued waveform signals that may be used either as a lossless encoder or a lossless decoder. For simplicity of description, we shall refer to this as the original transformation system and an inverse respective decoder or encoder as the inverse transformation system. FIG. 16a accepts as input an integer-valued PCM waveform signal and feeds it both directly and via a filter $A(z^{-1})$ with at least one sample delay to a summing node that feeds a first quantizer, whose output feeds a second filter $B(z^{-1})$ with at least one sample delay to be subtracted at the summing node, the output of the first quantizer feeding a second quantizer which is an integer quantizer (i.e. with step size 1) to provide the output integer waveform signal. Clearly, if the first quantizer is an integer quantizer, this is the same as the system described with respect to FIG. 6a or 6b, the second quantizer then being superfluous.

However, in FIG. 16a, the first quantizer is arranged to have a step size 1/G for integer G, i.e. a step size that divided exactly the integer step size. This smaller step size means that the quantization noise produced by the quantizing filter system is proportionally smaller, with integer values being restored only by the second quantizer at the output.

To see that this transformation shown in FIG. 16a is indeed invertible, note that because the integer-valued input signal has step size that is an integer multiple of the step size of the first quantizer, equivalent results can be obtained by instead adding the input signal not at the summing node but at the output of the first quantizer, and this in turn is equivalent to adding it both at the input to the second quantizer and at the input to the filter $B(z^{-1})$. Thus the system of FIG. 16a is equivalent to the system shown in FIG. 16b, where the feedforward sidechain filter A' $(z^{-1})$ has the form shown in FIG. 16c.

Figure 16D:
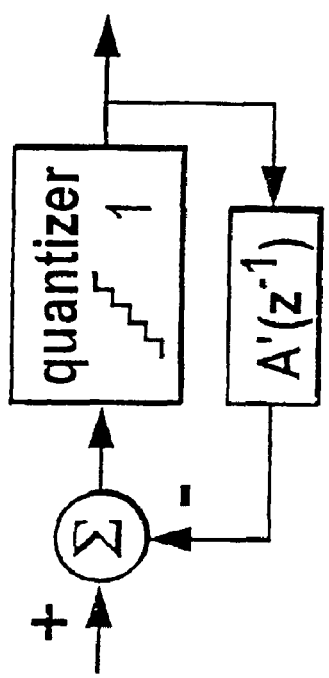
FIGS. 16 show lossless encoding and inverse decoding systems using a fractional quantizer according to the invention.
Figure 16E:
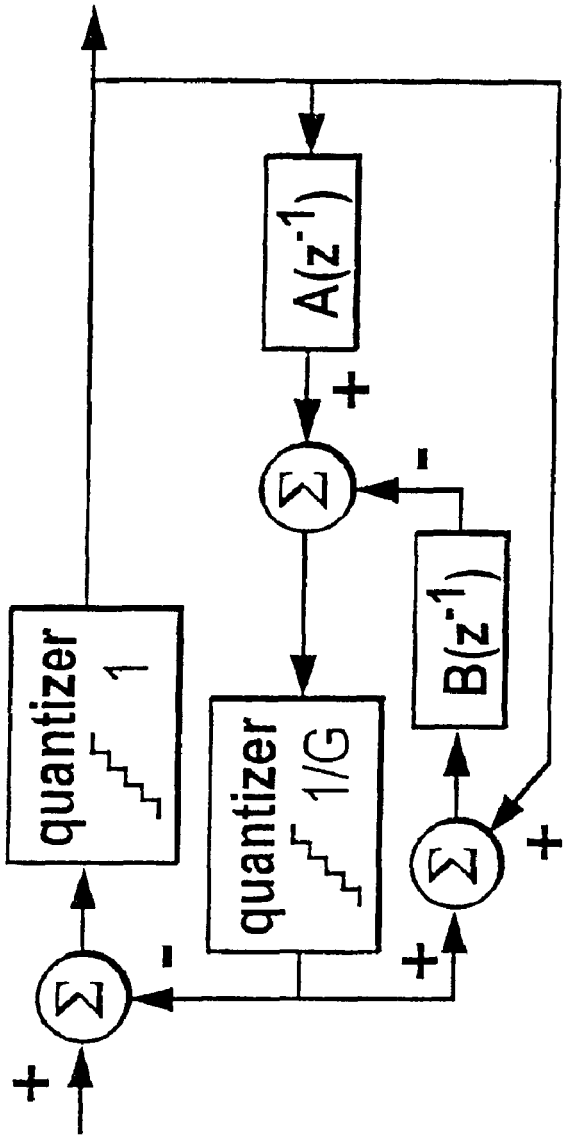
Figure 16F:
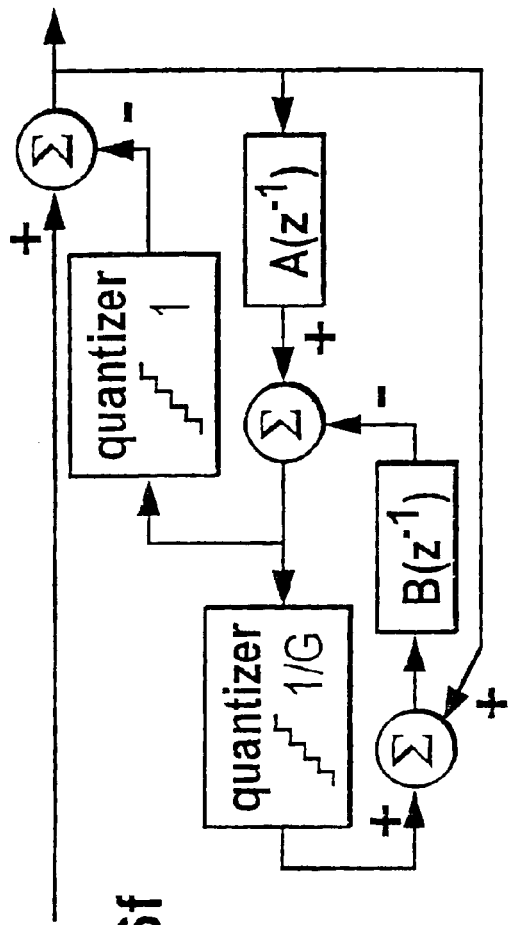
Figure 16G:
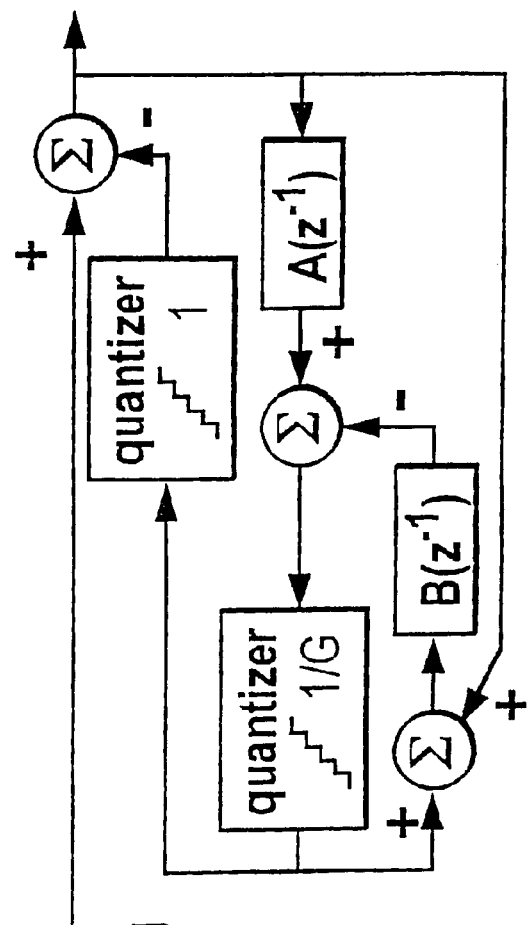
Figure 16H:
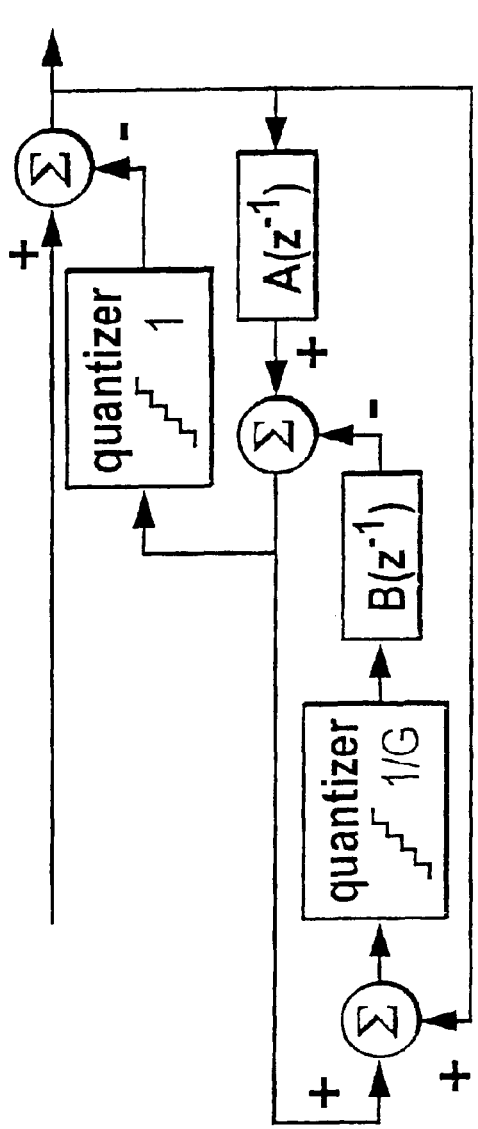
Figure 16I:
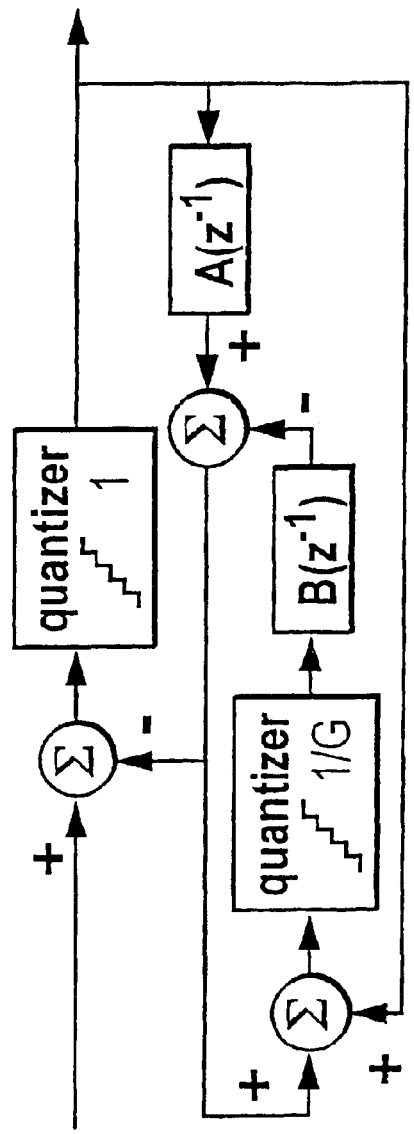

The inverse system to FIG. 16b exists and has the form with feedback sidechain filter A' $(z^{-1})$ shown in FIG. 16d. Therefore, the inverse to FIG. 16a can be implemented as shown in FIG. 16e. The step-size 1 quantizer in FIG. 16e is equivalent to that in FIG. 16a both preceded and followed by a polarity inversion. FIGS. 16f, 16g, 16h and 16i are alternative functionally equivalent forms of the system inverse to FIG. 16a, where the quantizers in FIGS. 16f, 16g and 16h are identical to those in FIG. 16a and where the step 1 quantizer in FIG. 16i is equivalent to the quantizer of FIG. 16a both preceded and followed by a polarity inversion. The functional equivalence of the alternative forms of FIGS. 16e to 16i arises from noting and using the following observations:

(1) the output of a second quantizer with a second step size that is an integer multiple of a first step size is unchanged whether the second quantizer is fed with the input to or the output of a first quantizer with the first step size.

This establishes the functional equivalence of FIG. 16f to 16g.

(2) If a summing or differencing node is fed by two signals one of which is quantized with a second step size that is an integer multiple of a first step size, then the results of putting a quantizer with the first step size in the other signal path feeding the node is equivalent to putting the same quantizer after the node (preceded and followed by a polarity inversion if before the node it feeds a subtraction in the node.) This establishes the functional equivalence of FIGS. 16e to 16f, and of FIGS. 16g to 16h and 16i.

(3) Moreover the above observation (2) still applies if the quantizer is equipped with noise shaping, which may be of inner form and/or of outer form.

Using these three observations, a wide range of rearrangements of the encoders and decoders of the invention may be made without any change of functional performance, and the examples of FIGS. 16e to 16i are only by way of example. The same observations may also be applied to showing that the original system of FIG. 16a is functionally equivalent to FIGS. 16j and 16k.

In the case where either or both the quantizers incorporate noise shaping, then these observations and arguments may be used to show that FIGS. 16e and 16g are functionally equivalent and are both inverse to FIG. 16a or 16j, which are also functionally equivalent. FIGS. 16f, 16h and 16i are functionally equivalent, and are inverse to the system of FIG. 16k when noise shaping is used around the quantizers.

The practical benefit of using fractional quantization step size in lossless encoding and decoding filters is most evident when several filter sections are cascaded. These sections may be typically be second order (biquad) or first order (bilinear) sections with the A and B filters being first or second order FIR filters with finite-precision coefficients, and having at least one sample delay. In applications, these filters will usually and preferably be exactly implemented or implemented with rounding errors sufficiently small that the rounding errors make no difference to the outputs of quantizers in the encoder and decoder. The normal techniques used in filter design of synthesising a complex desired filter characteristic as cascaded biquads and bilinear sections may be used, using small internal quantizer step sizes to minimise quantization noise energy.

An example of a complex encoding or decoding filter to which a cascaded biquad implementation using fractional arithmetic may be particularly applied is to filters having "brickwall" boost or cut with a very rapid transition between the high-gain and low-gain frequency bands. Such filter are adapted to provide good encoding and decoding of signals having restricted bandwidth, the encoder boosting the bands with little energy, and cutting the rest of the band greatly, and the decoder doing the inverse job. Recursive filters having such brickwall rapid transition characteristics tend to be of high order, often of order 8, and are conveniently implemented as a cascade of four biquad sections which may be designed using standard filter design packages such as that in MATLAB. The individual biquad sections tend to have very high Q and tend to amplify any quantization noise in the filter implementation.

FIG. 17 shows the case of two cascaded stages with fractional filter quantizer step sizes dividing the integer input and output step size by integer factors. FIG. 17a shows an invertible filter transformation from integer-valued to integer-valued waveform signals that may be used either as a lossless encoder or a lossless decoder. For simplicity of description, we shall refer to this as the original transformation system and an inverse respective decoder or encoder as the inverse transformation system. The system of FIG. 17a shows two cascaded filter quantization stages with feedforward filter sidechain $A_i(z^{-1})$ and feedback filter sidechain $B_i(z^{-1})$ around a quantizer with step size $1/G_i$ where $G_i$ is an integer, for i=1, 2 for the first and second stage of the cascade, with an output quantizer with step size 1 at the output of the cascade. As before, this can be rearranged by moving the summing node for the integer-valued input signal to the other sides of the fractional-step quantizers one by one to obtain a form equivalent to that of FIG. 17b, where the feedforward sidechain filter system A' $(z^{-1})$ has the form shown in FIG. 17c.

Figure 17C:
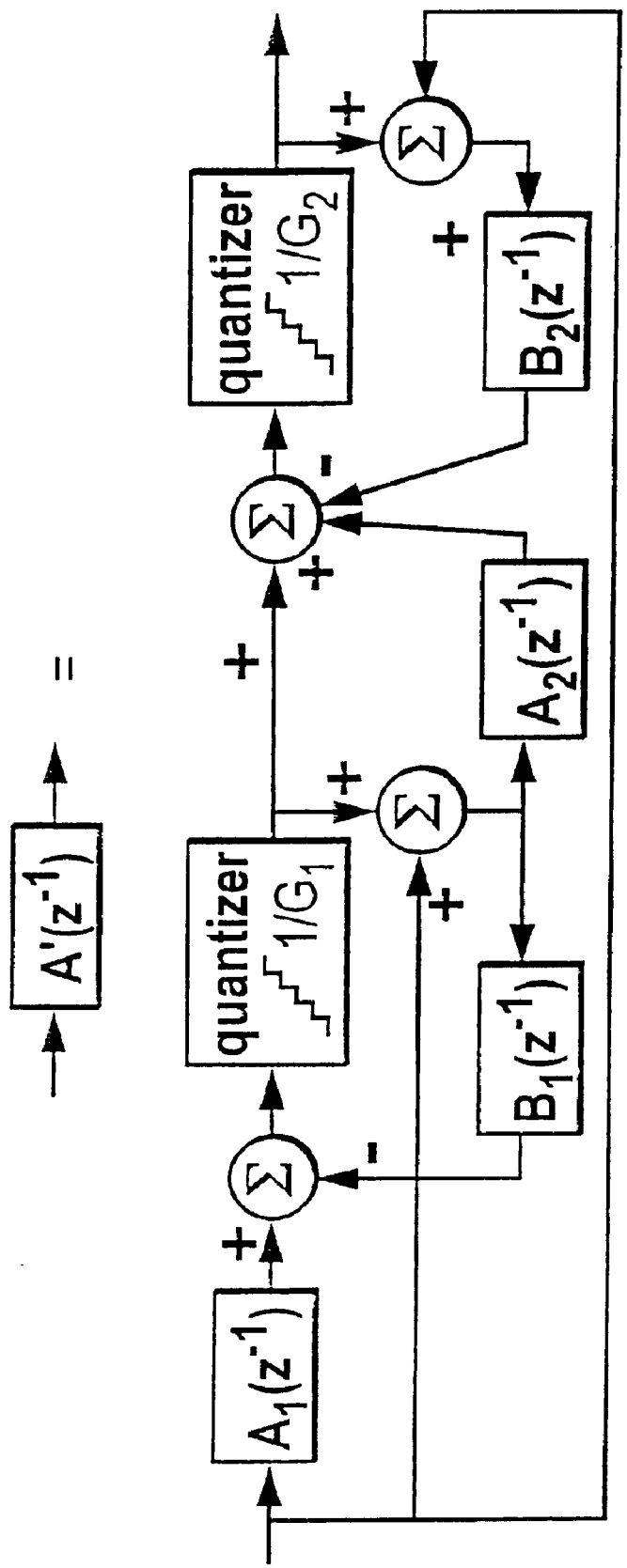
FIGS. 17 show lossless encoding and inverse cascaded decoding systems using fractional quantizers according to the invention.
Figure 17H:
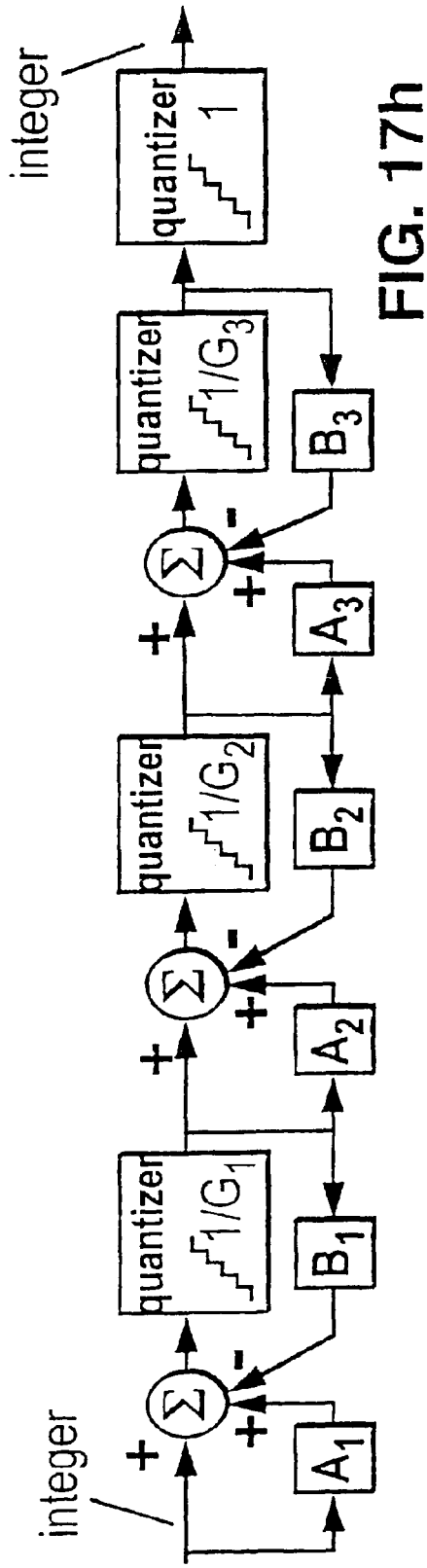
Figure 17I:
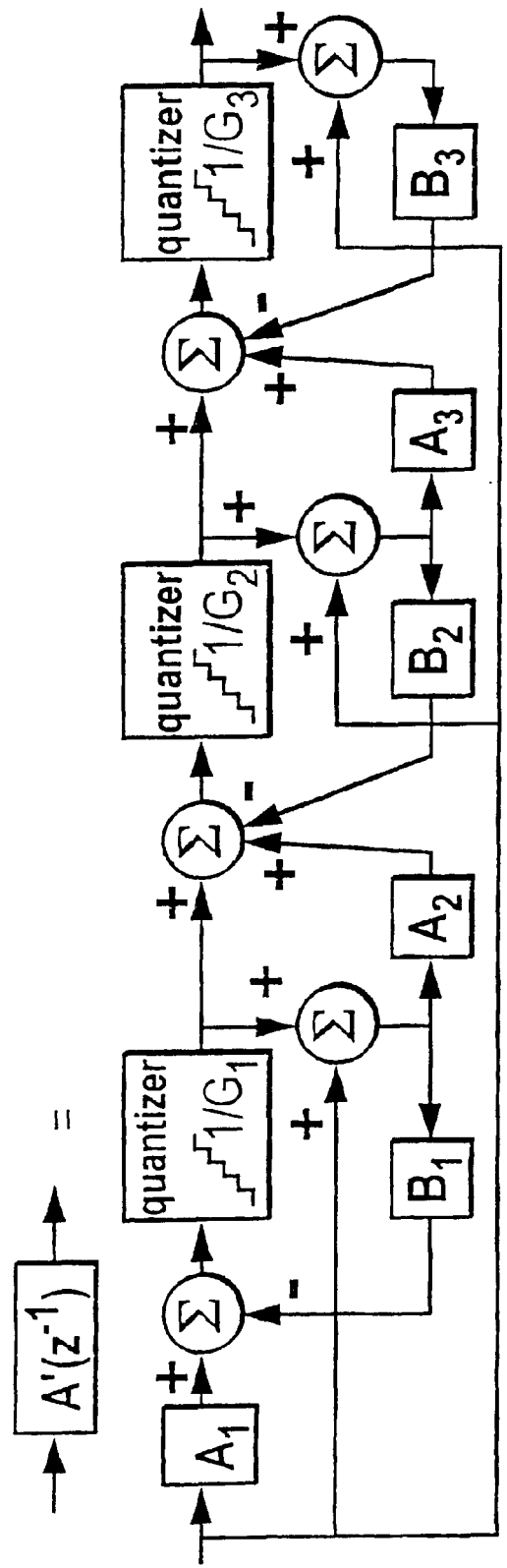

It will be noted in particular that the input signal in the sidechain filter A' $(z^{-1})$ of FIG. 17c feeds the system only via a time delay of at least one sample, so that the filter A' $(z^{-1})$ can be used in recursive feedback loops. The inverse to the original system can be implemented as shown in FIG. 17d, where the step-size 1 quantizer is equivalent to the quantizer in the original system of FIG. 17a both preceded and followed by a polarity inversion. The full realisation of this inverse to FIG. 17a is shown in FIG. 17e. In the encoding and decoding system, any or all quantizers may incorporate noise shaping providing this is matched in the encoder and decoder. The generalisation to the case of any number n of cascaded stages, each with feedforward filter sidechain $A_i(z^{-1})$ and feedback filter sidechain $B_i(z^{-1})$ around a quantizer with step size $1/G_i$ where $G_i$ is an integer, for i=1, 2, . . . , n is also obvious. In many practical implementations, it may be convenient to use the same step size in all filter stages, but this is not required.

An alternative cascaded architecture for the original system is shown in FIG. 17f. Using the observations (1) to (3) above, this is seen to be functionally equivalent to the system of FIG. 17 a provided that $G_1$ divides $G_2$. Whether on not this is the case, the sidechain form of FIG. 17b of FIG. 17f has a sidechain A' $(z^{-1})$ having the form shown in FIG. 17g. If this sidechain is implemented in FIG. 17d as a feedback sidechain around a unit step size quantizer as shown in FIG. 17d, then it implements the system inverse to the cascaded system of FIG. 17f.

These examples can be generalised in a way that is evident and obvious to any number n of cascaded stages. The case with three cascades is shown by way of example in FIG. 17h with the sidechain filter A' $(z^{-1})$ in FIG. 17i.

It is also possible to mix cascaded stages of the forms shown in FIGS. 17a and 17f in the original system, and such mixed forms will then occur in the sidechain filter A' $(z^{-1})$ and in the inverse form of FIG. 17d.

The sidechain filter A' $(z^{-1})$ of FIG. 16c or 17c or 17g or 17i does not have one of the standard filter architectures that would normally be used by one skilled in the art to implement filtering in a recursive feedback loop of the form of FIG. 17d, but has a particular and unusual form adapted for use in the invention. This form omits a direct cascade path between the input and output but instead takes the input and feeds it to a summing node before all but the first of the feedforward filters $A_i$ $(z^{-1})$ and all the feedback filters $B_i(z^{-1})$ and puts this modified cascade within a feedback loop around the unit-step quantizer.

Noise shaping may be used around any or all of the quantizers provided that the noise shaping is matched in the encoder and decoder. This may often be preferred either to further control the level of quantizing noise in the filters or to provide an optimum noise shaping characteristic either to minimise the data rate at low signal levels of the prediction-coded waveform signal or to improve the stability in recovering from data errors or wrong initialisation of the decoder.

Initialisation of the decoder is as usual provided in the fractional quantization case provided at the start of a block of samples by transmitting from the encoder to the decoder the state variables stored in the delays of the FIR filters $A_i(z^{-1})$ and $B_i(z^{-1})$—note in general that in FIGS. 17a, 17c, 17e 17f, 17g, 17h, 17i that $A_{+1}(z^{-1})$ and $B_i(z^{-1})$ share the same state variables for i=1, and that this generalises to cascades of arbitrary length n for i=1 to n1. Also note that the state variables have different numerical precisions in this case, with for example the output state variables of FIG. 17a having numerical precision a factor $G_2$ times greater than the actual output of the system of FIG. 17a due to the final quantizing step size. The output state variables of FIG. 17f similarly has numerical precision a factor least common multiple of $G_1$ and $G_2$ times greater than the actual output of the system of FIG. 17f. Therefore, in general, the use of fractional quantization will increase the wordlength of initialisation data.

In the case of four cascaded biquad filters such as may be used for brickwall filtering for efficient lossless coding of bandlimited signals, in general one has to transmit from encoder to decoder eight initialisation data samples of increased precision, over and above the prediction-encoded waveform data for the block. However, as noted below, it may be possible to economise on the transmission of initialisation data in a variety of circumstances.

Such a cascaded biquad system for encoding or decoding also requires the transmission of 16 filter coefficients (plus coefficients for any noise shapers used), and for accurate implementation of something like a brickwall filter these may require relatively high precision. In such a case, to economise on the transmission of large amounts of extra data, it may be advisable to download from encoder to decoder a table of pre-determined commonly used encoding filter coefficient sets, and then simply to transmit a table number to be used in the decoder's look up table.

The inverse recursive form of the cascaded architecture shown with reference to FIG. 17*d* is preferred for use as a decoder and the original direct cascade as an encoder when it is preferred that quantization noise added in the prediction-encoded signal have a white spectrum so as to minimise any increase of data rate for low level input signals. On the other hand, for the best recovery from data errors and incorrect initialisation in the decoder, the inverse recursive form of the cascaded architecture shown with reference to FIG. 17*d* is preferred for use as an encoder and the original direct cascade as a decoder.

Both the original and the inverse recursive sidechain forms can be used to represent cascaded filters if one ignores the internal quantization noise, the direct form representing the filter $$\frac{1}{1+B_n(z^{-1})}(1+A_n(z^{-1}))\frac{1}{1+B_{n-1}(z^{-1})}(1+A_n(z^{-1}))\cdots$$

$$\frac{1}{1+B_1(z^{-1})}(1+A_1(z^{-1}))$$

and the inverse recursive sidechain form representing a filter $$\frac{1}{1+A_1(z^{-1})}(1+B_1(z^{-1}))\frac{1}{1+A_2(z^{-1})}(1+B_2(z^{-1}))\cdots$$

$$\frac{1}{1+A_n(z^{-1})}(1+B_n(z^{-1}))$$

Figure 17J:
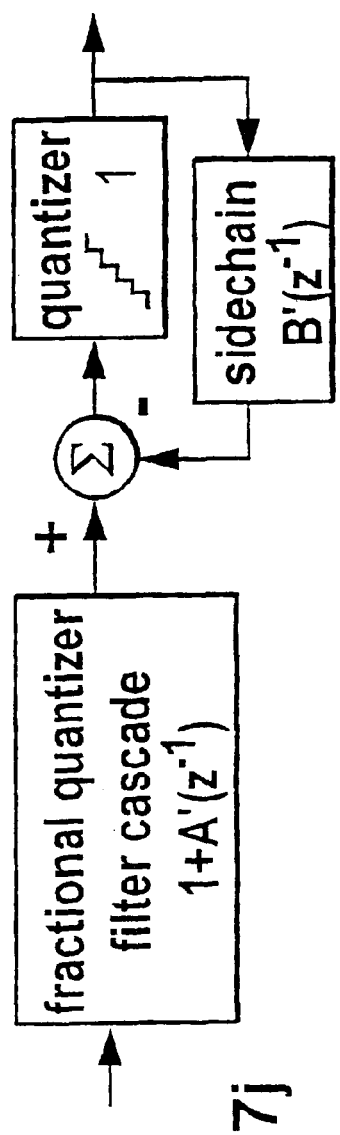
Figure 17K:
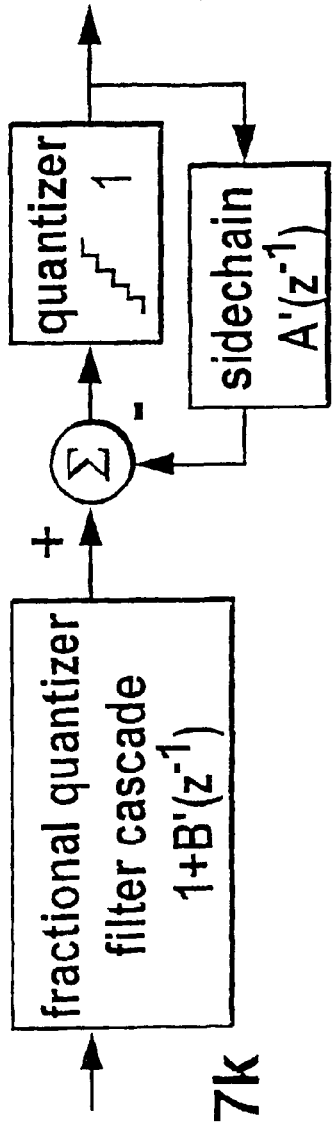
Figure 17L:
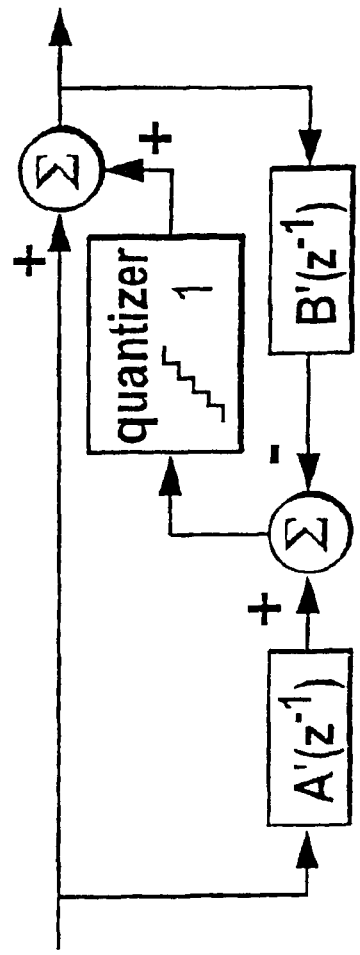

It is also possible to combine both forms in a single encoder and inverse decoder as shown with reference to FIGS. 17*j* to 17*l*. In FIG. 17*j*, the first part of the cascade of fractional-step quantizer filters is implemented in a direct or original form such as the cascades shown in FIG. 17*a* or 17*f* or 17*h* before the unit step quantizer, and the second part of the cascade is implemented with the recursive sidechain form around a unit step quantizer with sidechain filter B' ($z^{-1}$) having the form without direct undelayed path such as shown in FIG. 16*c* or 17*c* or 17*g* or 17*i*. The inverse decoder has the same architecture as shown in FIG. 17*k*, except that now the initial cascade of fractional-step quantizer filters is based on B' ($z^{-1}$) and the recursive sidechain is based on A' ($z^{-1}$). The unit-step quantizer in FIG. 17*k* is equivalent to that in FIG. 17*l* both preceded and followed by a polarity inversion. By analogy with FIG. 6 there are other forms equivalent to FIGS. 17*j* and 17*k*. For example that shown in FIG. 17*l* is equivalent to FIG. 17*j*.

The implementations of the encoding and decoding system may be rearranged and varied using observations (1) to (3) above by one skilled in the art without departing from functionally equivalent forms of the invention.

Entropy Coding OF Losslessy Prediction-Encoded Data

By way of example of a typical implementation of the invention, we now describe with reference to FIG. 18 a lossless coding system based on use of a lossless encoder filter arrangement followed by a Huffman coding entropy coder for the encoding, and an inverse Huffman decoder followed by a lossless decoder filtering arrangement, as indicated in broad outline in the schematics of FIGS. 3 and 4.

In this example of an encoding and system, such as may be used to encode high quality audio PCM waveforms at sampling rates between 44.1 and 96 kHz, the signal is first divided into blocks of length L samples which we choose by way of example to be L=576. Each block is encoded and decoded separately.

Figure 18A:
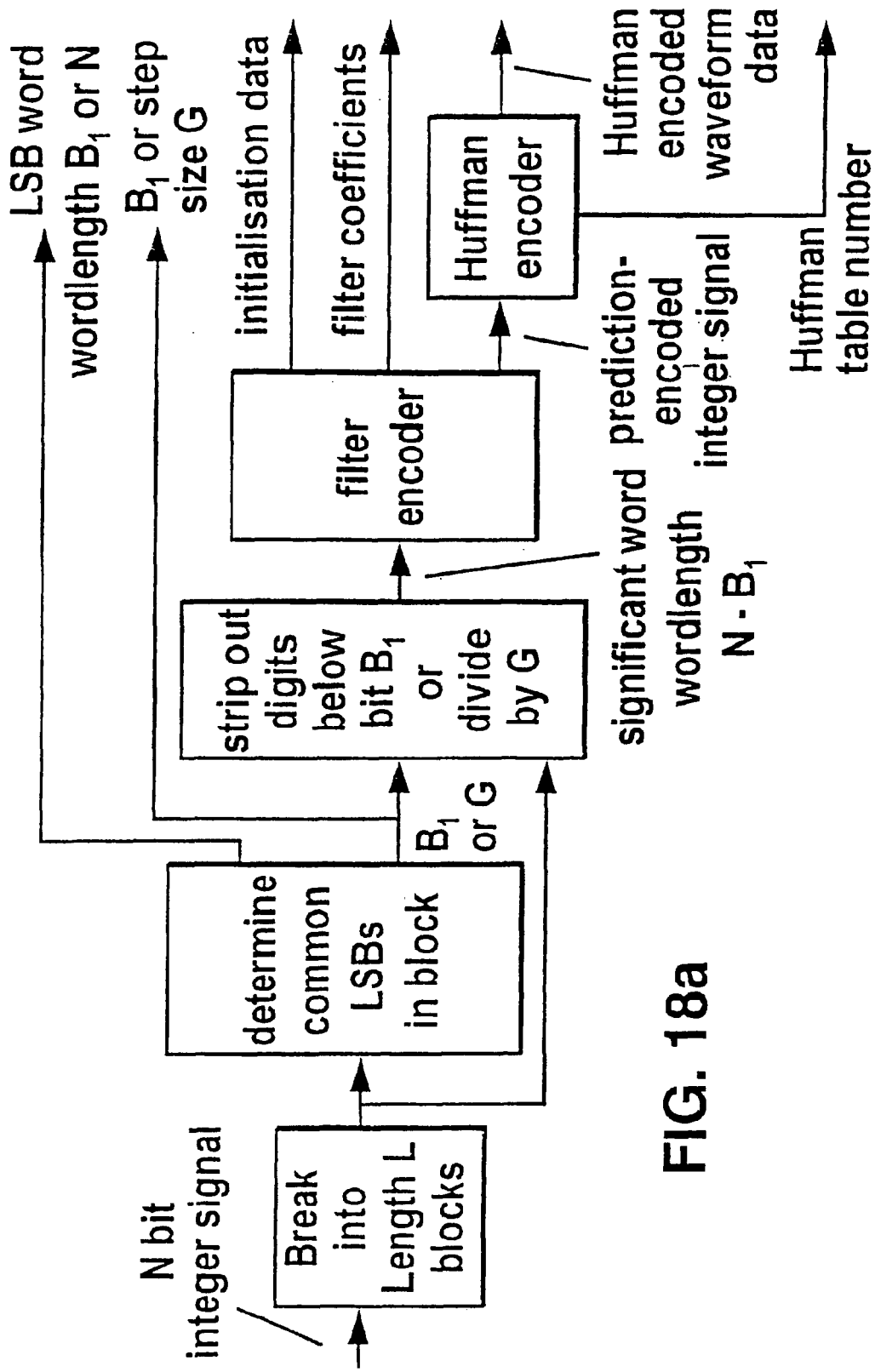
FIGS. 18a and 18b show respectively a schematic of an overall lossless encoding and decoding system for high quality audio applications.
Figure 18B:
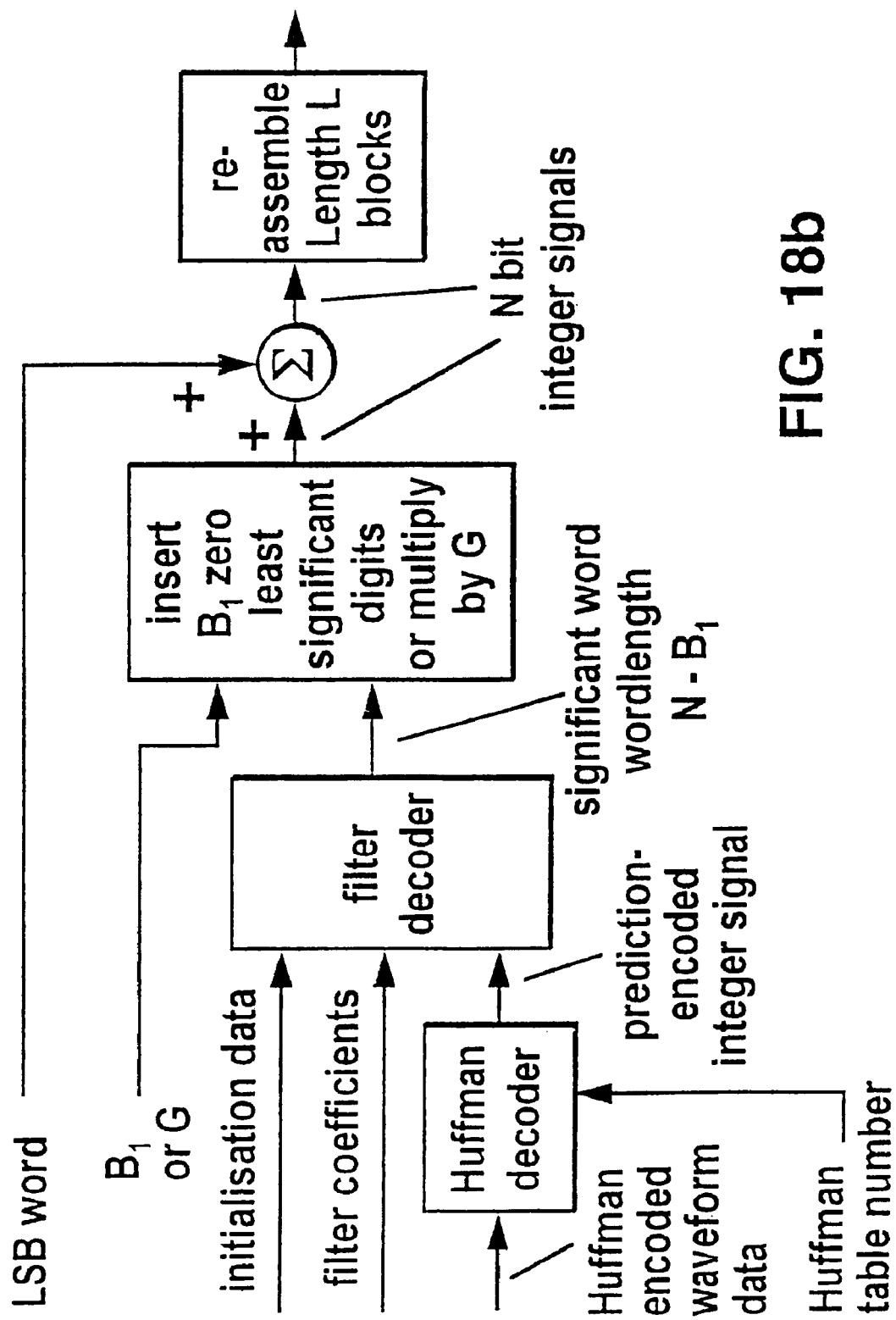

The overall schematic of the lossless encoding system described here is shown in FIG. 18*a* and of the lossless decoding system described here in FIG. 18*b*. In the examples described, we assume that we use encoding and decoding filters of third order and that optional second order integer inner-form noise shaping is also used, as described above with reference to FIG. 11, or that optional second order integer outer-form noise shaping is also used, as described above with reference to FIG. 14.

The transmitted information for each block will comprise two components, firstly header data which transmits to the decoder all information necessary for the decode to decode the encoded data correctly, and secondly Huffman encoded waveform data which comprises data representing the integer-valued output of the encoder filter system illustrated in FIG. 11*a* or FIG. 14*a*.

In order to minimise total data rate, it is of course important to ensure that the amount of data transmitted as "overheads" in the header data is kept small as a proportion of the data in the Huffman coded waveform data.

The header data includes the eight coefficients $a_1$, $a_2$, $a_3$, $b_1$, $b_2$, $b_3$, $c_1$, $c_2$ (or $d_1$, $d_2$) of the filter and noise shaper. Typically, these six coefficients $a_1$, $a_2$, $a_3$, $b_1$, $b_2$, $b_3$, will all be of the form m/16 or m/64 with integer m, in order to be of finite precision and in order to reduces data overheads for transmission. Taking the m/64 case by way of example the coefficients $a_1$, $a_2$, $a_3$, $b_1$, $b_2$, $b_3$, will typically have respective ranges of values in order to implement all minimum phase filters $-192 \leq 64a_1 \leq 192$ $-192 \leq 64a_2 \leq 192$ $-64 \leq 64a_3 \leq 64$ $-192 \leq 64b_1 \leq 192$ $-192 \leq 64b_2 \leq 192$ $-64 \leq 64b_3 \leq 64$ which requires 50 bits of overhead data to transmit.

If the m/16 case had been taken instead, only 38 bits of overhead data would be required to transmit the 6 filter coefficient values. It is also possible to have some coefficients of the form say m/64 and others of the form m/32 or m/16. Some of the sets of coefficient values allowed result in an unstable encoding filter, and use of these should be avoided. It is in principle possible to omit these sets of values in the transmitted coefficient data thereby saving a few bits of data, but the complications involved in encoding and decoding coefficient data may not be worth the small resulting bit rate saving.

It is also possible to reduce the data needed to transmit coefficients by preselecting a look-up table of permitted sets of coefficient values, omitting coefficients that lead to a filter whose spectral response is too similar to another one that is permitted.

The inner-form noise shaper coefficients, being integers and minimum phase only have nine possible values, namely $c_1=0, c_2=0$ $c_1=1, c_2=0$ $c_1=1, c_2=0$ $c_1=0, c_2=1$ $c_1=0, c_2=1$ $c_1=1, c_2=1$ $c_1=1, c_2=1$ $c_2=2, c_2=1$ $c_1=2, c_2=1$, which requires 4 bits for transmission, or three bits only if one of these possibilities is omitted.

The outer-form noise shaper coefficients, being minimum phase only have possible values that could by way of example be restricted to multiples of ¼ or ⅛, for example with $-16 < 8d_1 < 16$ $-8 < 8d_2 < 8$ which requires 9 bits for transmission.

In the presently described example, we assume that the input PCM words have a fixed wordlength N which may be for example 20 or 24 bits. For simplicity of description, we shall assume N=20 bits here. Other digital PCM wordlengths of length $N-B_1$ less than N=20 bits may be conveyed by such a system by setting the least significant bits that remain unused set equal to 0 or to a fixed value such as an approximation to one half the least retained significant bit. For example $B_1=4$ for 16 bit wordlength and N=20, and the 4 least significant bits of the 20 bit word may be set to 0000 or to 1000 or 0111, provided that the same choice is made for all words. A precise choice may be made other than 0000 if it is desired to minimise any DC offsets, i.e. departures of the average value of the audio waveform from a true zero value.

In encoding such words of precision less than N=20 bits, it would be grossly wasteful of data rate to transmit these $B_1$ least significant bits separately for each sample. Thus the first stage of the encoder processing for each block of L samples is to determine for that block how many $B_1$ of the least significant bits have identical form throughout the block, which may be done by a simple logic comparing the identity of each bit in a word with that of the first word. If all the occurrences of a digit in the words throughout a block are identical, this digit may be separated out for separate transmission and discarded from the digital words, leaving a length $N-B_1$ bit integer word for every sample, which we term the significant word, plus a $B_1$ bit integer word such as 0000 or 1000 or 0111, which we term the LSB word, for transmission in the block header. This process is shown in FIG. 18a. The data for the length $B_1$ of the LSB word and the actual LSB word are transmitted as header data for the block. B1 may be allowed any value between 0 and N, typically requiring 5 bits for transmission, and the LSB word will require N bits for transmission.

There is no reason why in addition, the transmitted LSB word should not-incorporate in its leading $N-B_1$ bits an added "DC offset" component, which should be subtracted from the L significant words of the block. This feature allows removal of any unwanted DC component within a block before the encoding stage. This unwanted DC component may be chosen for example to be the average value of samples or the median value of samples within the block rounded to $N-B_1$ bits, or any other choice rounded to $N-B_1$ bits that may found to be advantageous.

The next step in the encoding process is to encode the significant words using a prediction filter method according to the present invention as described for example in connection with the third order noise shaped encoder of FIG. 11a above. This produces as outputs header data comprising eight coefficients $a_1, a_2, a_3, b_1, b_2, b_3, c_1, c_2$ of the filter and noise shaper, plus the first three samples $I_1, I_2, I_3$ in the block of the input to the prediction filter encoder and the two state variables $N_1, N_2$ of the noise shaper after the third sample of the block for use in initialising the decoder for that block. The output from the prediction filter encoder for all L samples (including the first three used for initialisation) are then passed on to an entropy or Huffman encoding stage.

The added overheads due to the initialisation variables will in this example be $3(N-B_1)$ bits for $I_1, I_2, I_3$ and $I_2$ bits for the noise shaper initialisation variable when m/64 coefficients are used for the filters, since the difference around the quantizer in FIG. 11a can then have 64 possible values.

It is preferable to determine initial state variables by letting the prediction system run not just on the L samples of the block being encoded, but also for a number of samples beforehand (taking care where necessary to ensure that the previous samples all have had $B_1$ least significant bits removed with $B_1$ having the value determined for the current block if $B_1$ varies between blocks) so as to allow the initial state variables in the filter to settle down to a reasonable value that will help minimise output amplitudes from the predictor at the start of the block. Alternatively and less preferably, the state variables can be set to arbitrary values such as zero.

The prediction-encoded integer signal emerging from the prediction filter encoder is then, as shown in FIG. 18a, fed into an entropy or Huffman encoder to minimise the data rate of the transmitted prediction-encoded signal.

A convenient method of Huffman encoding is now described.

Figure 19:
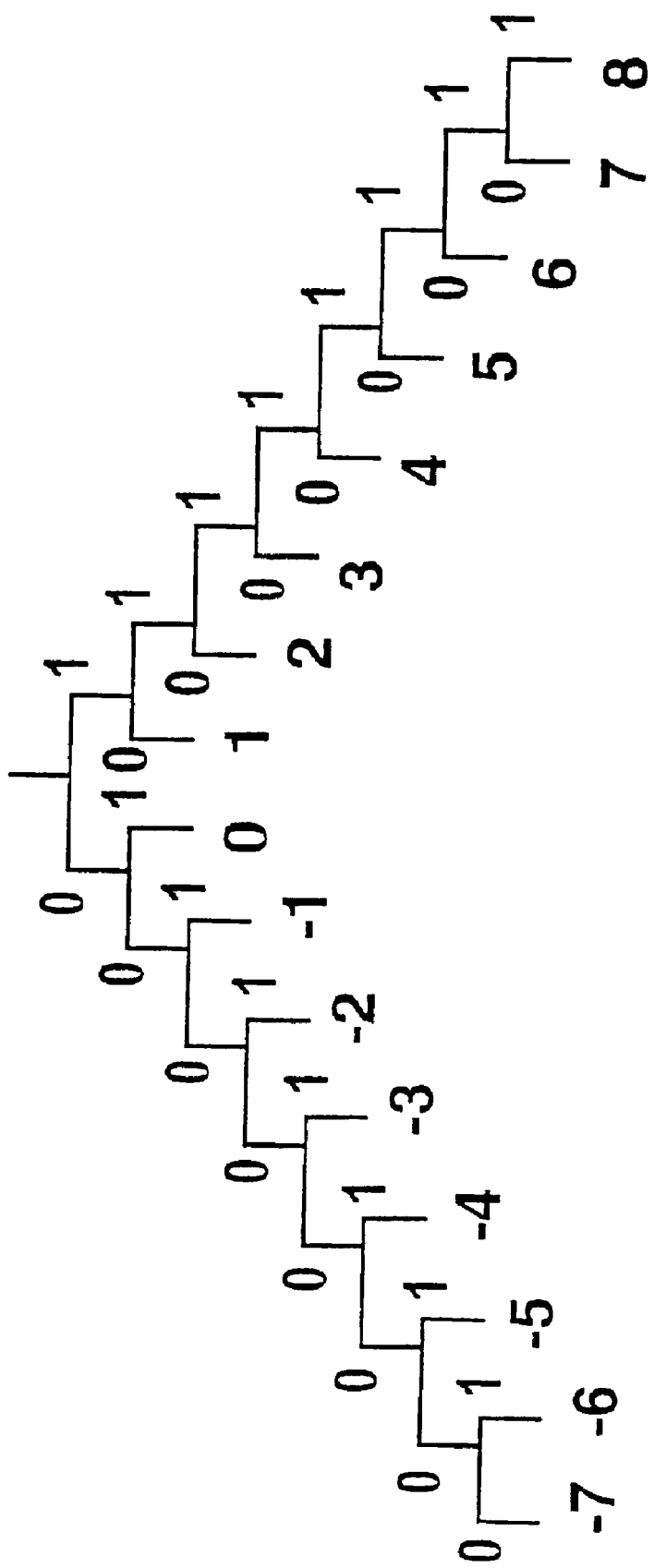
FIG. 19 shows a Huffman coding tree for Laplacian probability density function statistics for block length L=256 or more samples.

In many applications, including the case of most audio waveform signals, it is found that the probability density function (PDF) of the amplitude statistics of the waveform are typically approximately Laplacian, i.e. have a PDF of the form $$\frac{1}{2k}e^{-\frac{|x|}{k}}$$

where the root mean square (rms) energy level is $\sqrt{2}\,k$. Thus one can use a Huffman coding table adapted to the rms signal level within a block and assuming Laplacian statistics. In order to reduce the number of lookup tables required, a limited number may be used, one according to the peak absolute level of the significant word in that block. We have found that, especially for blocks of length L=256 or more, that the following Huffman coding table based on the Huffman coding tree shown in FIG. 19 works well for Laplacian PDF statistics.

This tree codes the words of a 4-bit signal (which we shall take as representing values x from 7 to +8) according to the following table 2.

TABLE 2

| x | Huffman Code |
|---|---|
| −7 | 00000000 |
| −6 | 00000001 |
| −5 | 0000001 |
| −4 | 000001 |
| −3 | 00001 |
| −2 | 0001 |
| −1 | 001 |
| 0 | 01 |
| 1 | 10 |
| 2 | 110 |
| 3 | 1110 |
| 4 | 11110 |
| 5 | 111110 |
| 6 | 1111110 |
| 7 | 11111110 |
| 8 | 11111111 |

For significant word wordlengths greater than 4 bits we code as follows in table 3:

TABLE 3

| Range of all significant words in block | Digits of significant word coded according to above 4-bit table | Plus remaining digits of significant word | Total Huffman coded wordlength |
|---|---|---|---|
| −7 ≤ x ≤ 8 | LSB digits 1 to 4 | none | 2 to 8 |
| −15 ≤ x ≤ 16 | LSB digits 2 to 5 | LSB digit 1 | 3 to 9 |
| −31 ≤ x ≤ 32 | LSB digits 3 to 6 | LSB digits 1 to 2 | 4 to 10 |
| −63 ≤ x ≤ 64 | LSB digits 4 to 7 | LSB digits 1 to 3 | 5 to 11 |
| −127 ≤ x ≤ 128 | LSB digits 5 to 8 | LSB digits 1 to 4 | 6 to 12 |
| −255 ≤ x ≤ 256 | LSB digits 6 to 9 | LSB digits 1 to 5 | 7 to 13 |
| −511 ≤ x ≤ 512 | LSB digits 7 to 10 | LSB digits 1 to 6 | 8 to 14 |
| −1023 ≤ x ≤ 1024 | LSB digits 8 to 11 | LSB digits 1 to 7 | 9 to 15 |
| −2047 ≤ x ≤ 2048 | LSB digits 9 to 12 | LSB digits 1 to 8 | 10 to 16 |
| −4095 ≤ x ≤ 4096 | LSB digits 10 to 13 | LSB digits 1 to 9 | 11 to 17 |
| −8191 ≤ x ≤ 8192 | LSB digits 11 to 14 | LSB digits 1 to 10 | 12 to 18 |
| −16383 ≤ x ≤ 16384 | LSB digits 12 to 15 | LSB digits 1 to 11 | 13 to 19 |
| −32767 ≤ x ≤ 32768 | LSB digits 13 to 16 | LSB digits 1 to 12 | 14 to 20 |
| −65535 ≤ x ≤ 65536 | LSB digits 14 to 17 | LSB digits 1 to 13 | 15 to 21 |
| −131071 ≤ x ≤ 131072 | LSB digits 15 to 18 | LSB digits 1 to 14 | 16 to 22 |
| −262143 ≤ x ≤ 262144 | LSB digits 16 to 19 | LSB digits 1 to 15 | 17 to 23 |
| −524297 ≤ x ≤ 524288 | LSB digits 17 to 20 | LSB digits 1 to 16 | 18 to 24 |

This requires a total of 17 Huffman tables. The one used depends on the peak signal level in a block, shown in the first column of the table. The 4 most significant digits that vary during the block in the significant word are coded with the Laplacian 4-bit Huffman table and the remaining less significant digits are transmitted as they are unaltered after the Huffman word for the leading 4 bits. Although not exactly optimally matched to Laplacian statistics, it can be shown that the resulting data rate is typically less than optimal by only about 0.1 to 0.3 bit/sample depending on whether the signal is fully modulating the 4 most significant digits that vary during the block in the significant word. The average inefficiency over optimum Huffman coding of this simplified look up table approach is around 0.2 bit/sample, except when the significant word wordlength is very small, i.e. 3 bits or less.

It is found that the typical data rate for a block when the significant word x lies between $-2^n+1$ and $+2^n$ is n−0.5 bits per sample approximately rather than n+1 bits required for binary PCM without Huffman coding, i.e. the Huffman coding on its own reduces data rate for Laplacian statistics on average by about 1.5 bit/sample. The actual reduction of data rate varies according to whether the N+1 bits modulated before Huffman coding is fully modulated. With full modulation, the Huffman coded data rate is around n bit/sample, whereas if the modulation is around 6 dB lower than the peak level (blow which a smaller value of n would be used), then the Huffman coded data rate falls to n−0.7 bit/sample approximately.

In addition for the encoding process to transmit Huffman coded waveform data, it is also necessary to transmit to the decoder header information telling the decoder which Huffman table to use for decoding in that block. We term this header data the "Huffman table number".

Additional Huffman tables can be used for special situations such as the case of very small signals in a block. For example, a block conveying a digital black (always zero) signal can use an "empty" Huffman table conveying no data at all in the Huffman coded data part of the block. In this case, predictor filter coefficients and initialisation data need not be transmitted, saving the associated data overheads. For cases where the significant word wordlength is smaller than 3 bits one may use more efficient Huffman codes than the ones in the tables 2 and 3 above such as:

TABLE 4 for −1 ≤ x ≤ 2

| x | Huffman Code |
|---|---|
| −1 | 111 |
| 0 | 0 |
| 1 | 10 |
| 2 | 110 |

TABLE 5 for $-2 \leq x \leq 2$

| x | Huffman Code |
|---|---|
| −2 | 110 |
| −1 | 100 |
| 0 | 0 |
| 1 | 101 |
| 2 | 111 |

TABLE 6 for $-3 \leq x \leq 3$

| x | Huffman Code |
|---|---|
| −3 | 1100 |
| −2 | 1101 |
| −1 | 100 |
| 0 | 0 |
| 1 | 101 |
| 2 | 1110 |
| 3 | 1111 |

It will also be noted that PCM coding data by omitting unused most significant bits unused in a block is also actually a Huffman coding (optimum for uniform PDF signal statistics) having the Huffman table shown in table 7.

TABLE 7

| range of all significant words in block | Huffman code | total Huffman coded wordlength |
|---|---|---|
| $-2^n+1 <= x <= 2^n$ | LSB digits 1 to n+1 | n+1 bits |

This "PCM" Huffman code is usually less efficient on data rate than the other codes given above, but is occasionally more efficient (e.g. on sine wave signals) and has the unique property of isolated data errors not affecting the decoding of the rest of the Huffman coded waveform sequence for a block, so may be preferred where data error risk outweighs data rate efficiency.

The overall header data transmitted in the above scheme will thus typically include, as shown in FIG. 18a, a Huffman table number, an LSB word conveying the least significant digits plus optionally a DC offset, $B_1$ to convey the effective rounding precision of the input in that block, filter coefficients for the decoder, and initialisation data for the decoder. In addition, some header data may be needed to identify and synchronise the start of the block data, and/or to carry additional information such as timing or channel identification for the block.

In cases where the transmission of data is liable to cause data errors, such errors will cause gross corruption of Huffman table decoding even if only one such error occurs. It is therefore desirable in such cases also to add to the data stream error detection and/or correction data such as parity bits and other schemes known to those skilled in the art. This may be done on a block by block basis if it is desired to minimise encoding and decoding delay.

The inverse decoding to the encoding process described here in connection with FIG. 18a is shown schematically in FIG. 18b.

First the Huffman table number is read from the header and the relevant Huffman table loaded into the Huffman decoder, which is then used to Huffman decode the Huffman encoded waveform data in the block, yielding the prediction-encoded integer-valued signal. The initialisation data and the filter coefficients from the block header are loaded into the lossless decoding filter algorithm such as that of FIG. 6b, 7b, 10b, 11b, 13b or 14b, and the prediction-encoded integer signal is decoded by the decoding filter algorithm to form the significant word, which has wordlength N−$B_1$. The original digital words are restored by first loading $B_1$ from the block header data, and then inserting $B_1$ zero least significant bits into the words (which may be done for example by a shift process or by multiplication by $2^{B_1}$) and then adding the LSB word also loaded from the block header to the result. The blocks of L samples resulting are then re-assembled to form the original waveform PCM data stream.

It will be noted that in signal processing terms, the decoder is simpler than the encoder, since there is no need adaptively in the decoder to do such tasks as determine the best prediction filter arrangement or determine parameters such as B, or the Huffman table number or the LSB word—there are all conveyed via the header information.

There are many detailed variations of the above scheme that retain the generic features described. A few variations are now mentioned by way of example.

The data overheads associated with the header of each block may be reduced by allowing a short header that simply instructs the decoder to repeat some or all of the header data required for decoding from the previous block and which omits the initialisation data $I_1, I_2, I_3$. This may be used when, as often is found to be the case, the same encoding filter as in the previous block is found to be a good predictor for the current block and where the precision of the input data is identical to that of the previous block, and where possibly the same Huffman table can be used. The initialisation data $I_1, I_2, I_3$ is obtained from the last samples of the output from the previous block by continuing to run the encoding filter. By this means one in effect can choose the block length at the encoding stage to be arbitrary multiples of L, and vary the effective block length adaptively according to whether signal statistics are static or varying rapidly. If such an option is available for repeating header information, it may be advantageous to choose a short block length, maybe L=192 or 384 samples, since the data inefficiencies of headers may be reduced by using repeated header information.

Even in cases where the filter coefficient filter is different in the current block from the previous block, data overheads in the header can be reduced by not transmitting the initialisation data $I_1, I_2, I_3$ every block, but instead putting in a header flag instructing the decoder to take the output of the decoder from the end of the previous block to initialise the current block, and simply synchronising the switching of filter coefficients at the start of the block at the encoder and decoder without changing the stored state variables.

A defect of the above scheme is that the allowed digital resolution of words is only an integer number of bits, so that resolution can be changed only in discrete steps of 1 bit (6 dB changes in quantization noise floor), which may sometimes mean that slightly less resolution is possible via a channel capable of a given data rate than might be desired. A variation that reduces this problem would also allow signals that are quantized with a step size that is an integer multiple G of the input LSB other than a power $B_1$ of 2. For example, a quantization step size either of the form $G=2^{B_1}$ or $3 \times 2^{B_1}$ could be allowed.

In this case, the LSB word is determined such that the remainder after division by $G=2^{B_1}$ or $3 \times 2^{B_1}$ is constant throughout the block and the LSB word is a multiple of $G=2^{B_1}$ or $3\times2^{B_1}$ (representing any DC offset used) plus this remainder, and the significant word is the original PCM data minus the LSB word divided by $G=2^{B_1}$ or $3\times2^{B_1}$. In the decoder of FIG. 18b in this variant, one recovers from the block header which factor $G=2^{B_1}$ or $3\times2^{B_1}$ is used in that block, and multiplies the significant word by it and then adds the LSB word. The generalisation to other step sizes G is now obvious.

An even more general scheme allows arbitrary integer quantization step size G. This may be determined in the encoder from its input by subtracting the subsequent samples from the first sample in the block, and determining the greatest common divisor (for example by the Euclid remainder algorithm) of all such differences. This greatest common divider G may then be transmitted in place of $B_1$, and the significant words formed comprising the integer part of the original words divided by G minus an integer DC offset, and the LSB word comprising the remainder after division by G plus said integer DC offset times G may be transmitted as header data. The reverse decoding comprises multiplying the significant words by G and adding the LSB word. Such a scheme allows the efficient handling at low data rates of PCM signals with any uniform integer quantization step size G with any DC offset whatsoever that is a multiple of $G_0$ Such a scheme has the advantage that for signals whose quantization step size is a significant integer multiple $G_0$ of the LSB, all gains of the form $G/G_0$ may implemented exactly without affecting the encoded data rate, permitting lossless coding to be used with flexibility of signal gain. A second variation is to remove an integer-valued DC component from the prediction-encoded signal before Huffman coding, to transmit it separately in the block header, and to add it back in after Huffman decoding. This is distinct from the DC component transmitted as the LSB word, since it is a DC component of the prediction-encoded signal and not the original signal. Such an integer DC component can be chosen to optimise or minimise the Huffman encoded data rate, and can be an overall average, a median, or the average of positive and negative peaks in the block, or some other chosen DC value.

Also other Huffman tables for large signals can be provided, optimised for signal statistics other than Laplacian PDF statistics. Low-level signal blocks can be coded by techniques other than Huffman coding such as arithmetic coding as described in the above cited Weiss & Schremp reference.

In simpler systems, Huffman coding can be replaced by simpler schemes such as simply shortening word lengths by discarding all but one of the unvarying (i.e. those that are all zeros or all 1's for all words in the block) most significant bits (MSBs) and simply transmitting the number $B_2$ of these unvarying MSBs at the start of each block. In decoding one restores the most significant bits by repeating the most significant bit $B_2$ times in each word.

This simpler scheme of discarding unvarying MSBs has a poorer coded data rate than Huffman coding, typically of 1.5 bit/sample. However, it has the advantage that unlike Huffman coding, isolated data errors only affect a single sample of the decoded data, rather than the whole of the rest of the block.

It is estimated that schemes of the above form permit typical PCM audio signals with resolution of 14 or more bits at 44.1 or 48 kHz sampling rates to be encoded at average data rates of between 6 and 9 bits/sample less than the uncoded PCM data rate, the 6 bit/sample reduction being typical of signals with high treble energies and narrow dynamic range, and the 9 bit figure being typical of signals with very wide dynamic range and little treble energy. When several associated channels are transmitted at the same time, it will be rare for all to achieve their peak data rate simultaneously, and in such a situation, the ability to match signal spectra well using a third order encoding filter arrangement, along with Huffman coding, means that on typical signals, even the peak data rate is typically reduced by around 4 bit/sample/channel.

It is characteristic of audio lossless coding schemes using encoding filters well matched to the signal spectrum that as the sampling rate is increased, the typical saving in data rate in bits/sample/channel increases, so that doubling the sampling rate does not double the data rate, but may increase it by perhaps only 30%. This is because typical audio energies fall rapidly with increasing frequency, often being more than 60 dB down at 30 kHz relative to energies at low frequencies. Thus using an encoding filter having of order 60 dB boost of high frequencies relative to low frequencies will give a substantial data rate reduction for such signals.

It is estimated that schemes of the above form permit typical PCM audio signals with resolution of 16 or more bits at 96 kHz sampling rate to be encoded at average data rates of between 8 and 11 bits/sample less than the uncoded PCM data rate, the 8 bit/sample reduction being typical of signals with high treble energies and narrow dynamic range, and the 11 bit figure being typical of signals with very wide dynamic range and little treble energy. When several associated channels are transmitted at the same time, it will be rare for all to achieve their peak data rate simultaneously, and in such a situation, the ability to match signal spectra well using a third order encoding filter arrangement, along with Huffman coding, means that on typical signals, even the peak data rate is typically reduced by around 6 bit/sample/channel.

Thus lossless coding of the kind described here is particularly appropriate for use at high sampling rates such as 96 kHz where the savings in data rates can be particularly advantageous.

In addition, lossless coding of this kind automatically reduces the data rate if a PCM signal of restricted high frequency bandwidth is being transmitted, since for such signals, one may use an encoding filter with a particularly large high frequency boost, which reduces predictor-encoded signal energy over the rest of the frequency range.

Thus the use of lossless encoding based on the prediction filters of the invention as herein described with a high audio sampling rate such as 96 kHz allows transmission of audio signals of different bandwidths and different digital resolutions with relatively high efficiency, and there is no need to adopt PCM systems based on different sampling rates and different wordlengths to take advantage of different audio bandwidths and resolutions to get best results within a given transmitted data rate. A single system operating at 96 kHz sampling rate with 20 or 24 bit capability may be used with the lossless encoding and decoding techniques described herein to achieve channels with a wide range of bandwidths and resolutions while using data rate efficiently.

Lossy Encoding with Lossless Decoding

Although the invention is primarily aimed at lossless transmission and recovery of original waveform data, the decoder according to the invention can also be used with a lossy encoder to provide a further reduction in the data rate of the transmitted signal.

Figure 20A:
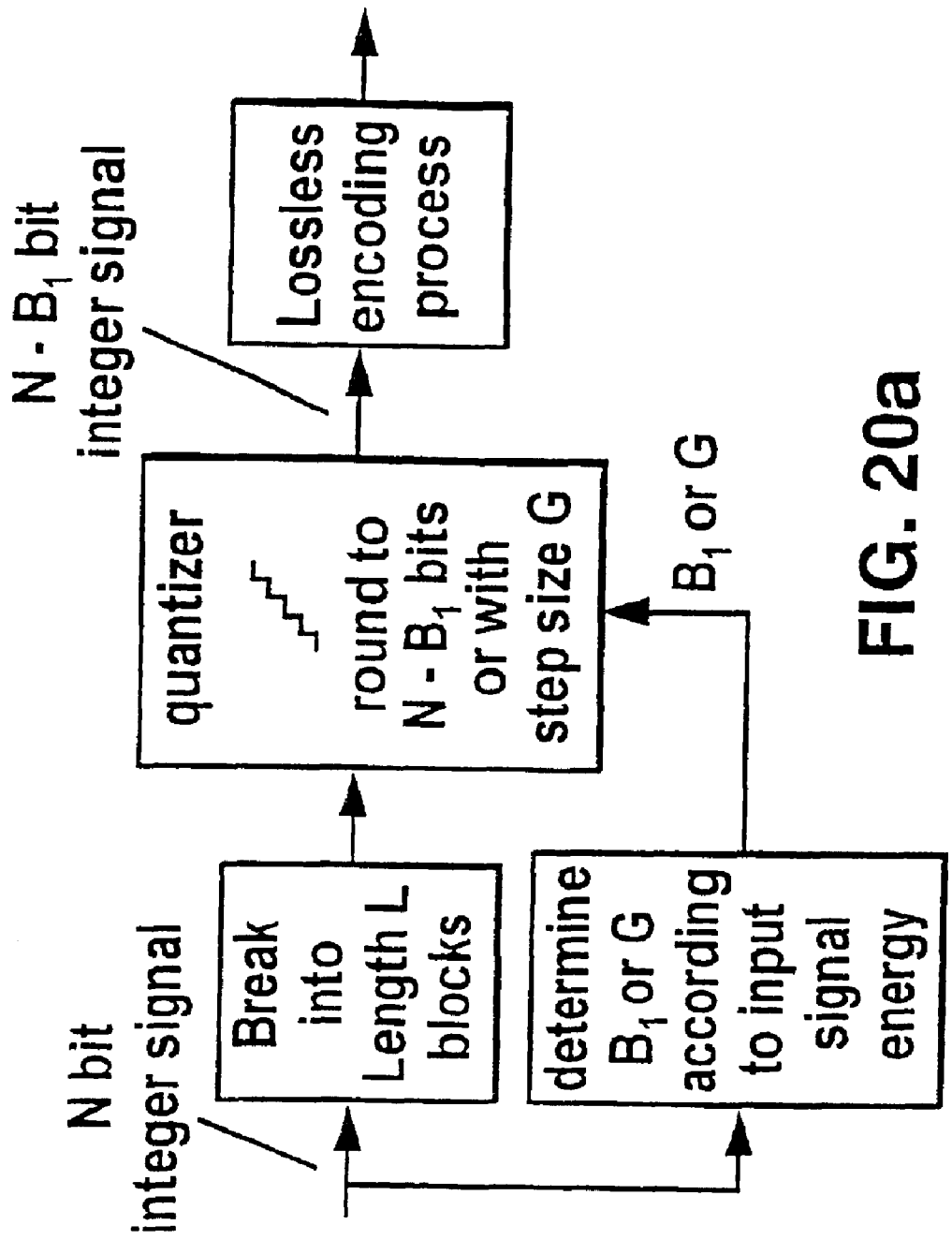
FIGS. 20a and 20b show lossy coding systems incorporating a lossless encoder and decoder to reduce data rates of audio signals, using adaptive rounding of the input signal respectively showing the cases without and with adaptive perceptual noise shaping.

This is based on the observation that if the input waveform to the encoder has variable wordlength, i.e. if the number $B_1$ of least significant bits that are unchanging for large numbers of successive samples varies from moment to moment, then the data rate of an encoded signal will also vary according to the value of $B_1$. So one can implement a lossy encoding by arranging an initial rounding operation to remove the $B_1$ least significant bits in successive blocks of L samples before the encoding system described above, as shown in FIG. 20a, where the number of bits $B_1$ removed is small or zero in low-level passages, but is larger in high level passages where the resulting rounding errors are less likely to be noticed in the presence of large signal energy.

Such adaptive rounding at the input can be used to reduce the data rate used for transmission in louder passages.

Figure 20B:
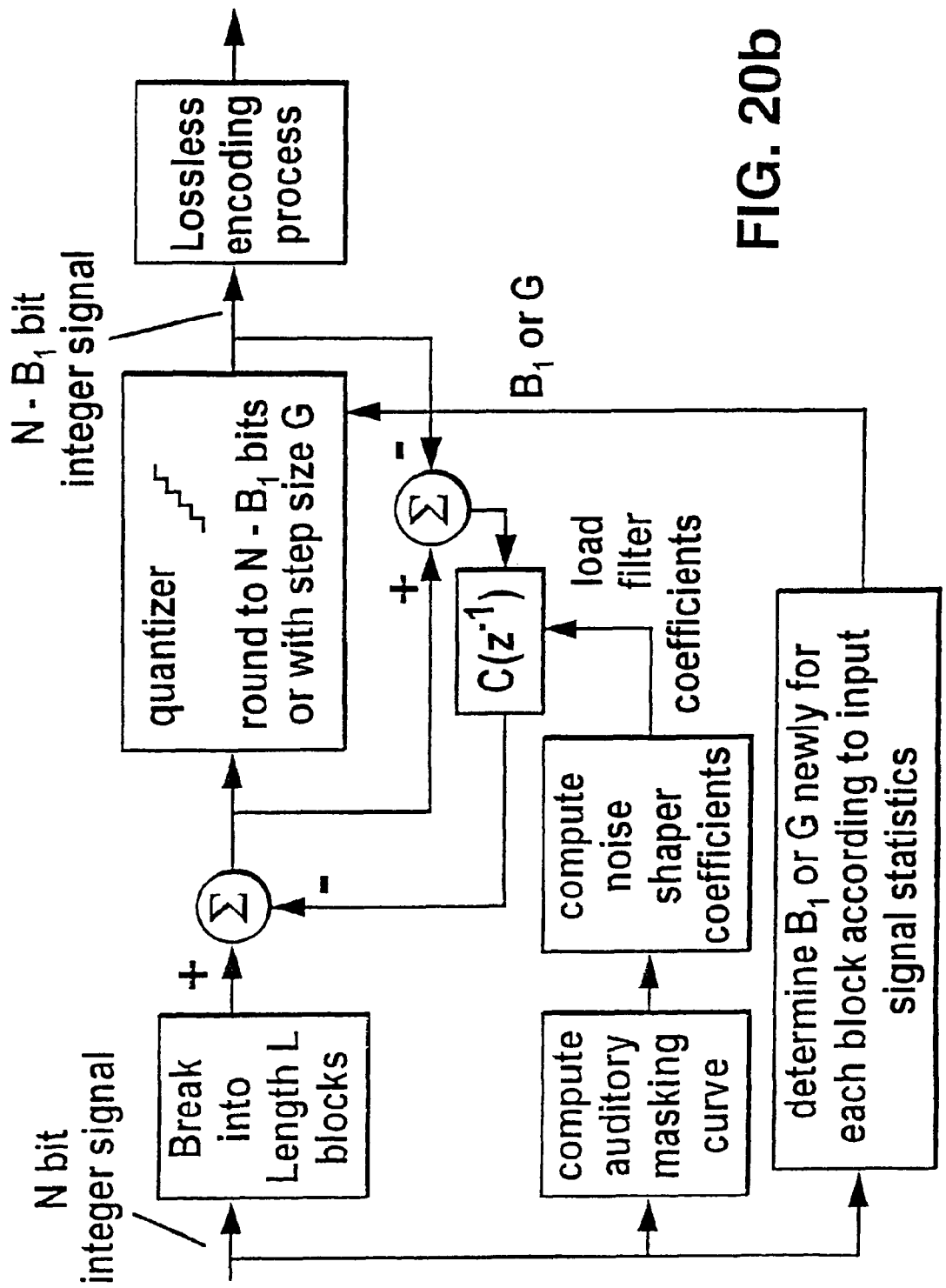

However, simple rounding of blocks of L samples is not generally the optimum strategy for minimising the perceptibility of errors due to the wordlength being adaptively reduced to N–$B_1$ bits. A superior technique that can make such errors much less perceptible is to combine the rounding process prior to the encoder with an adaptive noise shaping as shown in FIG. 20b. The quantization noise error produced by the rounding operation can then be shaped spectrally so that the quantization noise spectrum follows the shape of or lies under the auditory masking threshold curve for the audio signal at that moment.

This is done by first using a psychoacoustic model of auditory spectral masking acting on the input to determine the masking threshold as shown in FIG. 20b. This process is well known in the art, being widely used in the implementation of lossy perceptual coding systems, and usually comprises a windowed fast Fourier transform to determine spectral content followed by a post-processing of the spectrum where every spectral component is replaced by a masking curve similar to that in the ears, and the maximum of such masking curves is the overall masking curve. There are various refinements and details that may be used to more accurately simulate masking curves, such as referred to in the following Stuart references.

J. R. Stuart, "Predicting the audibility, detectability and loudness of errors in audio systems" preprint 3209 of the 91st Audio Engineering society Convention, New York (1991 Oct.).

J. R. Stuart, "Implementation of Measurement with Respect to Human Auditory Capabilities", Proc. of the Audio Engineering Society UK Conference on DSP, London (1992 Sep. 14–15), pp. 45–61.

An algorithmic method of designing the noise shaping filter coefficients and determining permissible rounding step size to ensure that the quantization noise spectrum lies under auditory threshold masking curves is described in detail in the prior art for another application in the reference A. W. J. Oomen, M. E. Groenewegen, R. G. van der Waal and R. N. J. Veldhuis, "A Variable-Bit-Rate Buried-Data Channel for Compact Disc," J. Audio Eng. Soc., vol. 43 No. ½ pp (1995 Jan./Feb.). This method may also be used in the present application as a method for implementing the adaptive perceptual rounding shown in FIG. 20b.

By this means, the degree of rounding used may be increased to allow the removal of a larger number $B_1$ of bits while giving perceptually inaudible or minimally audible quantization errors due to masking of the errors moment by moment. It is often found at 44.1 or 48 kHz sampling rates that $B_1$ is typically such that the prediction-encoded signal's significant word length is only 4 or 5 bits when such perceptual noise shaping is performed in the input quantization process shown in FIG. 20b. At high sampling rates such as 96 kHz where the audio contains frequencies at which masking curves are not modelled, one can replace the masking curve by a presumed masking curve that ensures that the quantization spectrum follows the signal spectrum at high frequencies but is a predetermined figure such as 12 or 18 dB below the signal in energy. This ensures a broad preservation of the ultrasonic signal spectral characteristics beyond the limit of human hearing to sine-wave signals. (There is some evidence that the ears respond to frequencies beyond the frequency limits at which sine waves can be heard, but that this process is a nonlinear one that involves perception of complex waveform features.).

While the rounding operation used has to use a fixed value of $B_1$, or more generally of step size G, for each block of L samples, there is no reason why the adaptive perceptual noise shaping should not vary more frequently or even continuously in time, since the noise shaping information is built into the input signal to the lossless encoding process in FIG. 20b and not used by the rest of the encoding and decoding process.

This lossy perceptual data rate reduction encoding process is followed by lossless encoding and decoding that reconstructs at the output of the decoder the signal with noise-shaped quantization noise that entered the lossless encoding system in the encoder of FIG. 20b. No change of decoding algorithm is required.

A system of lossy perceptual encoding of this form, based on perceptually noise shaped adaptive rounding followed by lossless encoding and decoding of the resulting reduced significant word lengths has a useful and unusual feature. Unlike other known perceptual lossy coding systems based on auditory masking, it is possible to cascade perceptual codecs (encoder/decoder systems) an indefinite number of times without an indefinitely large build up of the quantization noise artefacts. The reason for this is that once a codec has removed $B_1$ least significant bits from a portion of the waveform signal, no further removal of $B_1$ or fewer least significant bits will have any further effect on the signal. Only if more bits are removed will there be any added quantization error in a codec, and the number of times the significant word length can be reduced is finite, which limits build up of quantization noise error.

This feature is useful in applications such as repeated signal encoding and decoding in editing or broadcast applications, where the ability to cascade lossy perceptual coding processes is highly desirable.

More generally, rather than quantizing to a discrete number $B_1$ of bits with noise shaping, one can quantize with perceptual noise shaping to an arbitrary quantization step size G if one uses a lossless encoding and decoding system that will encode such arbitrary step sizes efficiently as described above.

In audio editing applications, if edited passages are only given gains that ensure that the quantization step size of the signal is an integer valued multiple of the LSB that is encoded efficiently, then the data rate of coding the edited signal will remain unchanged except during cross-fades between across edits when the signal data rate will increase temporarily. Thus the coding schemes described allow audio editing to be done including gain adjustments with little effect on the data rate requirements of the edited signal, whether this has been losslessly or lossy encoded. This permits the edited signals to be stored efficiently without the need for the quality degradation associated with additional requantization.

The advantages distinct from the prior art in lossy coding of this approach to lossy encoding arise from the use of precision reduction in the original PCM domain with psychoacoustic noise shaping followed by use of a lossless coding system capable of adaptively detecting the precision reduction and of encoding at a data rate appropriate to the detected precision.

The process of precision reduction in the PCM domain may use a simple quantizer with step size G as described above, or may in addition add dither at the input of the quantizer in order to reduce the effect of nonlinear distortion in the quantizer. Such dither may be additive or subtractive dither of any form known to be advantageous, such as described in the above cited Gerzon, Craven, Stuart Wilson reference or in the above cited Gerzon and Craven reference or in P. G.

Craven & M. A. Gerzon, "Compatible Improvement of 16-Bit Systems Using Subtractive Dither", Preprint 3356 of the 93rd Audio Engineering Society convention, San Francisco (1992 Oct. 1–4).

Lossless Pre-Emphasis and De-Emphasis

Lossless coding and decoding according to the invention can also be implemented without dividing the signal into blocks and without the need for initialisation by means of a method we term lossless pre-emphasis and lossless de-emphasis. This technique is particularly useful for using a conventional fixed-rate PCM waveform channel to convey an increased number of bits resolution losslessly. Moreover this coding method has a degree of compatibility with the conventional methods of pre-emphasis and de-emphasis of a PCM channel.

First we review briefly the known prior art of pre-emphasis and de-emphasis in a PCM channel. Pre-emphasis is the process of applying a predetermined equalisation characteristic to a waveform before using PCM coding, and de-emphasis is the inverse process of applying an inverse equalisation to the decoded PCM signal. In current practice, pre-emphasis and de-emphasis are most commonly applied in the analog signal domain, although sometimes pre-emphasis and de-emphasis are performed in the digital domain. In audio, pre-emphasis usually comprises a relative boost of high or treble frequencies relative to bass frequencies, and a corresponding cut of treble frequencies is used in the inverse de-emphasis.

Figure 21A:
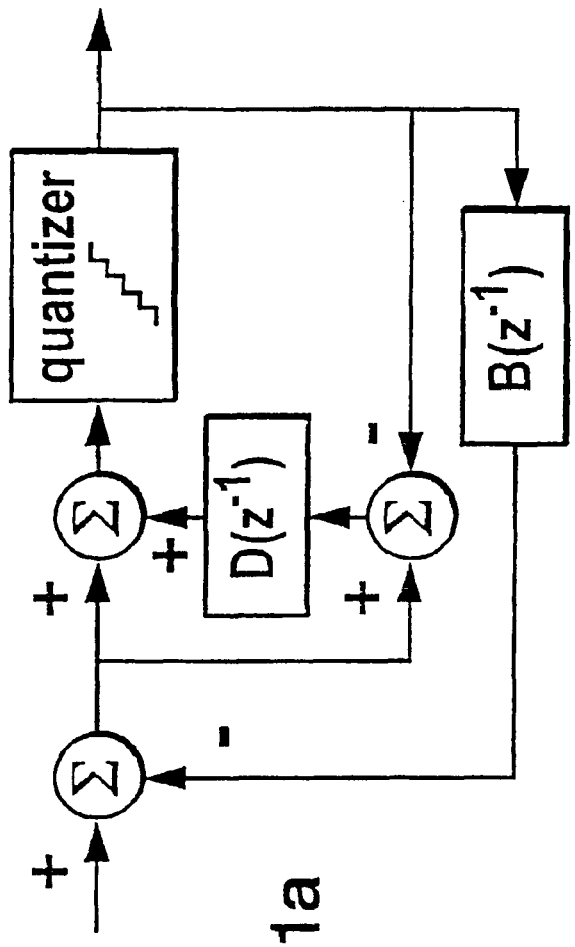
FIGS. 21a and 21b show respectively a lossless pre-emphasis encoder and a lossless de-emphasis decoder according to the invention.

The idea of lossless pre-emphasis is to implement the pre-emphasis in the digital domain, using a lossless encoding filter with built-in integer quantizer, and to implement the inverse de-emphasis in decoding with a the inverse lossless decoding filter with built-in integer quantizer. Providing one is prepared to lose accuracy in just the first few samples of data, it is possible to perform this lossless coding and decoding accurately without any initialisation of state variables provided that the filters and noise shapers of the lossless coding and lossless decoding have a special form shown in FIGS. 21a and 21b respectively.

In this special form, the encoder comprises simply a quantizer with outer-form noise shaping using a finite-precision FIR filter $D(z^{-1})$ which may be absent (i.e. with coefficients zero), whose output is fed into its input via a subtraction node subtracting a finite-precision FIR filter $B(z^{-1})$. The decoder comprises the same filter $B(z^{-1})$ fed from the decoder input and added to a direct signal path, followed by a quantizer with the same finite-precision FIR filter $D(z^{-1})$ outer-form noise shaping, where the quantizer used in the decoder is equivalent to the encoding quantizer both preceded and followed by a gain of −1.

Figure 21B:
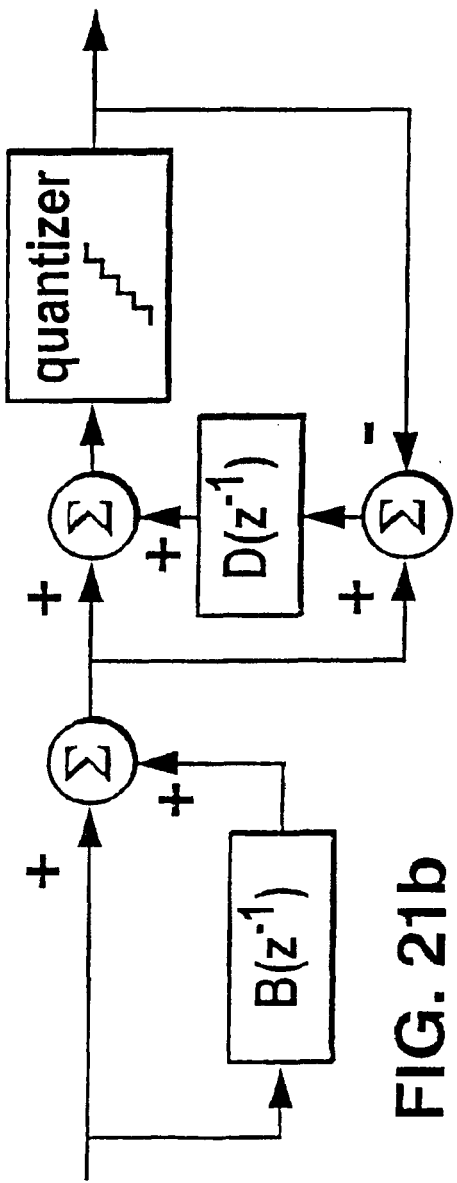

If the FIR filter $B(z^{-1})$ is of order N, it is obvious from FIG. 21b that the output of the summing node after N samples in the decoder is independent of the initialisation. What is a little less obvious is that, provided the input signal has significant statistical fluctuation, the initialisation of the finite-precision FIR filter $D(z^{-1})$ outer-form noise shaper will eventually not affect the output either. Clearly, if the noise shaper is of order N', then if the output signal happens to coincide with that at the input of the encoder for any N' successive samples, then it will coincide at all times thereafter, since this will set the internal state variables of the noise shaper identical to that at the encoder. If one assumes that on typical audio or waveform signals, the statistical distribution of the fractional part between integers of the output of the summing node of FIG. 21b is a discrete uniform probability distribution, as is reasonable for almost all signals, then it is only a question of time, determined by the statistical probabilities, before N' successive output samples happen to have identical values to those at the input to the encoder. In practice, based on numerical studies of erroneous initialisation of outer-form noise shaped quantizers, it is found that for a first order outer-form noise shaper, the correct values of the noise shaper state variables is likely to happen within a few samples of starting playback of a waveform, and for second order outer-form noise shapers the likely time before correct decoding will probably be tens, and at most a few hundreds of samples for noise shapers whose maximum high frequency boost does not exceed 20 dB. Therefore in applications where the incorrect reproduction of a few initial samples is not critical, as in the playback of audio waveforms of extended duration, the encoding and decoding method of FIGS. 21a and 21b with $B(z^{-1})$ a finite precision FIR filter and $D(z^{-1})$ a low order finite-precision FIR filter may be used without initialisation.

In most envisaged applications the filters will remain fixed throughout the encoding and decoding process in this lossless pre-emphasis and de-emphasis application.

The encoding and decoding will remain lossless provided only that the output of the encoder does not exceed the peak level capacity of the PCM channel used for transmission. For many signals encountered in audio, and with an appropriate pre-emphasis characteristic, it is easy to ensure that this peak level capacity after encoding is not exceeded, either by recording signals with metering reading the peak pre-emphasised level, or by using a limiter to prevent the signal waveform from exceeding the desired pre-emphasised level.

Given that many audio signals do not have very high peak levels in the treble, but a high level in the bass, a pre-emphasis characteristic boosting the treble and cutting bass will reduce the peak levels of signals passes through lossless pre-emphasis, allowing a shorter wordlength to be used. By this means, for example, it may be possible to use a 16 bit PCM channel to convey 17 or 18 bit signals, by losslessly pre-emphasising the 18 bit signal giving a 16 bit wordlength output, which may then be losslessly de-emphasised by the inverse decoder back to 18 bits.

The noise shaping in this lossless pre-emphasis application of the invention may be employed to improve compatibility of the decoding with playback via conventional de-emphasis rather than the correct lossless de-emphasis. If conventional de-emphasis is used, then the added quantization error introduced in the encoder is not removed and degrades the quality of the reproduced sound. However the perceptual effect of the introduced error, which without noise shaping would typically have a white spectrum, can be reduced by using noise shaping such as $D(z^{-1}) = \frac{3}{2}z^{-1} + \frac{5}{8}z^{-2}$ which will typically give less energy at the frequencies at which the ear is most sensitive, reducing perceived noise levels by around 9 dB at 44.1 or 48 kHz sampling rate and about 9.7 dB at a 96 kHz sampling rate.

Figure 21C:
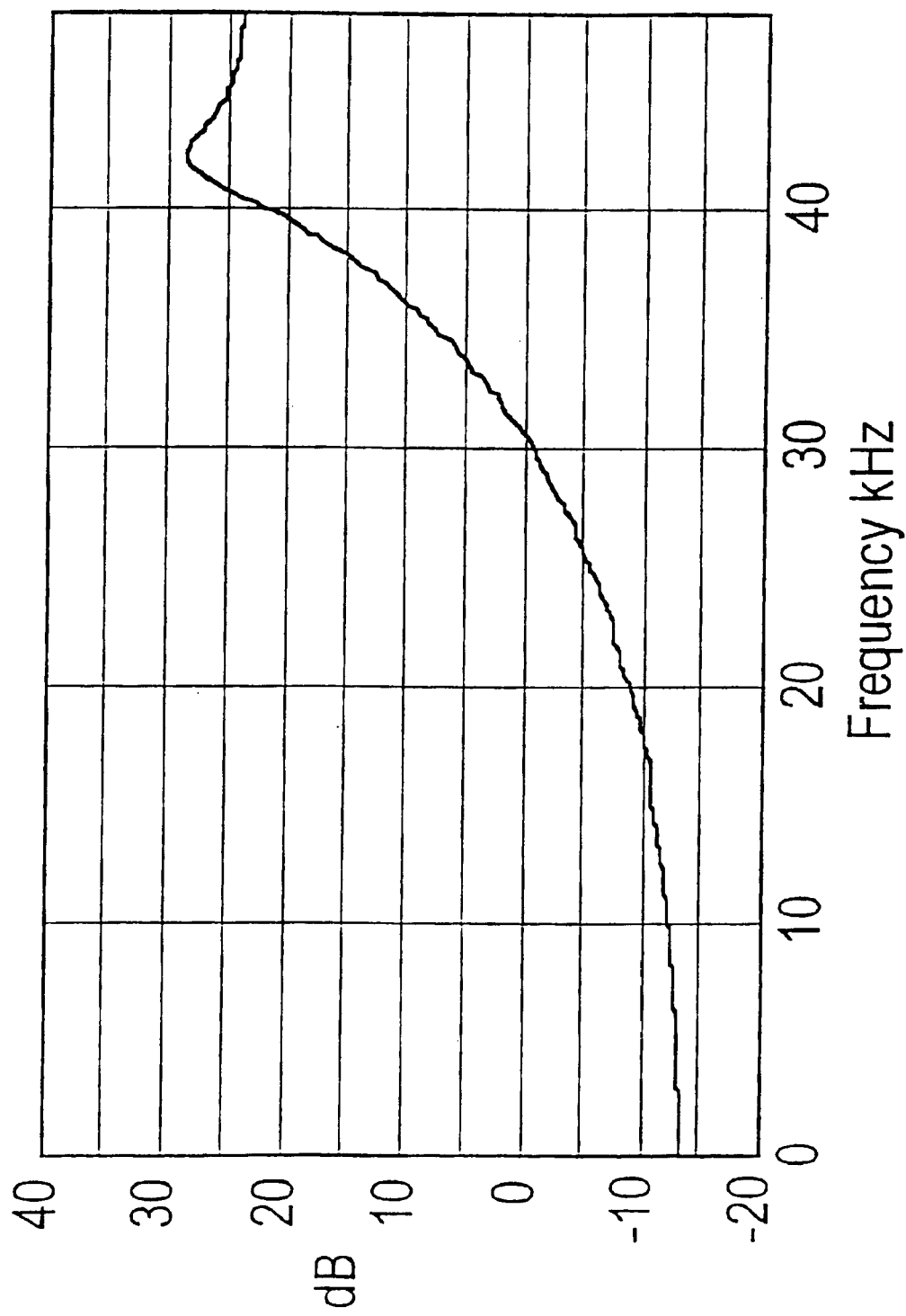
FIG. 21c shows a pre-emphasis frequency response curve for a sampling rate of 96 kHz for use with lossless pre-emphasis encoding.

An example of possible pre-emphasis frequency response characteristic that may be used for lossless pre-emphasis of audio signals at a 96 kHz sampling rate is shown in FIG. 21c. This is obtained using the FIR filter $$B(z^{-1})=b_1z^{-1}+b_2z^{-2}+b_3z^{-3}+b_4z^{-4}$$

where $$b_1 = \frac{34}{16}, b_2 = \frac{23}{16}, b_3 = \frac{2}{16}, b_4 = \frac{-2}{16}.$$

This pre-emphasis characteristic attenuates signals by more than 12 dB below 10 kHz, typically reducing audio word length by more than 2 bits, and attenuation remains more than 9 dB almost up to 20 kHz and rises to 0 dB above 30 kHz, with strong boosts of around 24 dB being confined to very high frequencies above 40 kHz.

Thus on typical audio signals, this lossless pre-emphasis characteristic typically reduces wordlength 2 or more bits, allowing a PCM channel conveying the losslessly pre-emphasised signal to convey a 2 bit larger wordlength after lossless de-emphasis. For example a 16 bit PCM channel using lossless pre-emphasis coding can transmit losslessly an 18 bit PCM signal provided that the pre-emphasis does not cause overload of the transmission channel.

In this application, the noise shaper may be a second order outer-form noise shaper with for example $$D(z^{-1})=\tfrac{1}{2}z^{-1}+\tfrac{3}{4}z^{-2}$$

which will typically reduce perceived noise levels when decoding is via conventional rather than lossless de-emphasis by about 10 dB at a 96 kHz sampling rate. If the original signal was 18 bit and the losslessly pre-emphasised signal was 16 bit wordlength, then the perceived noise due to the encoder quantizer when decoded with conventional pre-emphasis using such noise shaping is equivalent to an added quantization noise about 19.7 bits down.

More generally, the general outer-form noise shaped architecture of the invention shown in and described in reference to FIGS. 13a to 13d may be used without initialisation, and will for input signals having a random form eventually settle down to the same values of state variables and become lossless, provided only that the encoding filter is "leaky", i.e. that its numerator $1+A(z^{-1})$ has all zeros strictly within, but not on, the unit circle.

However, the settling down time before the errors in the decoding disappear and the decoding becomes lossless may be unacceptably long, maybe even exceeding the duration of an extended piece of music.

It is therefore necessary to check by numerical simulations feeding in a same random integer-valued input signal into the decoding system of FIG. 13b with different initialisations that the difference in outputs for any two such initialisations settles down to zero after a reasonable time, which may be a few milliseconds or perhaps a few tens of milliseconds. It is found as a broad rule of thumb that such rapid settling down does occur if the FIR filter $$A(z^{-1})+D(z^{-1})+D(z^{-1})A(z^{-1})$$

is of low order and if it is such that the increase of power of white noise fed to the filter $$\frac{1}{1+A(z^{-1})+D(z^{-1})+D(z^{-1}A(z^{-1}))} = \frac{1}{1+A(z^{-1})} \cdot \frac{1}{1+D(z^{-1})} = \frac{1}{(1+D(z^{-1}))}(1+A(z^{-1}))$$

is kept within moderate bounds. It is also desirable that the decay time of this filter is short.

The use of incorrect initialisation in the decoder of FIG. 13b has the effect not only of starting off the noise shaping incorrectly, but also of causing the output waveform to decode initially with possibly very gross errors. However, the "leakiness" of the filtering, i.e. the high degree of damping due to the zeros of $1+A(z^{-1})$ lying strictly within the unit circle means that such gross errors will damp out and disappear according to the decay time of any resonances in the filter $$\frac{1}{1+A(z^{-1})}$$

and once such damping has occurred, then the noise shaping initialisation also has the opportunity to settle down.

Thus, providing a "leaky" encoding filter is used and precautions are taken to choose the FIR filter $$A(z^{-1})+D(z^{-1})+D(z^{-1})A(z^{-1})$$

of FIG. 13 to result in rapid settling down of the outer-form noise shaped decoder after incorrect initialisation, one may use the lossless encoding and decoding of the invention using optional outer-form noise shaping around the quantizer without initialisation.

Using such decoders that forget the initialisation conditions after a short period of exposure to random input signals is also advantageous even if infrequent initialisation is used, since it allows rapid recovery from isolated data errors in the input to the decoder.

Known prior art lossless prediction techniques all required initialisation.

Thus lossless pre-emphasis is a convenient means of increasing the effective wordlength of PCM channels when decoded with lossless de-emphasis, and gives a degree of compatibility with conventional de-emphasis of the same channel.

Decoding without Initialisation

The above scheme with a fixed "leaky" encoding filter for decoding lossless pre-emphasis without initialisation can also be extended to more general adaptive schemes. In this case, depending on the acceptable time to settle down to lossless coding, one can omit initialisation data at the start of many or all blocks of L samples, and begin the decoding process using zero state variables and carry over state variables from the previous block. Providing that the filter and outer noise shaping coefficients are chosen to be sufficiently leaky in the encoder, the settling time may be found to be adequately short, and one can omit the data overheads of frequent initialisation. Care, however, must be taken to avoid using encoding filters that are not "leaky" or are not very leaky, i.e. ones whose zeros lie on or very close to the unit circle, since such encoders will have very long or infinite settling down times.

The settling down time may be improved by various possible strategies. One strategy is to cascade several relatively leaky encoders rather than to use a single much less leaky encoder of similar filter performance, since each of the inverse decoders will settle down more rapidly in turn, allowing the next decoder in the chain then to settle down.

Another strategy makes use of the noise shaping to reduce settling down time. In this strategy, one uses an outer-form noise shaper $D(z^{-1})$ such that $1+D(z^{-1})$ is leaky and such that the frequency response of the filter $$\frac{1}{(1+D(z^{-1}))(1+A(z^{-1}))}$$

is approximately flat, or at least does not boost the amplitude of white noise very much. This has the effect of reducing the quantization noise amplitude after decoding with incorrect initialisation, and reduced quantization noise amplitude aids the settling down process, since the probability at any time of the required number n of quantized outputs having the correct value is increased if the deviations from the correct outputs are reduced.

These strategies also in general improve the recovery of the decoding filter in response to isolated errors in the prediction-encoded samples received by the decoder.

The possibility of omitting or reducing the initialisation data due to rapid settling time also may allow higher order encoding filters to be used without requiring transmission of an excessive amount of initialisation data. By way of example, one might use a cascade of three second order encoding filters, only the last of which transmits initialisation data, and the first two of which have a relatively high degree of leakiness and noise shaping matched to the encoder numerator to minimise quantization noise error amplitude at the decoder output. This allows the first stage of decoding to be initialised and the second and third stage to settle down rapidly, giving sixth order encoding filtering including one factor that need not be leaky, while having low initialisation data overheads.

The settling down time should not be affected greatly by the use of encoding or decoding systems with cascaded filters using fractional-step quantizers as described above with reference to FIGS. 16 and 17.

Settling down time may be poor if the input signal is not sufficiently random in nature to "jog" or increase the probability of the correct state variables being achieved. In this situation, the use of additive or subtractive dither in the signal input to the encoder and/or at any of the internal quantizers, with corresponding subtraction of synchronised dither at corresponding points before quantizers or at the output will help jog the system to settle down.

The Multichannel Case

The above lossless coding and decoding methods may be extended to multichannel signals. While multichannel signals can be losslessly encoded and decoded as separate channels, such separate encoding does not optimally reduce the data rate, since it takes no advantage of any redundancy there may be due to correlations between the information in different channels.

In order to describe the general multichannel process, we first describe the process of lossless matrix quantization of n channels of integer-valued waveform data.

FIG. 22$a$ shows a primitive n×n matrix quantizer producing n integer-valued output signals $S'_1, S_2 \ldots, S_n$ from n integer-valued input signals $S_1, S_2, \ldots, S_n$, where the first signal $S_1$, is altered to become a modified signal $$S'_1 = S_1 + \text{quantize}(a_2 s_2 + \ldots + a_n s_n),$$

where quantization is a rounding operation to integer values. The coefficients $a_2, \ldots, a_n$ may preferably be of finite precision having a common highest divisor d, so that the algorithm can be implemented exactly without any overall rounding error.

Then the signals $S_1, S_2, \ldots, S_n$ can be recovered exactly from the signals $S'_1, S_2 \ldots S_n$ by an inverse primitive n×n matrix quantizer shown in FIG. 22$b$, which implements $$S_1 = S'_1 - \text{quantize}(a_2 s_2 + \ldots + a_n s_n)$$

using an identical quantizer to the original matrix quantizer.

Note that in FIGS. 22 and 23 we show that the integer-value signals being fed to a summing node before the integer-valued quantizer rather than afterwards. This clearly makes no difference for integer-valued input signals.

Now, apart from the presence of the quantizer, the primitive matrix quantizer of FIG. 22$a$ implements an n×n matrix $$\begin{pmatrix} 1 & a_2 & a_3 & \cdots & a_n \\ 0 & 1 & 0 & \cdots & 0 \\ 0 & 0 & 1 & \cdots & 0 \\ \vdots & \vdots & \vdots & \ddots & \vdots \\ 0 & 0 & 0 & \cdots & 1 \end{pmatrix}$$

and the inverse primitive matrix quantizer of FIG. 22$b$ implements an n×n matrix both matrices having determinant 1.

More elaborate lossless matrix quantizers having n integer signals in and out, which are lossless in the sense of being invertible to recover the input signals from the $$\begin{pmatrix} 1 & -a_2 & -a_3 & \cdots & -a_n \\ 0 & 1 & 0 & \cdots & 0 \\ 0 & 0 & 1 & \cdots & 0 \\ \vdots & \vdots & \vdots & \ddots & \vdots \\ 0 & 0 & 0 & \cdots & 1 \end{pmatrix}$$

output signals, may be implemented by cascading any number of primitive n×n matrix quantizers of the above form, where in successive primitive matrix quantizers, the signal that is altered may be chosen to be a different one of the n signal paths each time.

By way of example, FIG. 23$a$ shows the cascade of two primitive n×n matrix quantizers, the first being as above, and the second accepting the n integer-valued signals $S'_1, S_2, S_3 \ldots, S_n$ and outputting the n integer-valued signals $S'_1, S'_2, S_3, \ldots S_n$ where $$S'_2 = S_2 + \text{quantize}(b_1 S'_1 + b_3 S_3 + \ldots + b_n S_n),$$

and FIG. 23$b$ shows the inverse cascade of two primitive n×n matrix quantizers, the first accepting the n integer-valued signals $S'_1, S'_2, S_3 \ldots, S_n$ and outputting the n integer-valued signals $S'_1, S_2, S_3, \ldots, S_n$ where $$s_2 = S'_2 - \text{quantize}(b_1 S'_1 + b_3 S_3 + \ldots + b_n S_n),$$

and the second being as above in FIG. 22$b$.

Figure 23A:
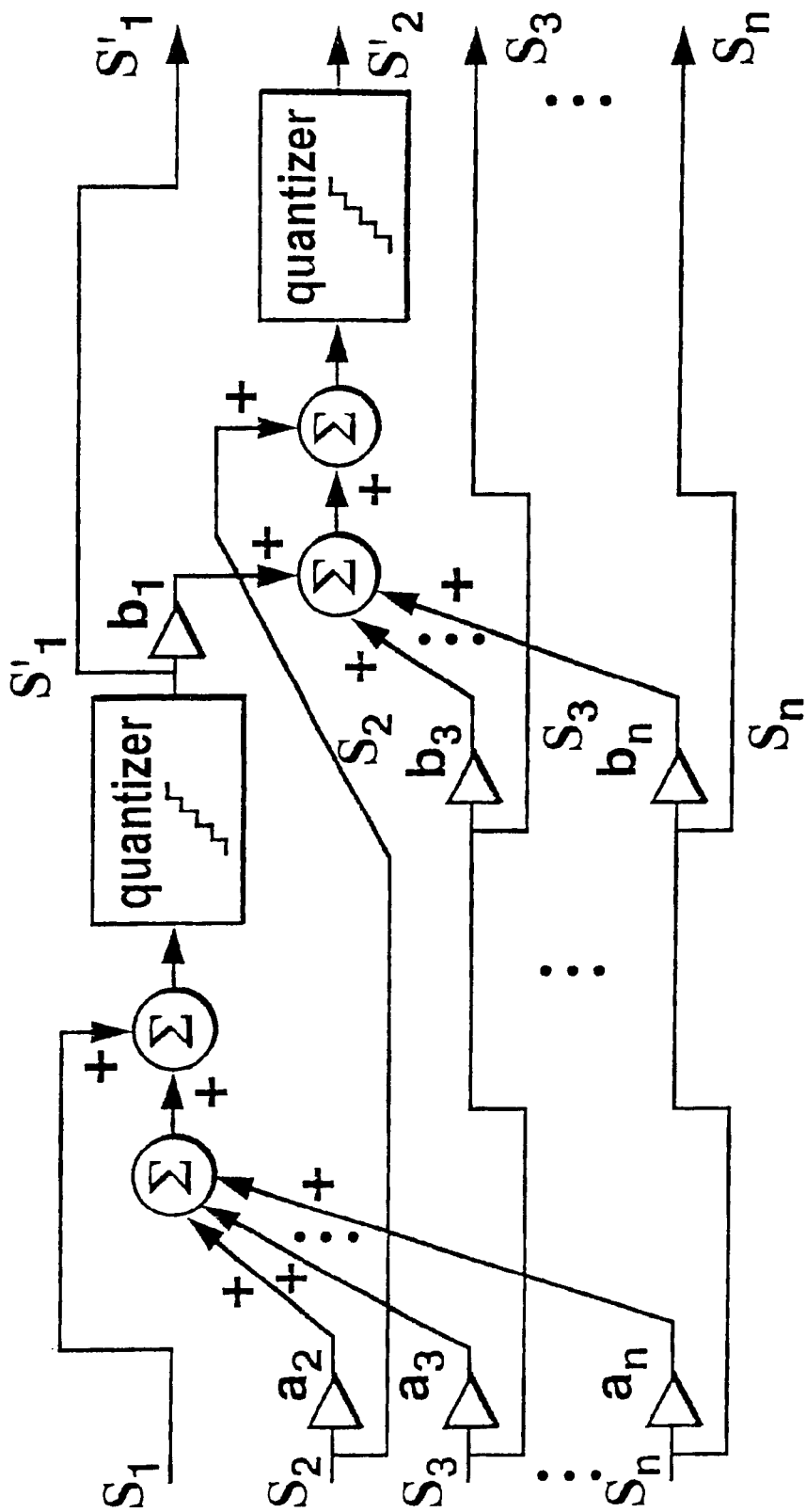
FIG. 23 shows a lossless matrix encoding and inverse matrix decoding quantizer arrangement comprising two cascaded systems of the type of FIG. 22.
Figure 23B:
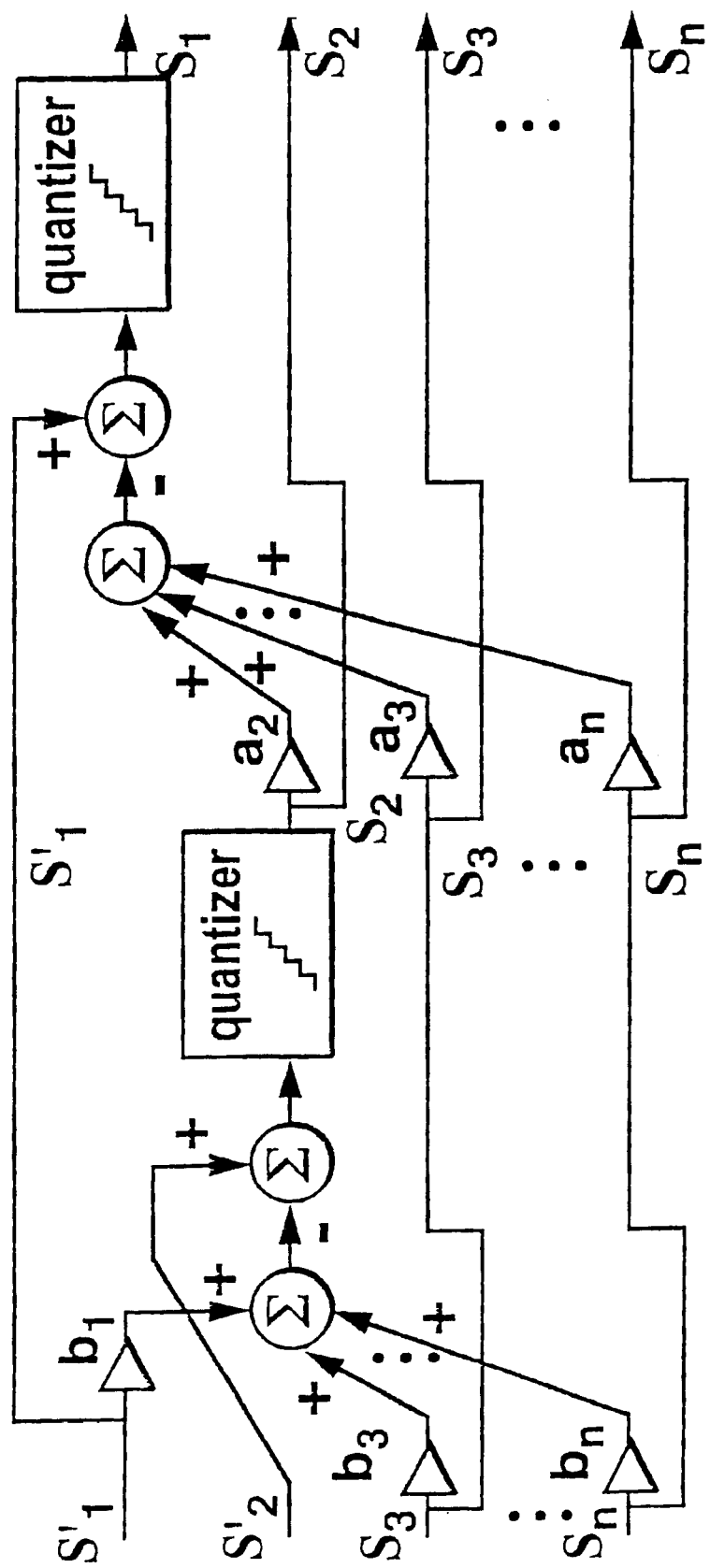

Now, apart from the presence of the quantizers, the cascade of primitive matrix quantizers of FIG. 23$a$ implements an n×n matrix $$\begin{pmatrix} 1 & 0 & 0 & \cdots & 0 \\ b_1 & 1 & b_3 & \cdots & b_n \\ 0 & 0 & 1 & \cdots & 0 \\ \vdots & \vdots & \vdots & \ddots & \vdots \\ 0 & 0 & 0 & \cdots & 1 \end{pmatrix} \cdot \begin{pmatrix} 1 & a_2 & a_3 & \cdots & a_n \\ 0 & 1 & 0 & \cdots & 0 \\ 0 & 0 & 1 & \cdots & 0 \\ \vdots & \vdots & \vdots & \ddots & \vdots \\ 0 & 0 & 0 & \cdots & 1 \end{pmatrix}$$

and the inverse matrix quantizer of FIG. 23b implements an n×n matrix $$\begin{pmatrix} 1 & -a_2 & -a_3 & \cdots & -a_n \\ 0 & 1 & 0 & \cdots & 0 \\ 0 & 0 & 1 & \cdots & 0 \\ \vdots & \vdots & \vdots & \ddots & \vdots \\ 0 & 0 & 0 & \cdots & 1 \end{pmatrix} \cdot \begin{pmatrix} 1 & 0 & 0 & \cdots & 0 \\ -b_1 & 1 & -b_3 & \cdots & -b_n \\ 0 & 0 & 1 & \cdots & 0 \\ \vdots & \vdots & \vdots & \ddots & \vdots \\ 0 & 0 & 0 & \cdots & 1 \end{pmatrix}$$

both matrices having determinant 1. (recall that the determinant of a product of matrices is the product of their individual determinants).

Figure 22A:
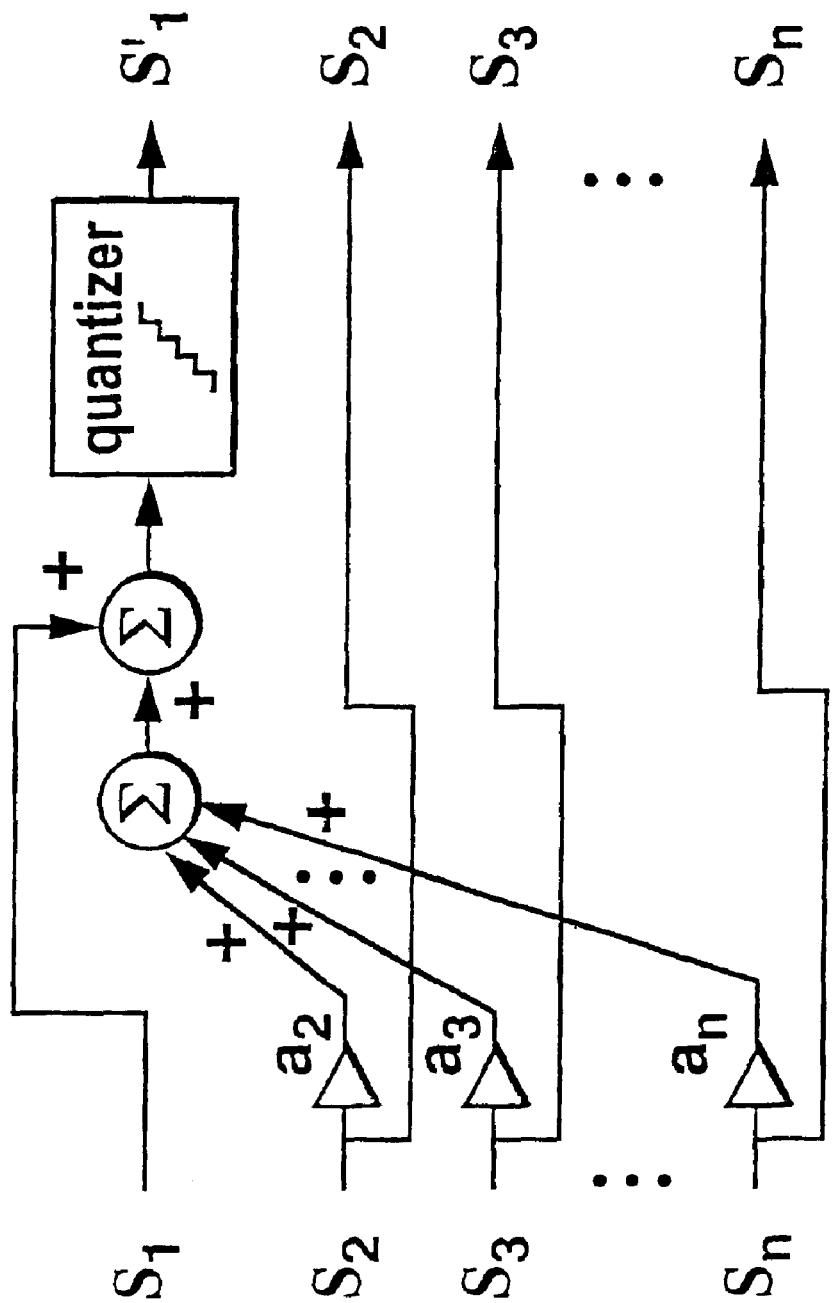
FIGS. 22 show a simple lossless matrix encoding and inverse matrix decoding quantization arrangement altering one channel only.
Figure 22B:
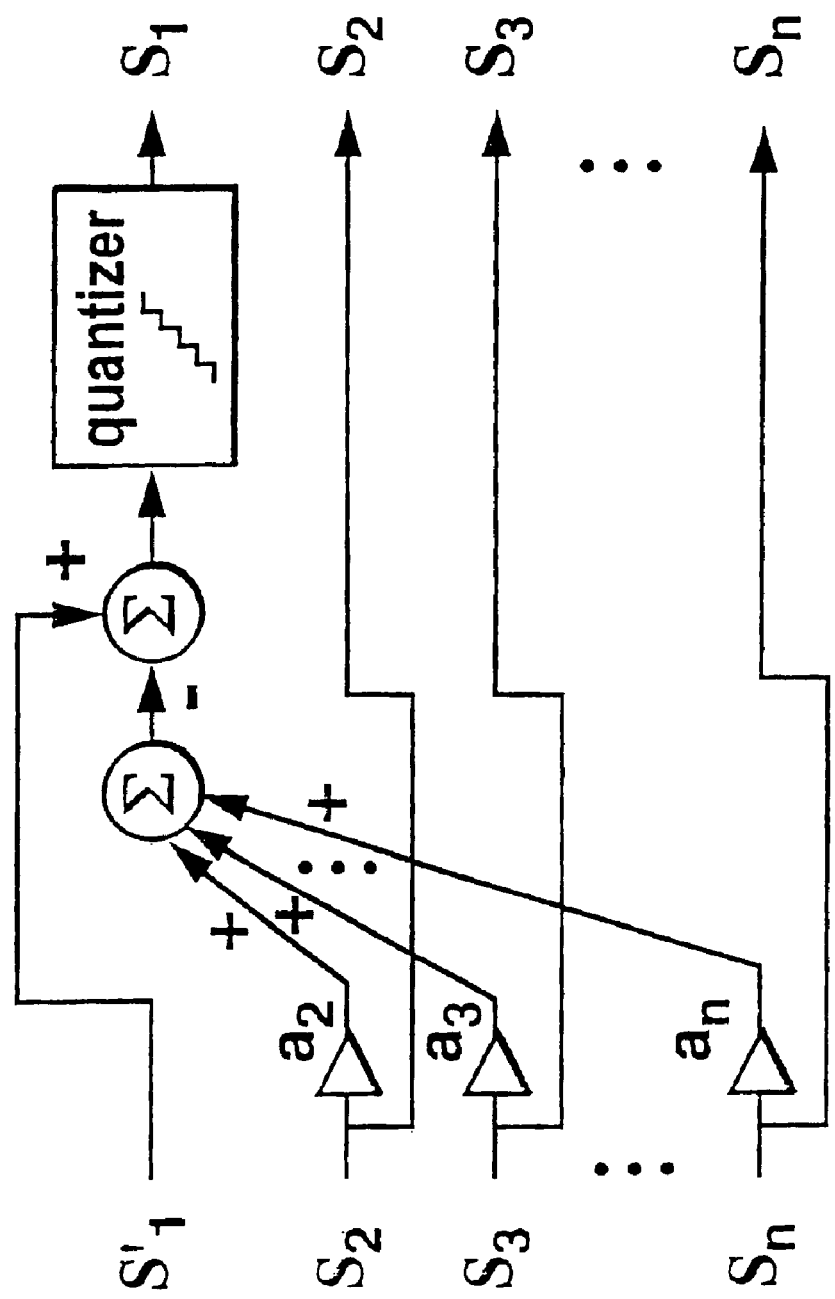

In a similar way, any cascade of primitive n×n matrix quantizers of the kind of FIG. 22a can be inverted to recover the input by a reversed cascade of the inverse primitive n×n matrix quantizers of the kind shown in FIG. 22b, and the resulting matrices have determinant 1. Indeed, any determinant 1 matrix can be represented as the product of such primitive matrices. A general system of this kind in which the effect of the requantization to integer values can be undone by an inverse system will be termed a lossless matrix quantizer.

Normally, there is no need to cascade more than n primitive n×n primitive matrix quantizers, each one altering a different input channel, to achieve an efficient lossless matrix quantizer that minimises the encoded data rate of the n output signals, although one can cascade any number.

By way of example of a 2×2 lossless matrix quantizer, consider the case of FIG. 23a where n=2 and $a_2=-1$, and where $b_1=½$. This implements a 2×2 matrix $$\begin{pmatrix} 1 & -1 \\ \frac{1}{2} & \frac{1}{2} \end{pmatrix}$$

where the first output needs no quantizer (being an integer-valued difference signal) but the second is a sum signal divided by 2 and followed by a quantizer.

This allows efficient lossless coding of signals where the energy of the difference signal is much smaller than that of the sum signal, as is the case with 2-channel stereo signals that have most of their energy in the centre of the stereo stage. The inverse decoding lossless matrix of FIG. 23b implements with a quantizer before the second stage the inverse matrix $$\begin{pmatrix} \frac{1}{2} & 1 \\ -\frac{1}{2} & 1 \end{pmatrix}$$

More generally, in the 2×2 case, the determinant 1 matrix $$\begin{bmatrix} 1 & a_2 \\ b_1 & 1+a_2 b_1 \end{bmatrix}$$

is implemented in the encoding matrix quantizer and the inverse matrix $$\begin{bmatrix} 1+a_2 b_1 & -a_2 \\ -b_1 & 1 \end{bmatrix}$$

is implemented in the decoder. One can arrange that the rows of the first matrix and the columns of the second are orthogonal vectors by putting $$b_1 = \frac{-a_2}{1+a_2^2}$$

Quantizing along orthogonal axes in this way generally minimises the data rate of the output if the axes are chosen along the directions of the eigenvectors of the correlation matrix of the input signal.

Clearly, lossless matrix quantizers can be cascaded with lossless encoding filters of the kind described earlier with reference to FIGS. 1 to 14 in each or any of the input or output signal paths to form a composite lossless coding system for n integer valued signals, since the reversed cascade of inverse decoding systems will recover the original n integer valued signals.

However, there is a n×n matrix version of the generic 1-channel waveform lossless coding and decoding system of FIGS. 6 and 15 according to the invention which we now describe with reference to FIG. 24.

FIG. 24a shows an encoder for encoding n distinct but related integer waveform signals into n integer waveform signals of lower energy for transmission at reduced data rates. As in the single channel (or so-called "scalar") case, an n-channel summing node is followed by an n-channel quantizer, which is simply a separate integer quantizer or rounding operation in each of the n channels. However, in this case, the n-channel quantizer feeds a lossless n×n matrix quantizer 1b, which in turn feeds the n-channel output as well as an n×n matrix FIR filter $B(z^{-1})$ having at least a one-sample delay with finite precision fractional coefficients all with denominator d, whose n channel outputs are subtracted from the summing node. The n-channel integer-valued input signal similarly feeds the summing node directly via a lossless n×n matrix quantizer 1a, and also via an n×n matrix FIR filter $A(z^{-1})$ having at least a one-sample delay with finite precision fractional coefficients all with denominator d. n×n matrix FIR filters are simply filter arrangements whereby each of n inputs feed each of n outputs via an FIR filter, giving up to $n^2$ FIR filter paths (some may be omitted if they have zero coefficients). By way of example, FIG. 25 shows a 2×2 2nd order matrix FIR filter having at least a one-sample delay. FIG. 25 also shows the state variables $I_{ij}$ of the filter.

The inverse decoder to the encoder of FIG. 24a is shown in FIG. 24b. This has the same form as the encoder except that: (1) the matrix FIR filters $A(z^{-1})$ and $B(z^{-1})$ are interchanged, (2) the n×n matrix quantizer 1a is replaced by the n×n matrix quantizer inverse to 1b and the n×n matrix quantizer 1b is replaced by the n×n matrix quantizer inverse to 1a, and (3) the n-channel quantizer in the decoder is equivalent in performance to the n-channel quantizer in the encoder preceded and followed by phase inversion.

An alternative but exactly equivalent architecture for the encoder and decoder for n channels is shown respectively in FIGS. 25c and 25d, where the quantizer is moved to follow the difference of the outputs of the two filters but precedes the summation node handling signal paths handling integer-valued signals, since placing an addition or subtraction node before or after an integer quantizer does not affect results where all signals are integer valued. We have however, in FIG. 24d, chosen polarities at the summing nodes such that the quantizer used in the inverse decoder is identical to that used in the encoder (unlike the case of FIG. 25b).

Other architectures for implementing the n channel encoding version of the invention are shown in other FIGS. 24e, 24g, 24i and 24k and corresponding inverse decoding forms are shown in FIGS. 24f, 24h, 24j and 24l.

Figure 24C:
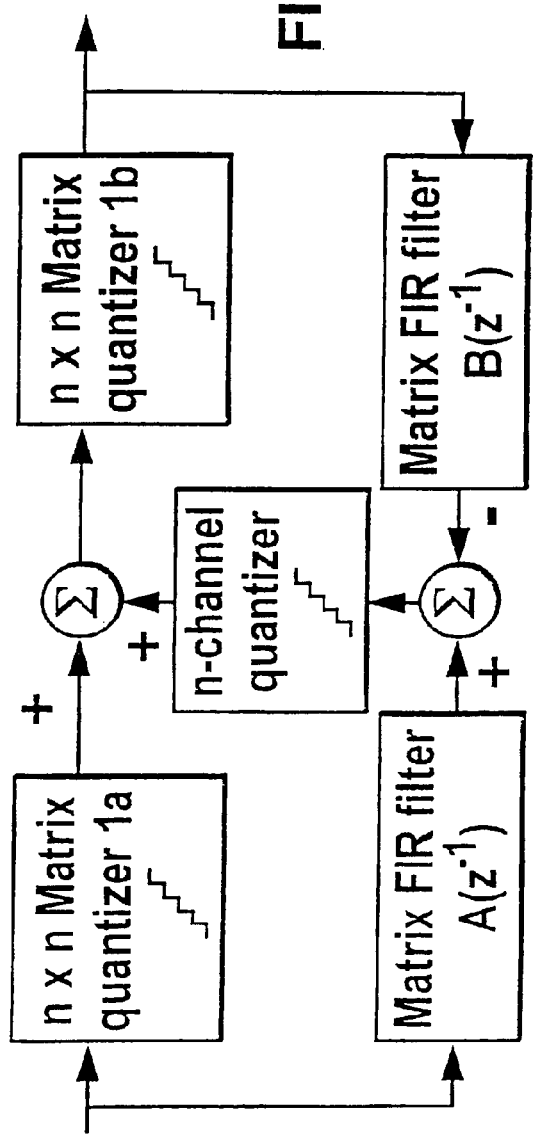
Figure 24D:
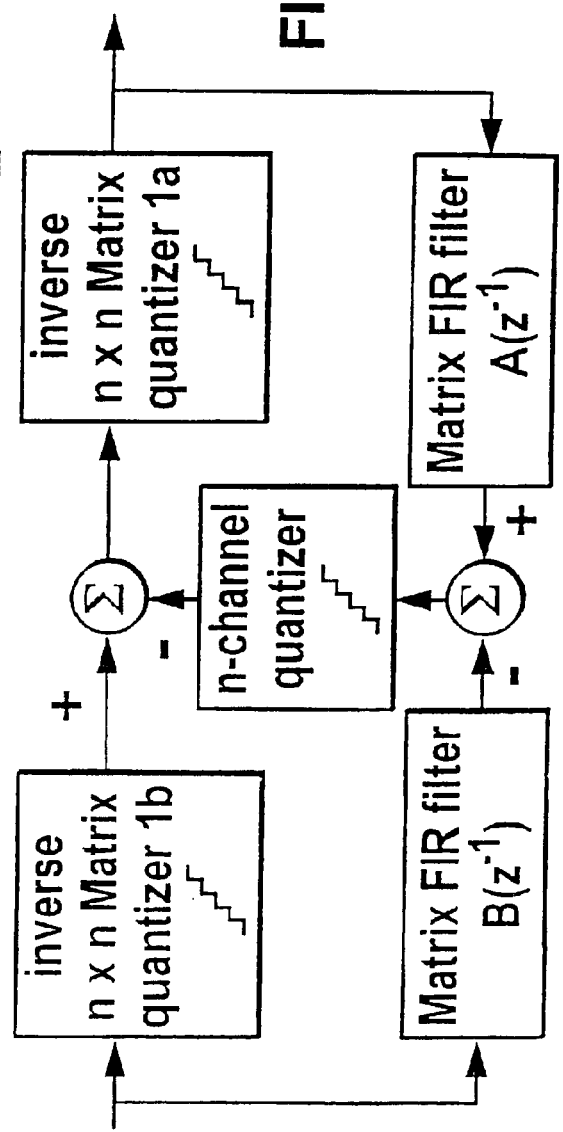
Figure 24E:
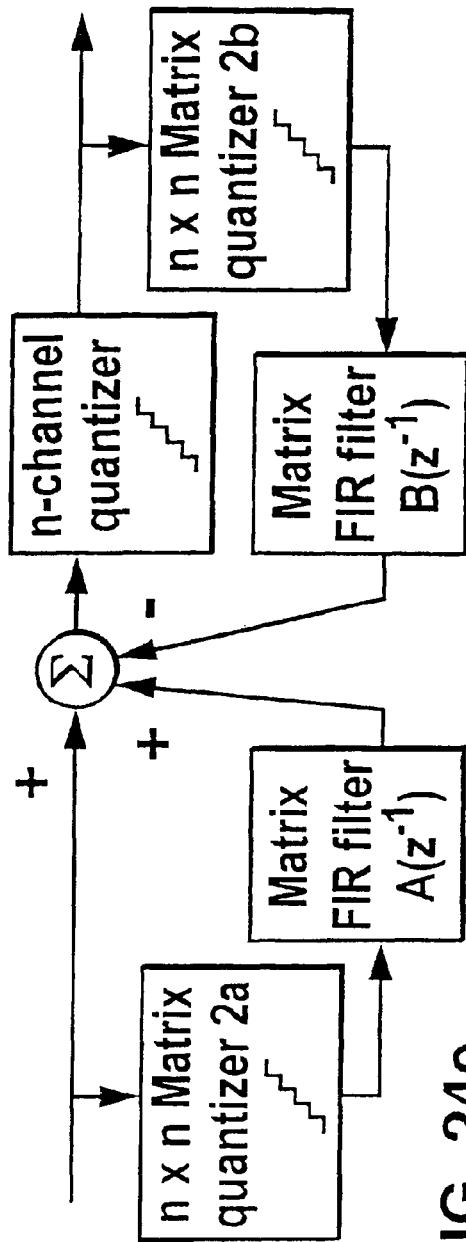
Figure 25:
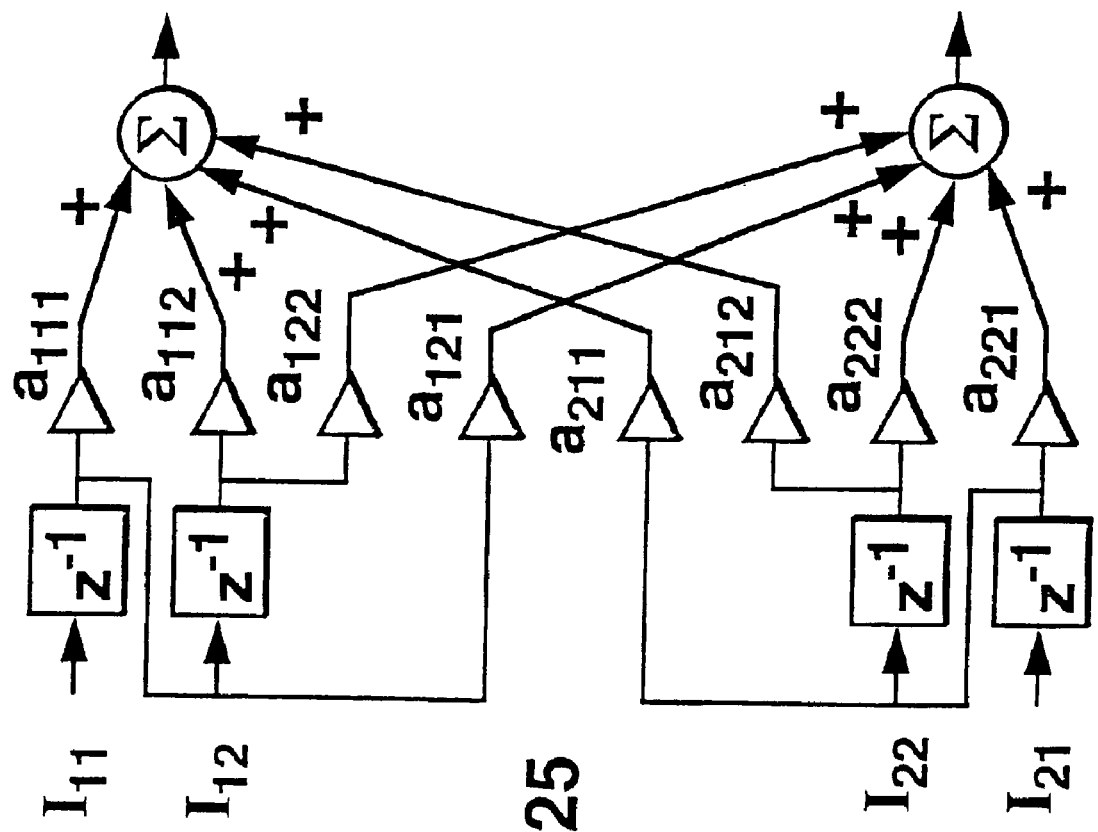
FIG. 25 shows a 2×2 second order matrix FIR filter with delay of at least one sample.

The encoders of FIGS. 24e and 24g are exactly equivalent, and differ from the previous encoders in placing lossless n×n matrix quantizers in the filter path preceding the n×n matrix filters rather than the direct paths. At first sight, these may seem to be unrelated to the encoders of FIG. 24a or 24c, but in fact they are closely related and merely variants on the same invention.

The encoder of FIG. 24a or 24c may be converted to be exactly equivalent to that of FIG. 24e or 24g by preceding it by an inverse n×n matrix quantizer 1a and following it by an inverse n×n matrix quantizer 1b, if one puts the n×n matrix quantizer 2a equal to the inverse n×n matrix quantizer 1a and one puts the n×n matrix quantizer 2b equal to the inverse n×n matrix quantizer 1b.

Figure 24F:
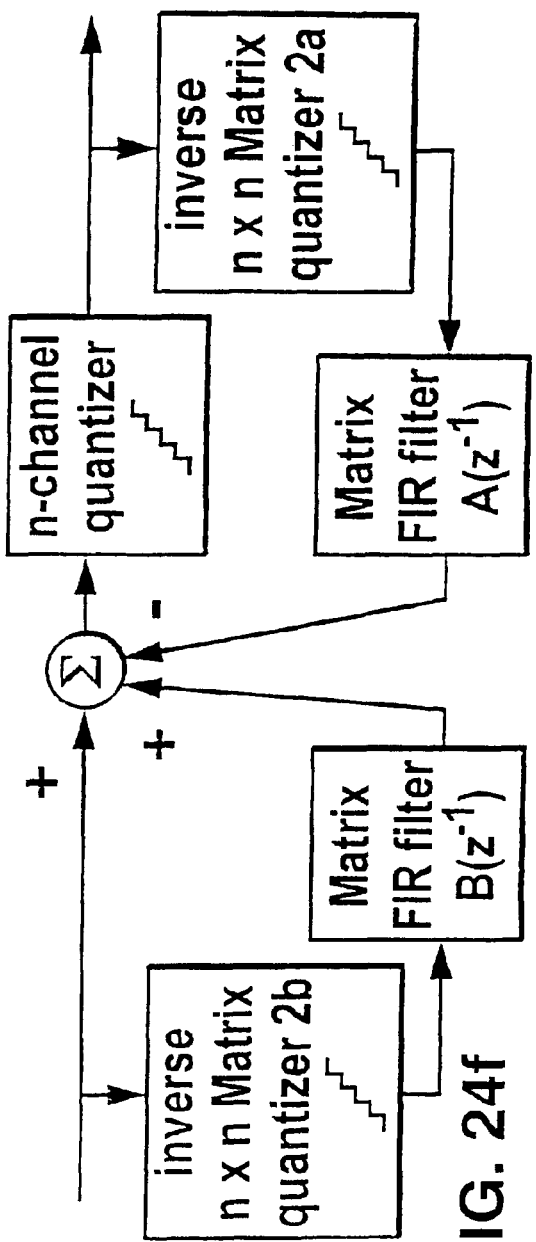

Similarly, the encoder of FIG. 24e or 24f may be converted to be exactly equivalent to that of FIG. 24a or 24c by preceding it by an inverse n×n matrix quantizer 2a and following it by an inverse n×n matrix quantizer 2b.

Similarly, the corresponding inverse decoders may be converted to be exactly equivalent to each other by preceding and following the decoder by appropriate inverse n×n matrix quantizers.

Figure 24I:
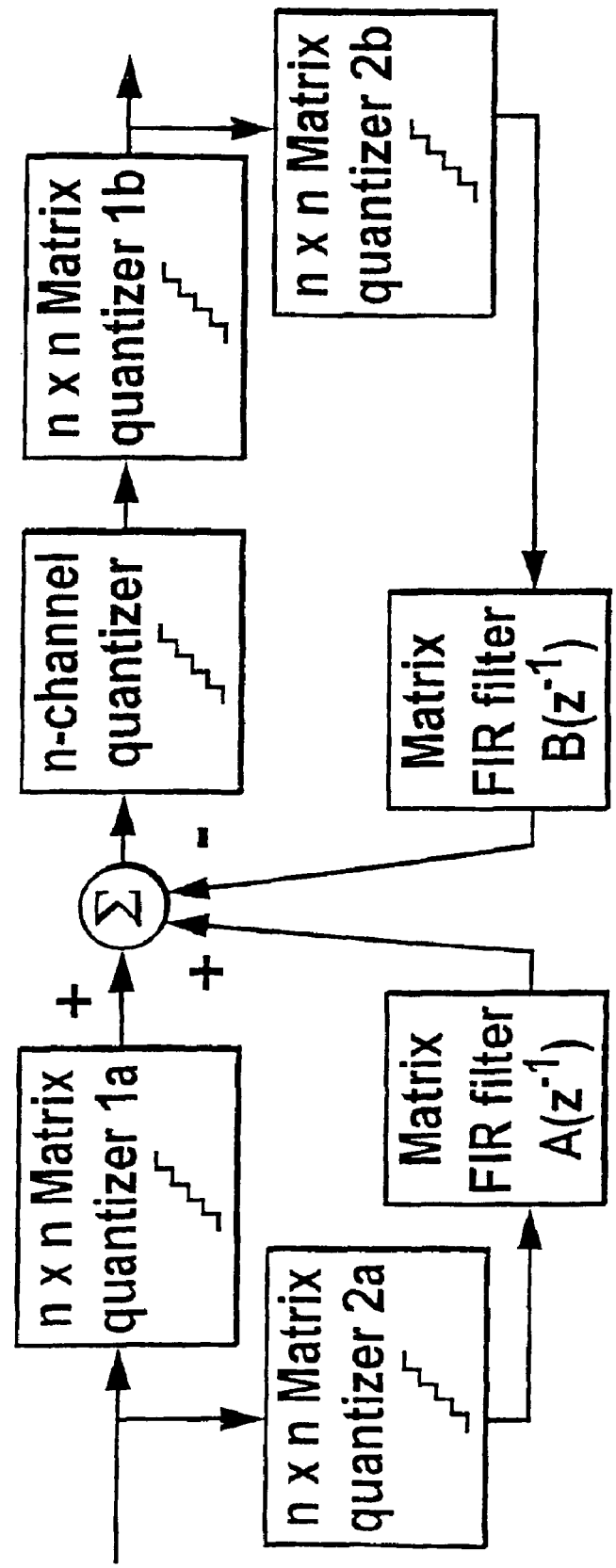
Figure 24J:
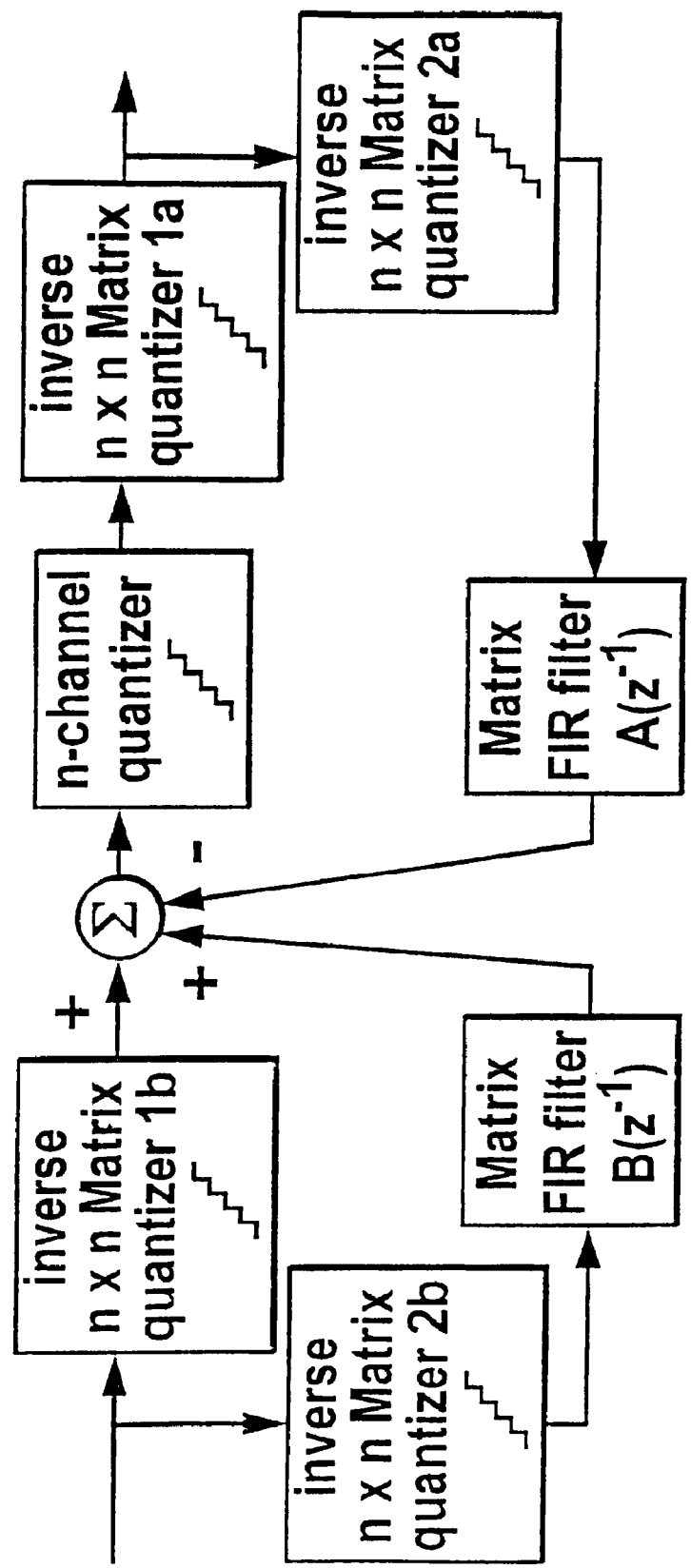
Figure 24K:
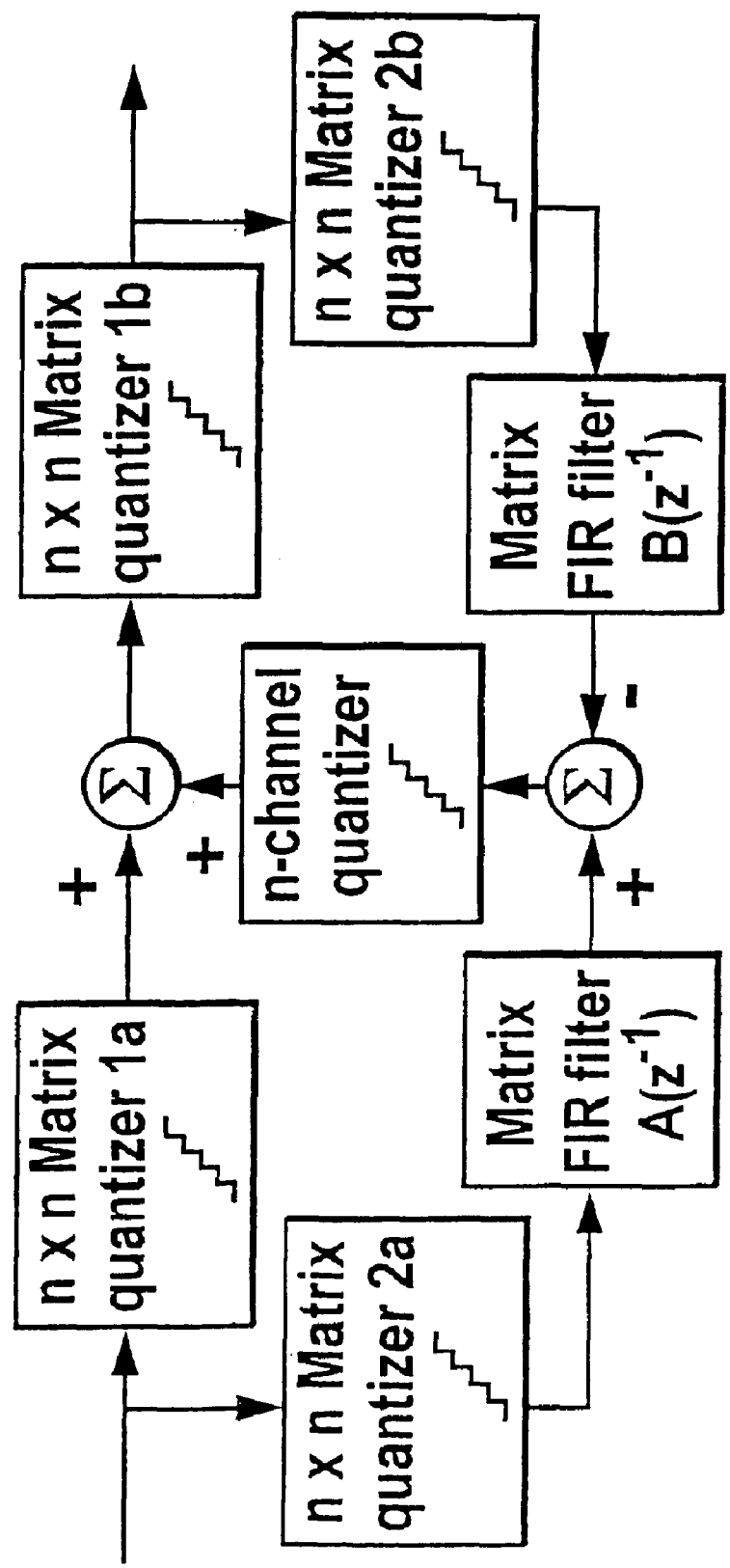
Figure 24I:
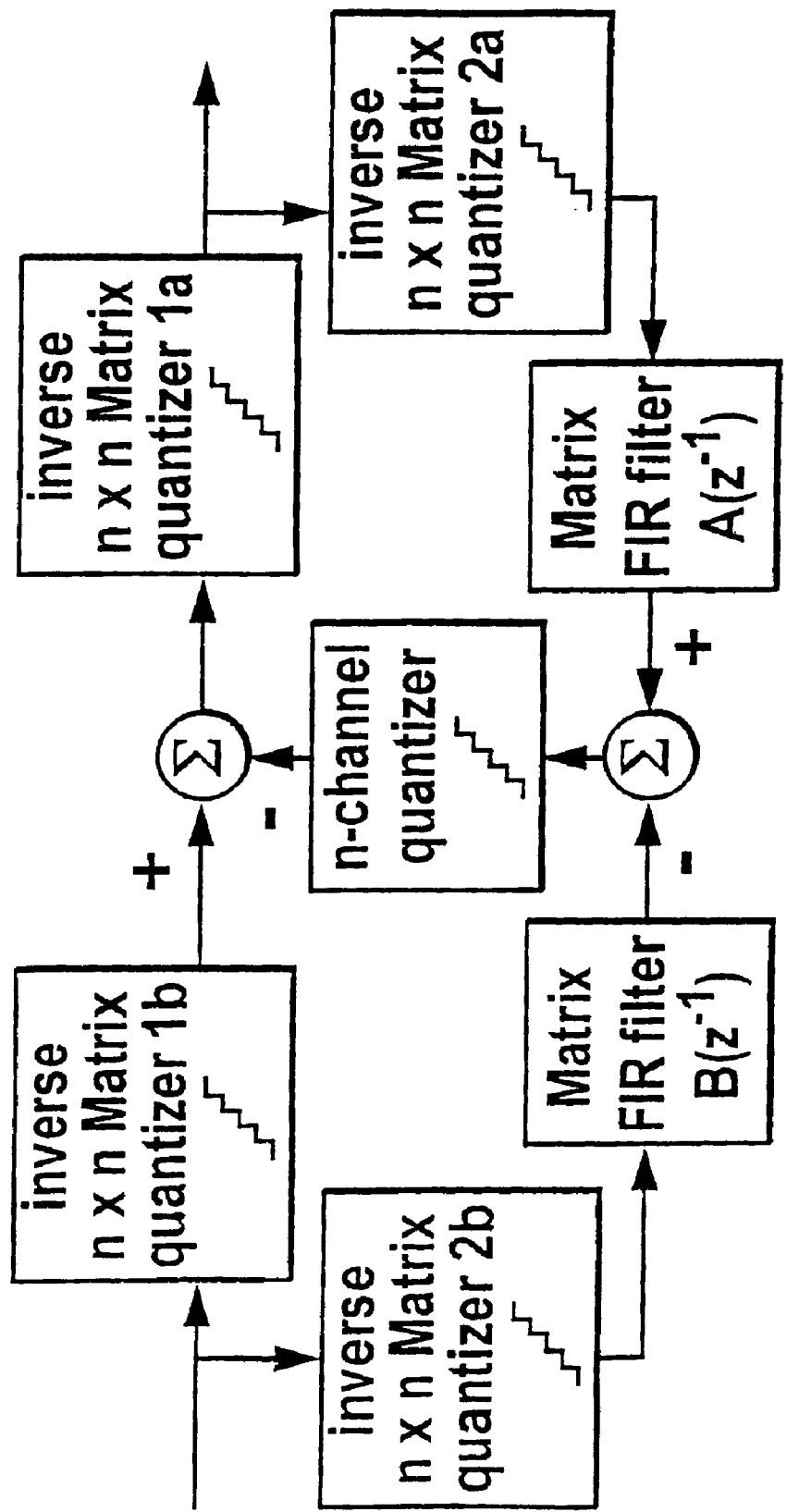

Both previous architectures may be combined in the encoders shown in FIG. 24i or 24k, which are exactly equivalent in performance to each other, putting n×n matrix quantizers both in the direct and in the filter paths, in the latter case preceding the filters. One or more of the n×n matrix quantizers may, if desired, be "trivial" in the sense of doing nothing, with their output equalling input.

Note that in the case of the decoders of FIGS. 24b, 24f and 24j respectively inverse to the encoders of FIGS. 24a, 24e and 24i, that the decoder n-channel quantizer should be equivalent in performance to the encoder n-channel quantizer both preceded and followed by a polarity inversion. However, in the case of the decoders of FIGS. 24d, 24h and 24l respectively inverse to the encoders of FIGS. 24c, 24g and 24k, the encoder and decoder n-channel quantizers should be equivalent in performance.

These varied architectures give considerable scope for varied algorithmic implementation of what are functionally identical encoding or decoding quantizing filters.

In all cases in the description of this invention, moving summing nodes handling signals quantized to a step size G from before to after an quantizer with step size G or vice-versa does not change the nature of the invention, but is merely an obvious variant of implementation.

Additionally, cascading or combining or splitting lossless n×n matrices does not change the invention in any essential aspect, but again is a detail of implementation.

The n-channel quantizers used in the n-channel version of the invention may if desired incorporate noise shaping as in the scalar case, using either integer-valued inner-form noise shapers as in FIG. 9 or outer-form noise shapers as in FIG. 12, or even a nested combination of the two. In the n-channel case the filters $C(z^{-1})$ or $D(z^{-1})$ may if desired be n×n matrix FIR filters with at least one sample of delay. This option allows noise shaping to be designed that has a specific desired correlation matrix, possibly one matching that of the encoded signal so as to minimise the transmitted data rate at low signal levels.

In general, n×n matrix encoding and decoding requires the transmission of many more filter coefficients that does the separate encoding of n channels, and this can add to data overheads if one is not careful, possibly negating the data rate improvements from coding taking advantage of the correlation between channels. For this reason, it may often be preferred to use simplified encoders and decoders not ideally matched to the n-channel signal statistics.

Ignoring the effect of the quantizers, the n×n matrix filter response of the encoding system of FIG. 24a or 24c is given by $$M(z^{-1}) = (M_{1b} + B(z^{-1}))^{-1}(M_{1a} + A(z^{-1})) =$$
$$(1 + M_{1b}^{-1}B(z^{-1}))^{-1}(1 + M_{1b}^{-1}A(z^{-1})M_{1a}^{-1}M_{1b})M_{1b}^{-1}M_{1a}$$

where $M_{1b}$ is the determinant 1 matrix of the n×n matrix quantizer 1b and $M_1$, is the determinant 1 matrix of the n×n matrix quantizer 1a and where the inversion is matrix inversion and multiplication is matrix multiplication. The Fourier transform with respect to discrete time of $M(z^{-1})$ is the n×n matrix frequency response M-(F) of the encoding system, and the n×n spectral matrix of the output of the encoding system is $$S'(F) = M\sim(F) \ S(F) M\sim(F)$$

where S(F) is the n×n spectral matrix as a function of frequency of the input signal and where indicates the matrix Hermitian adjoint. Recall that the Hermitian adjoint of a matrix with complex-valued entries $m_{ij}$ is the matrix with complex-valued entries $(m_{ij})$ where * is complex conjugation. Ideally, one would choose for minimum encoded data rate this spectral matrix S' (F) to be white and with eigenvector axes aligned along the output channel vector directions in the following sense:

The ideal n-channel encoding system such as that of FIG. 24c would choose n×n matrix quantizers and n×n matrix filters matched to the n-channel signal statistics at that moment, with the aim of approximating a white output spectrum in all channels such that (1) all linear combinations of the output channels also have a white spectrum, and (2) the eigenvectors of the correlation matrix of the output signal from the n channels lies in the vector direction of the n channels. For the theory of multichannel correlations and spectra, see for example chapter 3 of the book A. M. Yaglom, An Introduction to the Theory of Stationary Random Functions, Prentice-Hall, 1962 and Dover Publications 1973. In practice, as in the scalar case, one may often simply pre-select a number of n-channel encoder coefficients matched reasonably well to the most likely signal spectra and distribution of energies in the n channels, based on measurement of the spectral matrices of typical signals.

In general, n×n matrix encoding and decoding with filter order m can require the transmission of many more (up to $2nm^2$) filter coefficients than does the separate encoding of n channels, and this can add to data overheads if one is not careful, possibly negating the data rate improvements from coding taking advantage of the correlation between channels. For this reason, it may often be preferred to use simplified encoders and decoders not ideally matched to the n-channel signal statistics.

Figure 26A:
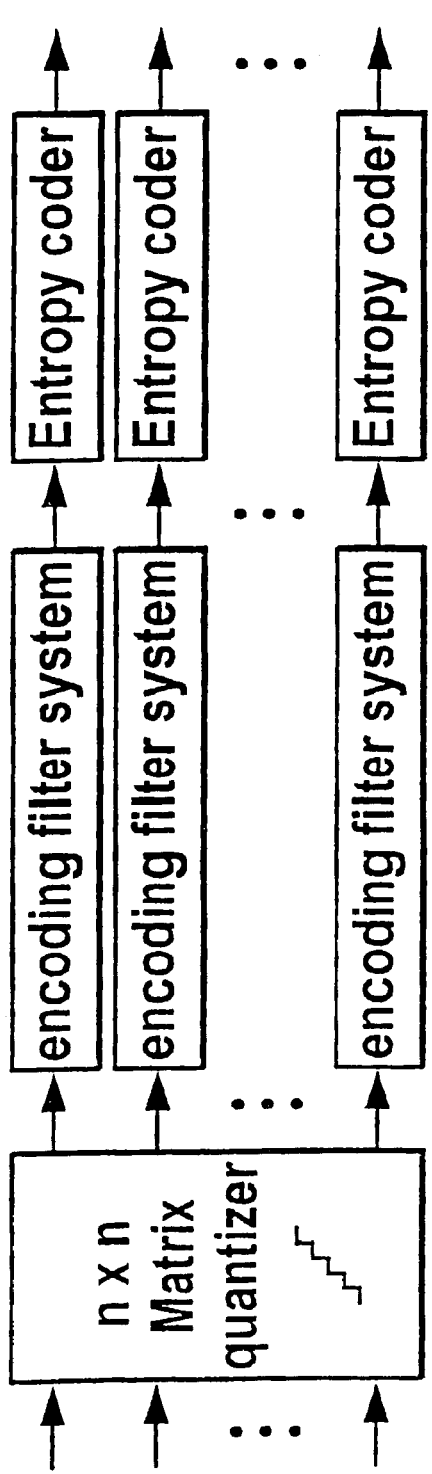
FIG. 26 shows a simplified encoding system for n-channel signals and the corresponding inverse decoder.

The simplest lossless encoders for n channels comprise an initial n×n matrix quantizer followed by n separate 1-channel lossless encoding filter arrangements for each of the n outputs, using a possibly different set of filter and noise shaping coefficients for each. Such encoding systems are shown in FIG. 26a and the inverse decoding systems in FIG. 26b. In this case, reduction of data rate requires a suitable choice to be made for the input n×n matrix quantizer of the encoder.

This can be done in various ways. It is advantageous to arrange that the first primitive n×n matrix quantizer produces the greatest data rate reduction, and that the next in the cascade (if any) produces the next greatest degree of data rate reduction, and so forth. Often, most of the data rate reduction from correlations between channels will be obtained from the first one or two primitive n×n matrix quantizers in the cascade, so that it will in practice often be necessary only to use one or two stages in the cascade for the n×n matrix quantizer to achieve most of the attainable data rate reduction.

Thus the first primitive n×n matrix quantizer stage of the n×n matrix quantizer in the encoder will generally be selected to act on a channel and to matrix it into that vector direction in the n channels that encodes with lowest data rate. Preferably choose that channel whose direction is closest to that vector direction in the n channels that encodes with lowest data rate.

For example, for a 2-channel stereo signal, often the predominant energy will be in the "sum" L+R direction and the least energy in the "difference" L−R direction of the left L and right R channels. In that case, one would convert the largest energy of the two channels into a difference direction by putting $a_2 = -1$ or similar values in the FIG. 22a. More generally, if the most energy is concentrated in the Lcos θ+Rsin θ direction and the least energy in the −Lsin θ+Rcos θ direction, then if $-45 \leq \theta \leq 45$ degrees choose $S_1 = R$, $S_2 = L$ and $a_2 = \tan \theta$ approximately, and if $45 \leq \theta \leq 135$ degrees choose $S_1 = L$, $S_2 = R$ and $a_2 = \cot \theta$ approximately in the primitive n×n matrix quantizer of FIG. 22a.

In this example of 2-channel stereo sound, one uses the fact that in many cases, energy is concentrated primarily in one vector direction θ in the two stereo channels and chooses to use a 2×2 lossless matrix quantizer so that one of the outputs as far as possible cancels out the dominant energy component.

A crude estimate of the vector direction in the n channels that encodes with lowest data rate is given by the vector direction in the n channels that has lowest energy. That direction may be computed for a length L block of samples by computing the n-channel correlation matrix for the block. If the value of the signal at the i'th sample in the p'th channel is $x_{pi}$, then this correlation matrix is the matrix M with entries $$m_{pq} = \sum_{i=1}^{L} x_{pi} x_{qi}$$

The eigenvectors and associated eigenvalues of this matrix are then calculated, and the direction with least energy is the direction of that eigenvector having the smallest eigenvalue. In the case of 2-channel signals, the direction q in the above stereo example is given by noting that the 2×2 correlation matrix has the form $$\begin{pmatrix} m\cos^2\theta & \frac{1}{2}km\sin 2\theta \\ \frac{1}{2}km\sin 2\theta & m\sin^2\theta \end{pmatrix}$$

with $k \leq = 0$.

However, this estimate of the vector direction in the n channels that encodes with lowest data rate is crude in that it can be biased by high-energy but low data-rate signals (such as loud bass audio) in other directions. A more sophisticated, but more computationally complicated, estimate can be obtained based on the data rate by a procedure outlined here.

The spectral matrix S(F) as a function of frequency of the n-channel signal over a windowed block is first computed, using conventional FFT (Fast Fourier transform) or similar known methods. The matrix S(F) with matrix entries $S(F)_{pq}$, p, q=1, . . . , n at each frequency is then expanded in terms of its eigenvalues and orthonormal basis of eigenvectors $\phi_p(F) = (f_{p1}(F), \ldots, f_{pn}(F))$, such that $$S(F)_{pq} = \sum_{r=1}^{n} \lambda_r(F) f_{rp}(F) f_{rq}(F)'$$

The logarithm ln(S(F)) of the n×n matrix S(F), itself an n×n matrix, defined by the formula $$\epsilon(S(F))_{pq} = \sum_{r=1}^{n} \ln(\lambda_r(F)) f_{rp}(F) f_{rq}(F)'$$

is then computed.

The average value of this matrix over all frequencies F from 0 to Nyquist frequency N provides an estimate of the optimal directions for encoding for that signal. This n×n "average logarithm" matrix $$M_{pq} = \frac{1}{N} \int_0^N \ln(S(F))_{pq} dF$$

defines the optimum coding vector directions as being the directions of its eigenvectors, with the vector direction in the n channels that encodes with lowest data rate being the direction of that eigenvector that has the smallest eigenvalue.

The computations of eigenvectors and eigenvalues of matrices involved in this estimate for optimum coding vector direction requires considerable numerical power, especially in real time encoders. The amount of computation can be reduced somewhat by approximating the integral by a sum whereby the expensive computation of $\ln(S(F))_{pq}$ is computed not for every single frequency but as $$\frac{1}{b} \left( \ln \left( \int_{F-b/2}^{F+b/2} S(x) dx \right) \right)_{pq}$$

over a frequency band F b/2 to F+b/2 of bandwidth b. The bandwidth b over which this is done can be arranged to be wider at high frequencies than at low frequencies to reduce the amount of computation needed further, maybe by arranging the bandwidth b to be perhaps the maximum of one third of an octave and a preset minimum value.

The logarithm ln(M) of a matrix M can also be computed more cheaply by an approximation procedure of the form ln(M)=p(M) approximately where p(x) is a polynomial or rational function known to approximate ln(x) over a wide dynamic range of values of x.

An efficient approximation roughly equal to the natural logarithm of x plus a constant over a wide dynamic range of values $e^{-3(a-a-1)} < x < e^{3(a-a-2)}$ of the matrix eigenvalues is given by using the approximate rational computation $$\ln(M) + \text{constant} =$$

$$f(e^{2.5(a-a^{-1})M}) + f(e^{1.5(a-a^{-1})M}) + f(e^{0.5(a-a^{-1})M}) + f\left(\frac{M}{e^{0.5(a-a^{-1})}}\right) +$$

$$f\left(\frac{M}{e^{1.5(a-a^{-1})}}\right) + k(1-a^{-2})\left(\frac{M}{e^{2.5(a-a^{-1})}}\right)$$

where $$f(x) = \frac{1-a^2}{a+x}$$

where a 5.4 approximately and k=0.82 for the logarithmic approximation to be reasonable (accurate to ±0.3) over the 120 dB range $10^6 < x < 10^6$. This method of computing the logarithm of a matrix uses five matrix inversions and is computationally more efficient than the computation via eigenvectors and eigenvalues, and is of adequate accuracy in this application. The constant does not affect the determination of eigenvectors.

However, one eigenvector and eigenvalue computation is still required to determine the vector direction having minimum data rate. The vector $(1, a_2, \ldots, a_n)$ of coefficients used in the primitive n×n matrix quantizer of FIG. 22a will be a rational approximation proportional to this vector.

However, once estimated, the implementation of the primitive n×n quantizer of FIG. 22a is simple and requires the transmission to the decoder of only n 1 coefficients.

The matrix encoding procedure for reducing data rate becomes considerably simpler in cases where one can use a priori information about correlations between channels.

By way of example, consider an audio system conveying 7 channels of audio waveform data, five of which are used for 5-loudspeaker surround sound and two for 2-loudspeaker stereo. In many cases, the stereo signal will approximate a mixdown from the surround-sound signals, so in principle will be conveying little new data. Denote here the left and right stereo signals as Lt, Rt and the 5 surround sound signals by $L_3$, $C_3$, $R_3$, $L_s$ and $R_s$ for respective signals intended for the left front, centre front, right front, left surround and right surround loudspeakers.

Then typically, one may choose to mixdown the left and right stereo signals via mixing equations such as $Lt=g_F((0.5+0.5w_F)L_3+k_1C_3+(0.5\ 0.5w_F)R_3)+g_S((0.5+0.5w_S)L_s+(0.5\ 0.5w_S)R_S)$ $Rt=g_F((0.5+0.5w_F)L_3+k_1C_3+(0.5\ 0.5w_F)R_3)+g_S((0.5+0.5w_S)L_s+(0.5\ 0.5w_S)R_S)$ where $g_F$ is gain of front channels, $w_F$ is width of front channels, $k_1$ is relative gain of centre, $g_S$ is gain of surround channels, and $w_s$ is width of surround channels in the stereo mixdown.

In this case, if the mixdown coefficients are known, one has the known mathematical relationships $L_3=(1/g_F)((0.5+0.5/w_F)Lt\ k_1C_3+(0.5\ 0.5/w_F)Rt)-(g_S/g_F)((0.5+0.5w_S/w_F)L_s+(0.5-0.5w_S/w_F)R_S)$ $R_3=(1/g_F)((0.5+0.5/w_F)Lt\ k_1C_3+(0.5+0.5/w_F)Rt)-(g_S/g_F)((0.5-0.5w_S/w_F)L_s+(0.5+0.5w_S/w_F)R_S)$ If the Lt and Rt channels are transmitted in addition to $L_3$, $C_3$, $R_3$, $L_S$ and $R_S$, however, these mathematical relationships will not be quite exact since there will be various rounding errors and approximations involved in deriving the stereo signals. However, one can transmit instead of $L_3$ and $R_3$ the outputs of two primitive 6×6 matrix quantizers as in FIG. 22a implementing rational approximations to $L'_3=L_3-(1/g_F)((0.5+0.5/w_F)Lt-k_1c_3+(0.5\ 0.5/W_F)\ Rt)+(g_S/g_F)((0.5+0.5/w_Sw_F)LS+(0.5-0.5w_S/w_F)R_S)$ $R'_3R_3(1/g_F)((0.5+0.5/w_F)Lt-k_1c_3+(g_S/g_F)((0.5\ 0.5w_S/w_F)LS+(0.5+0.5w_S/w_F)R_S)$ and add into the transmitted headers for $L'_3$ and $R'_3$ the rational approximations used in the primitive 6×6 matrix quantizers of FIG. 22a for the 5 coefficients $(0.5+0.5/w_F)/g_F$, $-k_1/g_F$, $(0.5\ 0.5/w_F)/g_F$, $-(g_S/g_F)((0.5+0.5w_S/w_F)$, and $(g_S/g_F)((0.5-0.5w_S/w_F)$.

Figure 26B:
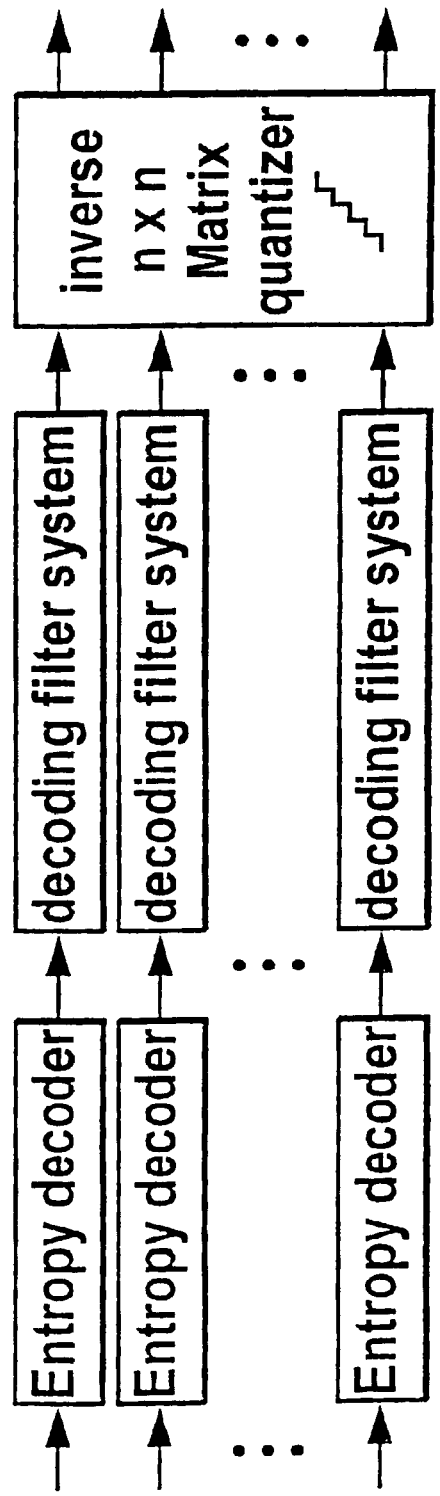

One then, as shown in FIG. 26a, encodes the 7 channels Lt, Rt, $L'_3$, $C_3$, $R'_3$, $L_S$ and $R_S$ using encoding filters and entropy coders in the manner described herein above. The channels $L'_3$ and $R'_{13}$ are encoded with a greatly reduced data rate, being small in magnitude. The inverse decoding is as shown in FIG. 26b, where the transmitted coefficients are loaded into the inverse primitive 6×6 matrix quantizers of FIG. 22b to recover losslessly the signals $L_3$ and $R_3$.

Figure 26C:
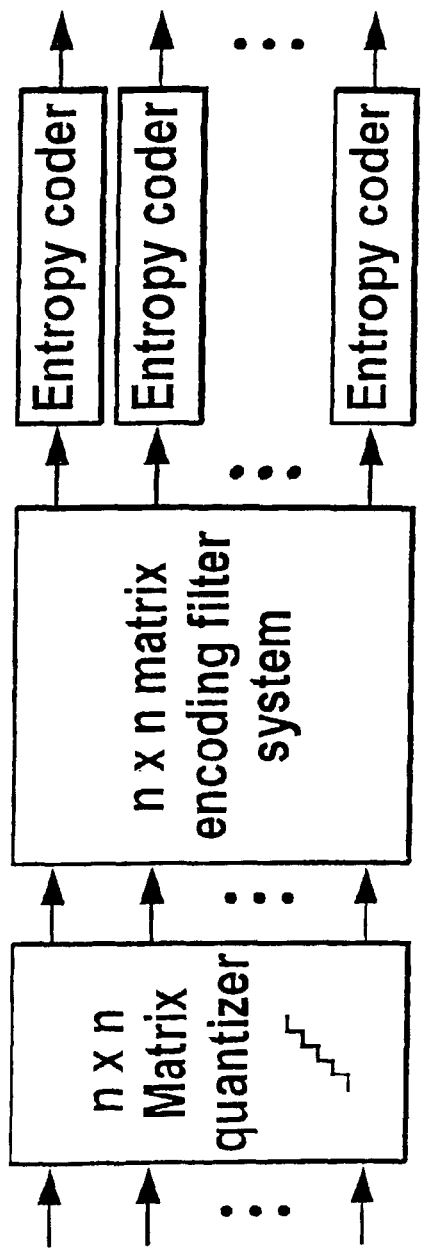
Figure 26D:
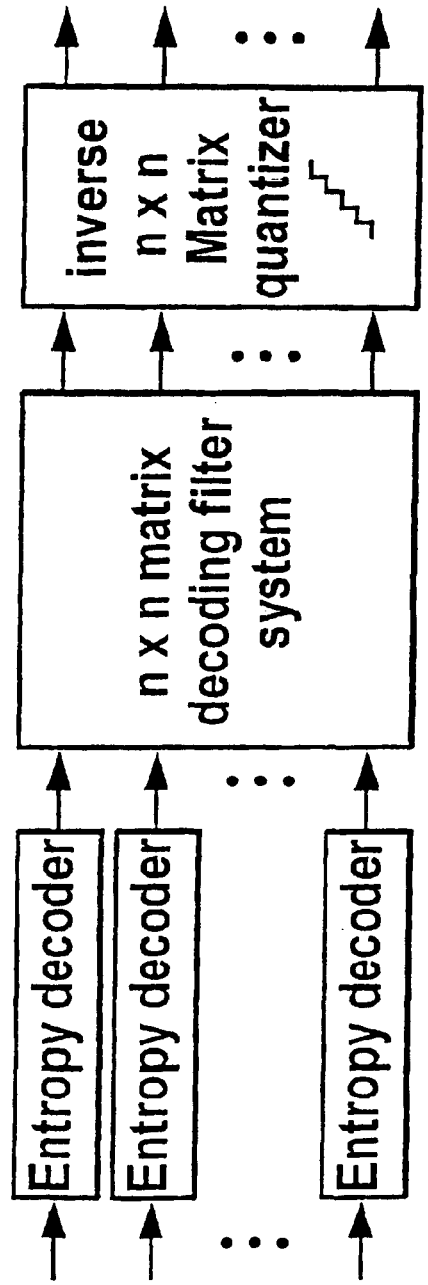

This example illustrates how a known approximate linear relationship between n transmitted channels can be used to reduce the transmitted data rate. A more general simplified encoding and inverse decoding scheme for n-channel signals is shown respectively in FIGS. 26c and 26d. Here the separate encoding and decoding filter arrangements for the n-channels are replaced by an n×n matrix filter encoding and decoding system of the form shown in and described in reference to FIGS. 6, 8, 10, 13, 15, 16 or 17 where the filters $A(z^{-1})$, $B(z^{-1})$, $C(z^{-1})$ and $D(z^{-1})$ are now n×n matrix filters, preferably of FIR kind. Again, to ensure transportability of algorithms between different DSP platforms, it is desirable that the filter coefficients be of finite precision and that the filters either be exactly implemented or implemented such that any rounding errors are small enough so as not to affect the output of the quantizers.

Applications to Image Waveform Data

The invention in all its aspects can be applied to PCM image waveform data defined on arrays of sampling instants in two or more dimensions. The figures in the above description are then interpreted with the symbol $z^{-1}$ being interpreted as a pair $(z_1^{-1}, z_2^{-1})$ of delays along two axes in the two-dimensional case or as an n-tuple $(z_1^{-1}, \ldots, z_n^{-1})$ of delays along n axes in the n-dimensional case. With this interpretation and the requirement that the filters $A(z_1^{-1}, \ldots, z_n^{-1})$, $B(z_1^{-1}, \ldots, z_n^{-1})$, $C(z_1^{-1}, \ldots, z_n^{-1})$, $D(z_1^{-1}, \ldots, z_n^{-1})$, should comprise terms each of which has at least one sample delay along at least one axis of the array, the implementations shown may be generalised to such n-dimensional waveform data.

In two-dimensional images, $z_1^{-1}$ may be a delay of one sample along say the horizontal axis and $z_2^{-1}$ may be a delay of one sample along the vertical axis.

The use of two-dimensional predictors in image waveform coding is well known in the prior art, and the novel features of the present invention may be applied to improved lossless coding of such images. In particular preferred implementations, the encoding filter will be two-dimensional recursive filter with recursion via an FIR filter $B(z_1^{-1}, z_2^{-1})$ around an integer quantizer preceded by a numerator factor $1+A(z_1^{-1}, z_2^{-1})$ as described above in various aspects of the invention, and these filters will have exactly-implemented finite-precision arithmetic. Two dimensional inner- or outer-form noise-shaping around the quantizer in both the encoder and in the inverse decoder, with 2-dimensional filtering $C(z_1^{-1}, z_2^{-1})$ or $D(z_1^{-1}, z_2^{-1})$ can be used to help minimise the transmitted data rate by making the added transmitted quantizer noise spectrum have an approximately white two-dimensional spectrum.

In the 2-dimensional image applications, the blocks over which a lossless encoding filter is applies may typically be of size L=16×16 samples, and the filters may have the FIR form $$A(z_1^{-1}, z_2^{-1}) = a_{10}z_1^{-1} + a_{01}z_2^{-1} + a_{11}z_1^{-1}z_2^{-1} + a_{20}z_1^{-2} + a_{02}z_2^{-2}$$

$$B(z_1^{-1}, z_2^{-1}) = b_{10}z_1^{-1} + b_{01}z_2^{-1} + b_{11}z_1^{-1}z_2^{-1} + b_{20}z_1^{-2} + b_{02}z_2^{-2}$$

where all the coefficients have a common denominator d such as d=4 or 8 or 16.

In many implementations, one may retain only the first three terms of each filter.

As in the audio case described earlier, the block of data will be typically losslessly coded as header information plus Huffman-coded waveform data. A similar Huffman table coding scheme to that used in the audio case described above can be used, since the predictor-encoded image waveform data frequently approximates Laplacian PDF statistics as shown for example in R. J. Clarke, Transform Coding of Images, Academic Press, London, 1985. The header data will typically include the coefficients of the encoding filter and noise shaping filter (if any) used in that block, the quantization step size of the input signal, any D.C. offset removed in the encoding, Huffman table number and initialisation data for the decoder filters. One may also incorporate in the header data that tells the decoder simply to repeat non-initialisation data from a previous block in the horizontal or vertical direction in order to save data overheads where adjacent blocks have similar statistical properties, and initialisation data can be obtained from the state variables in previous blocks rather than being transmitted every block. Apart from the 2-dimensionality of the filtering and the block structure, the encoding scheme and its inverse decoding scheme is broadly similar to the 1-dimensional case described earlier, although in image applications, the typical PCM word lengths are shorter than in high-quality audio, typically being 8 to 12 bits before encoding.

One will generally aim to produce encoding filters such that the filter $$\frac{1}{1+B(z_1^{-1}, z_2^{-1})}(1+A(z_1^{-1}, z_2^{-1}))$$

has a two-dimensional frequency response whose general trend is roughly inverse to the two-dimensional spectral content of the signal to be encoded, so that the output encoded signal has a two-dimensional spectrum much closer to being white.

In general, it is necessary in the encoder that $$\frac{1}{1+B(z_1^{-1}, z_2^{-1})}(1+A(z_1^{-1}, z_2^{-1}))$$

be stable and highly desirable that its inverse $$\frac{1}{1+A(z_1^{-1}, z_2^{-1})}(1+B(z_1^{-1}, z_2^{-1}))$$

be stable too. In the above-cited Shanks & Treitel reference page 137, it is noted that a filter $$1 + a_{10}z_1 + a_{01}z_2^{-1} + a_{11}z_1^{-1}z_2^{-1}$$

has stable inverse if and only if $|a_{01}| \leq 1$,
$|1+a_{01}| > |a_{10}+a_{11}|$, and
$|1-a_{01}| > |a_{10-a_{11}}|$.

Shanks & Treitel also give general methods of evaluating 2-dimensional filter stability. From a practical point of view, however, a useful numerical criterion for a filter of the form "1+terms with delay in at least one axis direction" being stable with stable inverse is that the average of the logarithm of its 2- (or n) dimensional spectral energy response, evaluated by integration up to Nyquist frequency in each axis direction be zero. This is the analogue of the cited 1 dimensional result from the above cited Gerzon and Craven reference. Because of this, a boost over one part of the spatial frequency range will give a compensating average cut over the rest of the spatial frequency range.

In a typical image block containing some detail, it is found that the image spectrum has high energy at low spatial frequencies, but that the energy falls away in all spatial directions at around 6 dB per octave from a fairly low spatial frequency that may typically be around one tenth Nyquist frequency.

Within each block, the fall-away of high spatial frequencies may be less in some spatial directions than in others due to the typical directional orientation of details in that block. The ideal spatial filtering performed in the encoding will thus be typically chosen to attenuate low spatial frequencies and boost high spatial frequencies by around 6 dB per octave, with a higher high frequency boost in the direction having the greatest cut off in high-frequency spectral energy. Although a wide range of encoding and inverse decoding filters can be used, as a matter of convenience of implementation, it may be desired to select the filter in encoding by implementing a small number of encoding filters corresponding to different degrees of fine detail in a block and to select the one giving the lowest average output amplitude or output energy in that block. Alternatively, measurements of the spectrum in the block, obtained maybe by looking at the magnitude of coefficients of the 2-dimensional DCT (discrete cosine transform) within the block, may be used to estimate the preferred encoding filter for that block. With related image components such as colour components, data rate can be further reduced by using the multichannel lossless encoding methods such as lossless n×n matrix quantizers described above with reference to FIGS. 22 to 26. For example, an image in red, green and blue component form can be losslessly matrixed into a form comprising two colour difference or chroma signals and perhaps a luminance signal by lossless matrixing in order to reduce the data rate, since colour difference signals will generally have lower energy and be codable at a lower data rate. Such lossless colour matrixing may be done adaptively block by block to take advantage of colour redundancies specific to that block. The axes along which the output of such a 3×3 matrix quantizer encodes may be selected to approximate the principal value eigenvector axes for that block of the colour image after removal of DC components. Such axes are discussed in W.K. Pratt, Digital Image Processing, Wiley-Interscience, New York, 197B pages 681–685 and in W.K. Pratt, "Spatial Transform Coding of Color Images", IEEE Trans. Commun. Tech., vol. COM-19 (1971) pp. 980–982 under the name of the Karhunen-Loeve transformation that decorrelates the 3 colour images.

In similar ways, the invention can be applied to three dimensional waveform signals such as moving or video images where the third axis is time, and where $z_3^{-1}$ implements a delay between frames of an image. Such lossless predictive encoding of moving images can incorporate motion following for moving images whereby one determines by cross-correlation or other known methods that image displacement vector which most closely matches successive frames of the image for a specific block of data, and lets $z_3^{-1}$ represent the delay between appropriately displaced blocks of successive frames. Encoding filters using such displacement vectors in the third (time) dimension will result in a lower lossless coding rate for moving images.

Autodither

The architecture of FIG. 6a can be used in a context other than data rate reduction, for example, in order to effect a shelf filter to alter the subjective frequency balance of the transmitted signal, in such a way that the listener with a suitable inverse filter (FIG. 6b) can recover the original signal exactly. However, in this case, the listener who does not have the inverse filter will suffer adverse audible effects from the undithered quantizer of FIG. 6a.

Figure 27A:
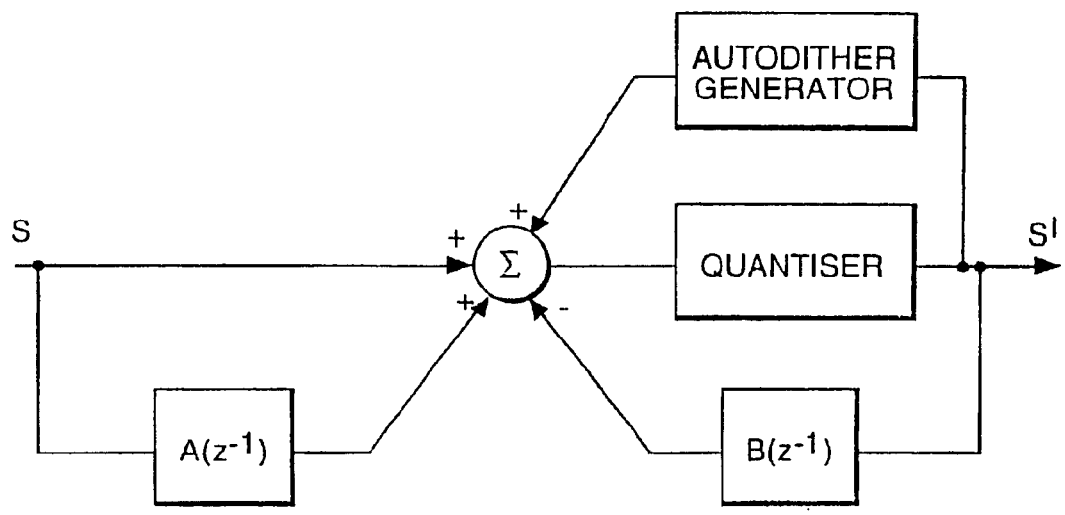
FIGS. 27a and 27b show a lossless encoder and lossless decoder, respectively, including autodither; and, FIGS. 28a and 28b show a form of lossless gain change incorporating autodither.
Figure 27B:
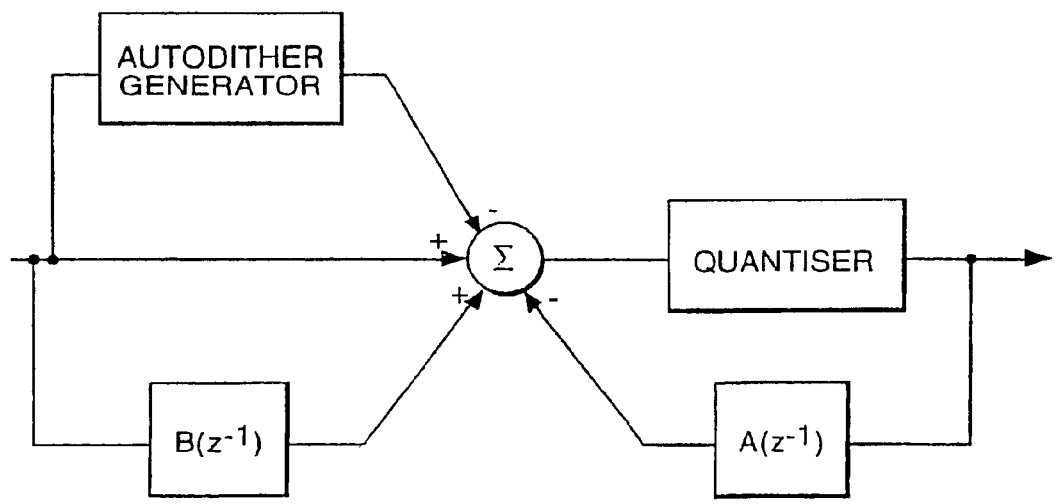

To overcome this defect, one can transmit using the architecture of FIG. 27a, which is akin to FIG. 6a but with an autodither signal added just before the quantizer. The corresponding inverse process is shown in FIG. 27b. The theory of autodither is explained in International Patent Application PCT/GB 93/01644 and also in the paper "Compatible Improvement of 16-bit Systems Using Subtractive Dither" by P. G. Craven and M. A. Gerzon, preprint 3356 of the 93rd Audio Engineering Society Convention, San Francisco (October 1992).

The block labelled "Autodither generator" in FIG. 27, refers to the cascade of "Buffer memory" and "Look-up table" as shown in FIGS. 7 to 10 of the above-mentioned patent specification, or of any more advanced or general autodither generator as discussed in these or other references. Note that the autodither generator is presumed to include a delay of at least one sample, so that the feedback loop in FIG. 27a of the specification is also realisable.

In order to prevent the possibility of different rounding behaviour on different hardware platforms, the autodither signal should preferably be generate as a finite precision signal with a step size $G_a$, and if the filters A and B in FIG. 6a are FIR with finite precision coefficients, thus generating output with step size $G_f$, then it would be advantageous to choose the ratio $G_a:G_f$ to be a simple ratio. For example, $G_a$ may be a multiple or a sub-multiple of $G_f$, or $G_a$ may be equal to $G_f$.

The lossless pre-emphasiser of FIG. 16a may be similarly improved, for the benefit of the listener who may be using analogue de-emphasis, by the addition of autodither. The corresponding lossless de-emphasis of FIG. 16b then needs to subtract the autodither signal.

Likewise, the architecture of FIG. 23a may be used to implement a matrix with psychoacoustically desirable properties, for example, on a commercial issue to give optimal results for a listener with loudspeakers in a different layout from the one assumed when the master recording was made, or to convert from "Ambisonic B-format" to speaker feeds suitable for the home listener. In this case, the more sophisticated listener may wish to use the inverse processing of FIG. 23b to recover the original master recording exactly. Once again, the ordinary listener will hear undithered quantization noise from the quantizers, and this can be avoided by the addition of an autodither signal prior to each quantizer, which may be subtracted by the sophisticated listener as has been explained above for the shelf filter with reference to FIG. 27.

Variations on the basic idea are possible, for example, in the case of the primitive matrix quantizer of FIG. 22a, the autodither signal may depend on the CURRENT value of the unprocessed channels as well as on the previous sample values of all the channels. In the case of an Abisonic B-format master it may be desirable to use both shelf filters and matrices in cascade to derive speaker feeds for the commercial issue, and in that case autodither may be added to both processes. The inverse process then consists of inverting the individual cascading processes in reverse order, with the appropriate addition/subtraction of the autodither signal in each case.

Previous applications of autodither have assumed that the output of the quantizer is transmitted directly, and so the autodither signal is derived in dependence on previous values of the transmitted signal. In the case of cascaded lossless processors, it is a matter of choice whether the autodither for each process is derived from the output of that process or from the output of a subsequent process (for example a last process, whose output will be the transmitted signal). Of course, the decoding processor must derive the corresponding autodither signal from the corresponding point in the reversed order cascade.

Another useful element is the lossless gain change, for implementing a gain G is $\geq$ to 1 in an exactly invertible manner. This may be cascaded with lossless matrices and lossless shelf filters in order to derive speaker feeds from Ambisonic B-format master recording in a lossless manner, and also has many other uses.

Figure 28A:
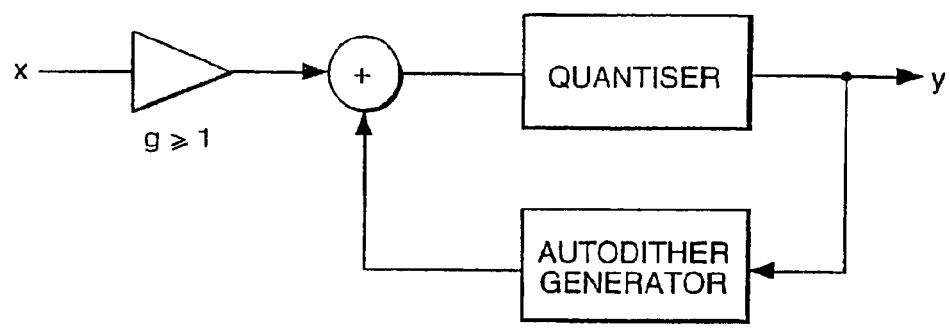
Figure 28B:
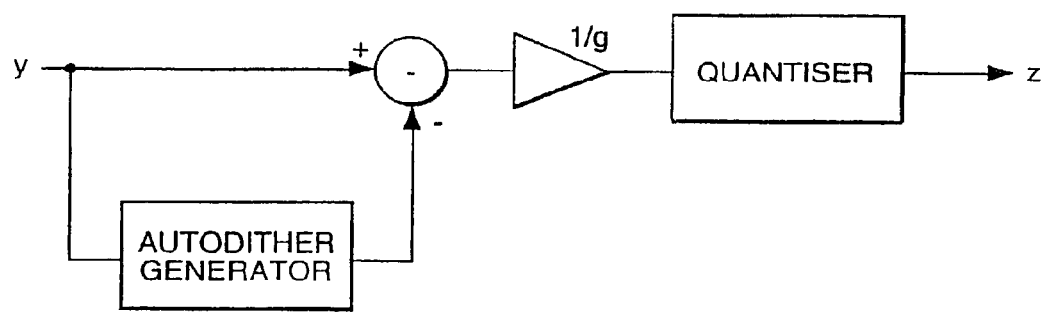

A form of lossless gain change incorporating autodither is shown in FIG. 28a, with the corresponding decoder in FIG. 28b. In FIG. 28a, the integer-valued input signal x is subject to a gain G, $\geq$ unity. An autodither signal is added and the result is quantized. If the quantizer is a rounding quantizer (rounding to the nearest integer) and if D is the autodither signal, then $$g.x+d-0.5 \leq y \leq g.x+d+0.5$$

The inverse processor of FIG. 28b subtracts the dither signal y and multiplies by the inverse gain 1/g, to form the signal w given by $$w=(y-d)/g$$

which is input to the quantizer to form the output z.

It follows that $$x-0.5/g \leq w \leq x+0.5/g$$

and so if $g \leq 1$ and the quantizer rounds to the nearest integer, z must be equal to x.

What is claimed is:

1. A lossless processor for input signal samples comprising a prediction filter having an input terminal and an output terminal, the prediction filter comprising:
   a quantiser having an input and an output, wherein the quantiser provides at its output a quantised sample value that is generated by quantising signal sample values received at its input using a quantiser step size; and
   a summing node having an output coupled to the output terminal of the prediction filter, having a first input coupled to the input terminal of the prediction filter, and having a second input responsive to the output of the quantiser;
   wherein the quantiser input is jointly responsive to:
   an input signal sample at a previous sample instant and
   an output sample value from the output of the summing node at a previous sample instant.

2. A lossless processor according to claim 1 herein the input signal samples are represented by values having a quantisation resolution that is an integer multiple of the quantiser step size.

3. A method for losslessly processing a sequence of input signal samples to produce a sequence of output signal samples, the method comprising, for each respective input signal sample:
   generating an auxiliary signal sample by combining one or more input signal samples preceding the respective input signal sample with one or more output signal samples;
   generating a quantised signal sample by quantising the auxiliary signal sample; and
   generating a respective output signal sample by combining the quantised signal sample with the respective input signal sample.

4. A lossless processor for input signal samples comprising a prediction filter having an input terminal and an output terminal, the prediction filter comprising:
   a first quantiser having an input and an output, wherein the first quantiser provides at its output a quantised sample value that is generated by quantising signal sample values received at its input using a first quantiser step size;
   a second quantiser having an input responsive to the output of the first quantiser and having an output, wherein the second quantiser provides at its output a quantised sample value that is generated by quantising signal sample values received at its input using a second quantiser step size;
   a first summing node having an output coupled to the output terminal of the prediction filter, having a first input coupled to the input terminal of the prediction filter, and having a second input responsive to the output of the second quantiser; and
   a second summing node having an output, wherein the the input of the first quantiser is responsive to the output of the second summing node;
   wherein the output of the second summing node is jointly responsive to:
   an output sample of the first summing node at a previous sample instant and
   an output sample value of the first quantiser at a previous sample instant.

5. A lossless processor according to claim 4 wherein the input signal samples are represented by values having a quantisation resolution that is an integer multiple of the second quantiser step size.

6. A lossless processor for input signal samples comprising a prediction filter having an input terminal and an output terminal, the prediction filter comprising a first quantiser and a second quantiser, each of which has an input, an output and a step size, wherein the input of each quantizer is responsive to:
   a prediction filter output sample at a previous sample instant and
   an output sample from the first quantiser at a previous sample instant; and wherein the output of the prediction filter is responsive to the output of the second quantizer.

7. A lossless processor according to claim 6 wherein the input of the second quantiser is responsive to the output of the first quantiser.

8. A lossless processor according to claim 6 wherein the step size of the second quantiser is an integer multiple of the step size of the first quantiser.

9. A lossless processor according to claim 6 wherein the input terminal of the prediction filter receives signal samples having a resolution equal to the step size of the second quantiser.

10. A lossless processor according to claim 6 wherein the input of the first quantiser is responsive to an output sample from the prediction filter output terminal at a current sample instant.

11. A method for losslessly processing a sequence of quantised input signal samples having a quantised resolution to produce a sequence of output signal samples, the method comprising, for each respective input signal sample:
    generating a respective quantised signal sample by:
       generating an auxiliary signal sample by combining one or more quantised signal samples preceding the respective quantised signal sample either with one or more input signal samples or with one or more output signal samples; and
       quantising a value to a resolution that is finer than the quantised resolution of the input signal samples, wherein the value is obtained in response to the auxiliary signal sample; and
    generating a respective output signal sample having the quantised resolution of the input signal samples in response to the respective input signal sample and the auxiliary signal sample.

12. A method for losslessly processing a sequence of quantised input signal samples having a quantised resolution to produce a sequence of output signal samples, the method comprising, for each respective input signal sample:
    generating a respective auxiliary signal sample by combining one or more auxiliary signal samples preceding the respective auxilliary signal sample that have been quantized to a resolution finer than the resolution of the input signal samples with one or more input signal samples preceding the respective input signal sample; and
    generating a respective output signal sample having the quantised resolution of the input signal samples in response to the respective auxiliary signal sample and the respective input signal sample.

13. A medium conveying encoded information representing input signal samples processed by a lossless processor comprising a prediction filter having an input terminal and an output terminal, the prediction filter comprising a first quantiser and a second quantiser, each of which has an input, an output and a step size, wherein the input of each quantizer is responsive to:

a prediction filter output sample at a previous sample instant and an output sample from the first quantiser at a previous sample instant; and wherein the output of the prediction filter is responsive to the output of the second quantizer.

14. The medium according to claim 13 wherein the input of the second quantiser is responsive to the output of the first quantiser.

15. The medium according to claim 13 wherein the step size of the second quantiser is an integer multiple of the step size of the first quantiser.

16. The medium according to claim 13 wherein the input terminal of the prediction filter receives signal samples having a resolution equal to the step size of the second quantiser.

17. The medium according to claim 13 wherein the input of the first quantiser is responsive to an output sample from the prediction filter output terminal at a current sample instant.

18. A medium conveying encoded information representing input signal samples processed by a method for losslessly processing a sequence of input signal samples to produce a sequence of output signal samples, the method comprising, for each respective input signal sample:

generating an auxiliary signal sample by combining one or more input signal samples preceding the respective input signal sample with one or more output signal samples;

generating a quantised signal sample by quantising the auxiliary signal sample; and generating a respective output signal sample by combining the quantised signal sample with the respective input signal sample.

19. A medium conveying encoded information representing input signal samples processed by a method for losslessly processing a sequence of quantised input signal samples having a quantised resolution to produce a sequence of output signal samples, the method comprising, for each respective input signal sample:

generating a respective quantised signal sample by:
generating an auxiliary signal sample by combining one or more quantised signal samples preceding the respective quantised signal sample either with one or more input signal samples or with one or more output signal samples; and
quantising a value to a resolution that is finer than the quantised resolution of the input signal samples, wherein the value is obtained in response to the auxiliary signal sample; and generating a respective output signal sample having the quantised resolution of the input signal samples in response to the respective input signal sample and the auxiliary signal sample.

20. A medium conveying encoded information representing input signal samples processed by a method for losslessly processing a sequence of quantised input signal samples having a quantised resolution to produce a sequence of output signal samples, the method comprising, for each respective input signal sample:

generating a respective auxiliary signal sample by combining one or more auxiliary signal samples preceding the respective auxilliary signal sample that have been quantized to a resolution finer than the resolution of the input signal samples with one or more input signal samples preceding the respective input signal sample; and generating a respective output signal sample having the quantised resolution of the input signal samples in response to the respective auxiliary signal sample and the respective input signal sample.

21. A medium conveying a program of instructions that is executable by a device to perform method for losslessly processing a sequence of input signal samples to produce a sequence of output signal samples, the method comprising, for each respective input signal sample:

generating an auxiliary signal sample by combining one or more input signal samples preceding the respective input signal sample with one or more output signal samples;

generating a quantised signal sample by quantising the auxiliary signal sample; and generating a respective output signal sample by combining the quantised signal sample with the respective input signal sample.

22. A medium conveying a program of instructions that is executable by a device to perform method for losslessly processing a sequence of quantised input signal samples having a quantised resolution to produce a sequence of output signal samples, the method comprising, for each respective input signal sample:

generating a respective quantised signal sample by:
generating an auxiliary signal sample by combining one or more quantised signal samples preceding the respective quantised signal sample either with one or more input signal samples or with one or more output signal samples; and
quantising a value to a resolution that is finer than the quantised resolution of the input signal samples, wherein the value is obtained in response to the auxiliary signal sample; and generating a respective output signal sample having the quantised resolution of the input signal samples in response to the respective input signal sample and the auxiliary signal sample.

23. A medium conveying a program of instructions that is executable by a device to perform method for losslessly processing a sequence of quantised input signal samples having a quantised resolution to produce a sequence of output signal samples, the method comprising, for each respective input signal sample:

generating a respective auxiliary signal sample by combining one or more auxiliary signal samples preceding the respective auxiliary signal sample that have been quantized to a resolution finer than the resolution of the input signal samples with one or more input signal samples preceding the respective input signal sample; and generating a respective output signal sample having the quantised resolution of the input signal samples in response to the respective auxiliary signal sample and the respective input signal sample.

\* \* \* \* \*